(12) United States Patent
Harari

(10) Patent No.: US 10,475,812 B2
(45) Date of Patent: Nov. 12, 2019

(54) THREE-DIMENSIONAL VERTICAL NOR FLASH THIN-FILM TRANSISTOR STRINGS

(71) Applicant: SUNRISE MEMORY CORPORATION, Los Gatos, CA (US)

(72) Inventor: Eli Harari, Saratoga, CA (US)

(73) Assignee: SUNRISE MEMORY CORPORATION, Fremont, CA (US)

( * ) Notice: Subject to any disclaimer, the term of this patent is extended or adjusted under 35 U.S.C. 154(b) by 0 days.

(21) Appl. No.: 16/447,406

(22) Filed: Jun. 20, 2019

(65) Prior Publication Data

US 2019/0319044 A1    Oct. 17, 2019

Related U.S. Application Data

(63) Continuation of application No. 16/252,301, filed on Jan. 18, 2019, which is a continuation-in-part of
(Continued)

(51) Int. Cl.
| | |
|---|---|
| *G11C 11/00* | (2006.01) |
| *H01L 27/11582* | (2017.01) |
| *H01L 29/06* | (2006.01) |
| *G11C 16/04* | (2006.01) |
| *H01L 27/11565* | (2017.01) |
| *H01L 23/532* | (2006.01) |
| *H01L 23/522* | (2006.01) |
| *G11C 16/26* | (2006.01) |
| *G11C 16/14* | (2006.01) |
| *G11C 16/30* | (2006.01) |

(Continued)

(52) U.S. Cl.
CPC .... *H01L 27/11582* (2013.01); *G11C 16/0483* (2013.01); *G11C 16/14* (2013.01); *G11C 16/26* (2013.01); *G11C 16/30* (2013.01); *H01L 23/528* (2013.01); *H01L 23/5226* (2013.01); *H01L 23/5329* (2013.01); *H01L 23/53257* (2013.01); *H01L 27/1157* (2013.01); *H01L 27/11565* (2013.01); *H01L 27/11573* (2013.01); *H01L 29/0649* (2013.01); *H01L 29/1037* (2013.01); *H01L 29/78642* (2013.01)

(58) Field of Classification Search
CPC .................................................. G11C 11/00
USPC ... 365/46, 94, 100, 113, 129, 148, 158, 163; 257/2–5, 9, 296, 310, 379, 467, E21.35, 257/E31.047, E27.006; 438/29, 95, 96, 438/166, 135, 240, 259, 365, 382, 482, 438/486, 597; 977/754
See application file for complete search history.

(56) References Cited

U.S. PATENT DOCUMENTS

| | | | | |
|---|---|---|---|---|
| 6,434,053 | B1 * | 8/2002 | Fujiwara ............ | G11C 16/0466 257/324 |
| 2001/0053092 | A1 * | 12/2001 | Kosaka .............. | G11C 16/0466 365/185.19 |

(Continued)

*Primary Examiner* — Harry W Byrne
(74) *Attorney, Agent, or Firm* — Edward C. Kwok; VLP Law Group, LLP

(57) ABSTRACT

A memory structure, includes active columns of polysilicon formed above a semiconductor substrate, each active column includes one or more vertical NOR strings, with each NOR string having thin-film storage transistors sharing a local source line and a local bit line, the local bit line is connected by one segment of a segmented global bit line to a sense amplifier provided in the semiconductor substrate.

31 Claims, 31 Drawing Sheets

Related U.S. Application Data application No. 16/107,732, filed on Aug. 21, 2018, now Pat. No. 10,249,370.

(60) Provisional application No. 62/630,214, filed on Feb. 13, 2018, provisional application No. 62/625,818, filed on Feb. 2, 2018.

(51) Int. Cl.
| | | |
|---|---|---|
| *H01L 27/1157* | (2017.01) | |
| *H01L 27/11573* | (2017.01) | |
| *H01L 29/786* | (2006.01) | |
| *H01L 23/528* | (2006.01) | |
| *H01L 29/10* | (2006.01) | |

(56) References Cited

U.S. PATENT DOCUMENTS

| | | | |
|---|---|---|---|
| 2005/0128815 A1* | 6/2005 | Ishikawa | G11C 16/16 |
| | | | 365/185.29 |
| 2008/0239812 A1* | 10/2008 | Abiko | G11C 11/5628 |
| | | | 365/185.12 |
| 2009/0279360 A1* | 11/2009 | Lee | G11C 11/5628 |
| | | | 365/185.17 |
| 2010/0124116 A1* | 5/2010 | Maeda | G11C 5/02 |
| | | | 365/185.11 |
| 2012/0243314 A1* | 9/2012 | Maeda | H01L 27/11582 |
| | | | 365/185.05 |

* cited by examiner

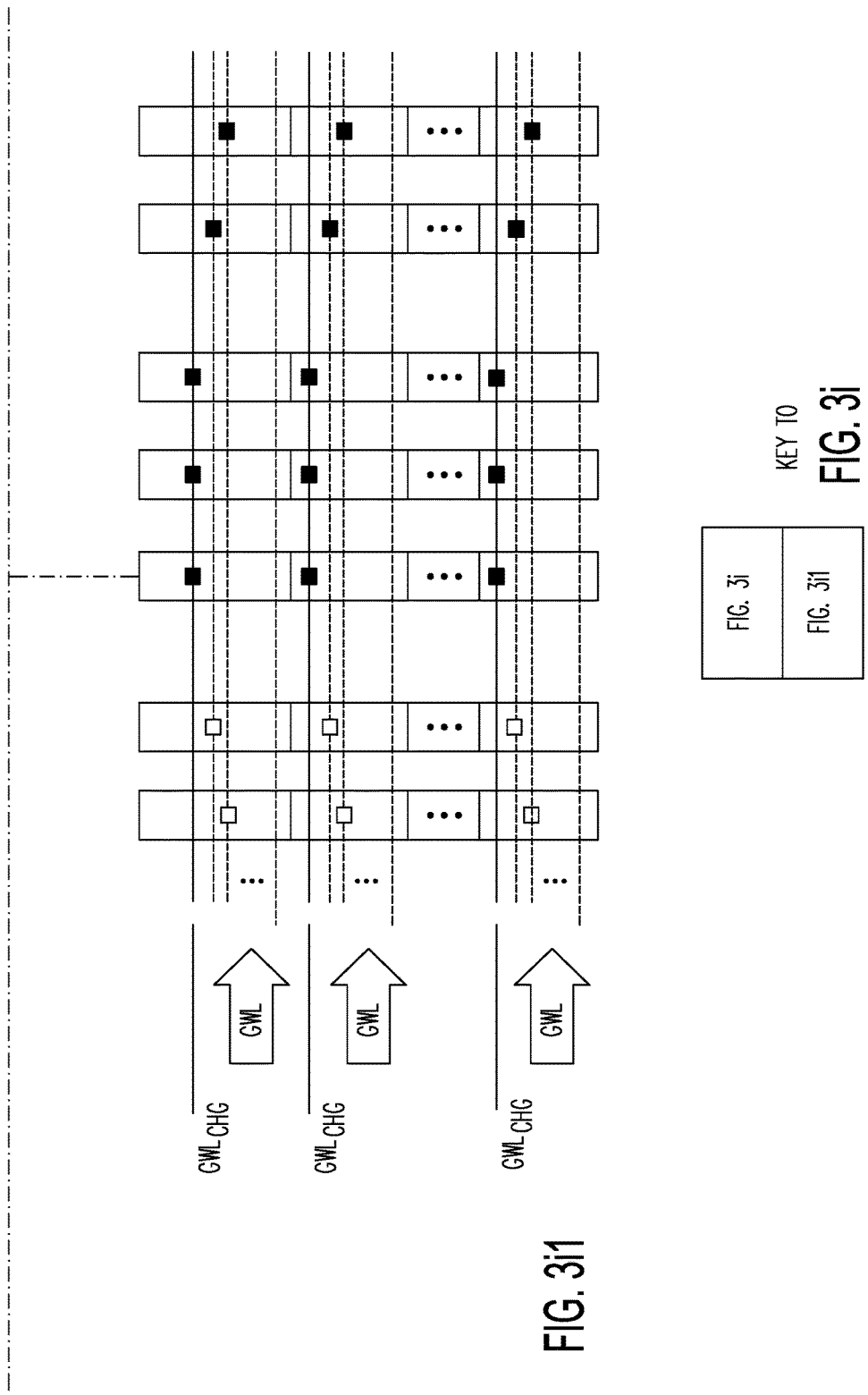

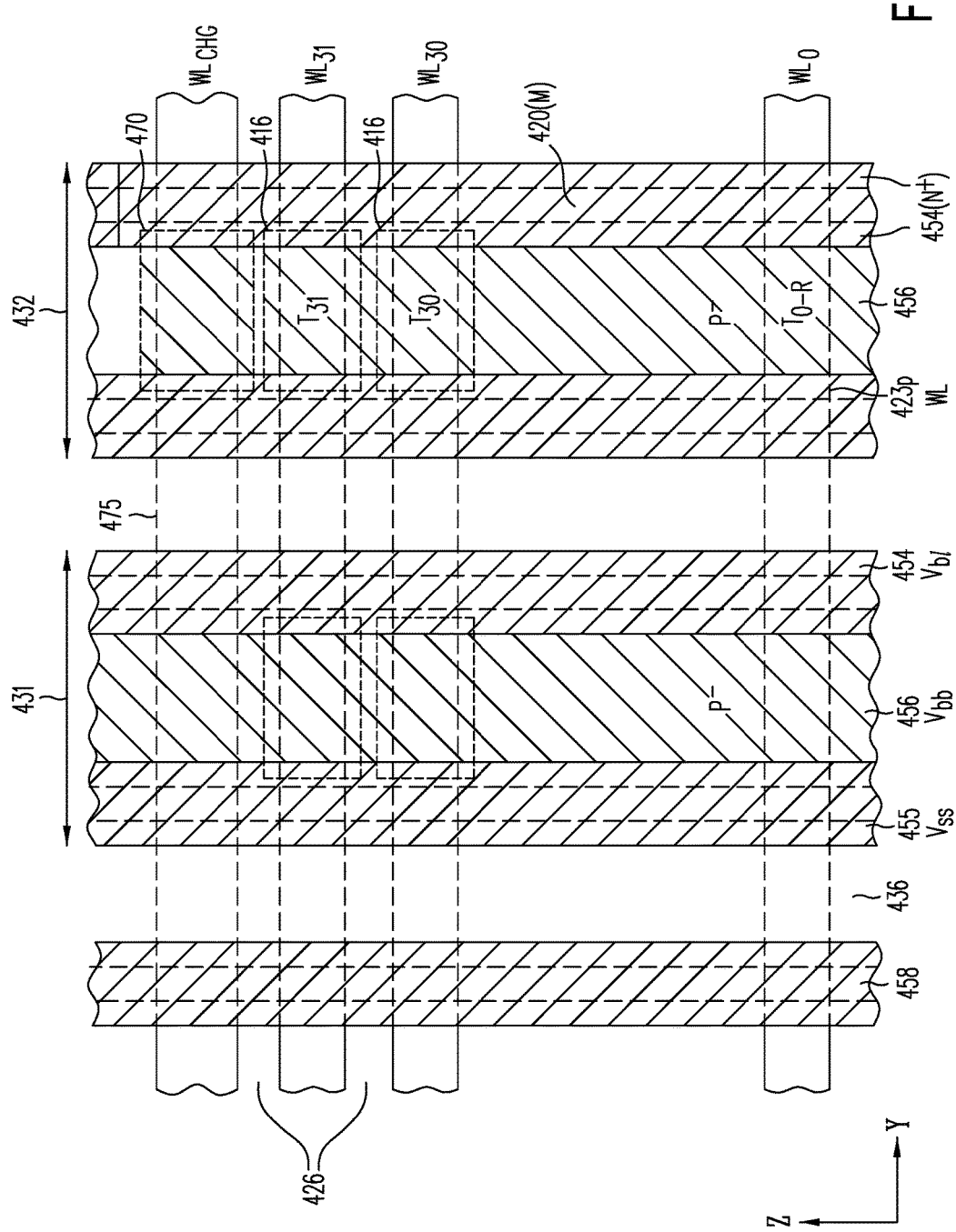
FIG. 4a1

THREE-DIMENSIONAL VERTICAL NOR FLASH THIN-FILM TRANSISTOR STRINGS

CROSS REFERENCE TO RELATED APPLICATIONS

The present application is a continuation of U.S. patent application Ser. No. 16/252,304, entitled "Three-dimensional vertical NOR Flash Thin-Film Transistor Strings," filed Jan. 18, 2019, which is a continuation-in-part application of co-pending U.S. patent application ("Non-Provisional Application I"), Ser. No. 16/107,732, entitled "Three-dimensional vertical NOR Flash Thin-Film Transistor Strings," filed on Aug. 21, 2018, which is a continuation application of U.S. patent application Ser. No. 15/837,734 entitled "Three-dimensional vertical NOR Flash Thin-Film Transistor Strings," filed on Dec. 11, 2017, now U.S. Pat. No. 10,096,364, which is a divisional application of U.S. patent application Ser. No. 15/343,332, entitled "Three-dimensional vertical NOR Flash Thin-Film Transistor Strings," filed on Nov. 4, 2016, now U.S. Pat. No. 9,842,651, which claims priority of (i) U.S. provisional patent application ("Provisional Application I"), Ser. No. 62/260,137, entitled "Three-dimensional Vertical NOR Flash Thin-film Transistor Strings," filed on Nov. 25, 2015; (ii) copending U.S. non-provisional patent application ("Non-Provisional Application II"), Ser. No. 15/220,375, entitled "Multi-Gate NOR Flash Thin-film Transistor Strings Arranged in Stacked Horizontal Active Strips With Vertical Control Gates," filed on Jul. 26, 2016, now U.S. Pat. No. 9,892,800; and (iii) U.S. provisional patent application ("Provisional Application II"), Ser. No. 62/363,189, entitled "Capacitive Coupled Non-Volatile Thin-film Transistor Strings," filed Jul. 15, 2016; and (iv) copending U.S. non-provisional patent application ("Non-Provisional Patent Application III"), Ser. No. 15/248,420, entitled "Capacitive Coupled Non-Volatile Thin-film Transistor Strings in Three-Dimensional Array," filed Aug. 26, 2016.

The present application is also related to and claims priority of U.S. provisional application ("Provisional Application III"), Ser. No. 62/625,818, filed on Feb. 2, 2018, and U.S. provisional patent application ("Provisional Application IV"), Ser. No. 62/630,214, filed on Feb. 13, 2018, all entitled "Three-dimensional vertical NOR Flash Thin-Film Transistor Strings."

The disclosures of Provisional Applications I-IV and Non-Provisional Application I-III are hereby incorporated by reference in their entireties.

BACKGROUND OF THE INVENTION

1. Field of the Invention

The present invention relates to high-density memory structures. In particular, the present invention relates to high-density memory structures formed by interconnected thin film storage elements, such as thin film storage transistors formed in vertical strips with horizontal word lines.

2. Discussion of the Related Art

In this disclosure, memory circuit structures are described. These structures may be fabricated on planar semiconductor substrates (e.g., silicon wafers) using conventional fabrication processes. To facilitate clarity in this description, the term "vertical" refers to the direction perpendicular to the surface of a semiconductor substrate, and the term "horizontal" refers to any direction that is parallel to the surface of that semiconductor substrate.

A number of high-density non-volatile memory structures, such as "three-dimensional vertical NAND strings," are known in the prior art. Many of these high-density memory structures are formed using thin film storage transistors formed out of deposited thin films (e.g., polysilicon thin films), and organized as arrays of "memory strings." One type of memory strings is referred to as NAND memory strings or simply "NAND strings". A NAND string consists of a number of series-connected thin film storage transistors ("TFTs"). Reading or programming the content of any of the series-connected TFTs requires activation of all series-connected TFTs in the string. Thin film NAND transistors have lower conductivity than NAND transistors formed in single crystal silicon, therefore the low read current that is required to be conducted through a long string of NAND TFTs results in a relatively slow read access (i.e. long latency).

Another type of high density memory structures is referred to as the NOR memory strings or "NOR strings." A NOR string includes a number of storage transistors each of which is connected to a shared source region and a shared drain region. Thus, the transistors in a NOR string are connected in parallel, so that a read current in a NOR string is conducted over a much lesser resistance than the read current through a NAND string. To read or program a storage transistor in a NOR string, only that storage transistor needs to be activated (i.e., "on" or conducting), all other storage transistors in the NOR string may remain dormant (i.e., "off" or non-conducting). Consequently, a NOR string allows much faster sensing of the activated storage transistor to be read. Conventional NOR transistors are programmed by a channel hot-electron injection technique, in which electrons are accelerated in the channel region by a voltage difference between the source region and the drain region and are injected into the charge-trapping layer between the control gate and the channel region, when an appropriate voltage is applied to the control gate. Channel hot-electron injection programming requires a relatively large electron current to flow through the channel region, therefore limiting the number of transistors that can be programmed in parallel. Unlike transistors that are programmed by hot-electron injection, in transistors that are programmed by Fowler-Nordheim tunneling or by direct tunneling, electrons are injected from the channel region to the charge-trapping layer by a high electric field that is applied between the control gate and the source and drain regions. Fowler-Nordheim tunneling and direct tunneling are orders of magnitude more efficient than channel hot-electron injection, allowing massively parallel programming; however, such tunneling is more susceptible to program-disturb conditions.

3-Dimensional NOR memory arrays are disclosed in U.S. Pat. No. 8,630,114 to H. T Lue, entitled "Memory Architecture of 3D NOR Array", filed on Mar. 11, 2011 and issued on Jan. 14, 2014.

U.S. patent Application Publication US2016/0086970 A1 by Haibing Peng, entitled "Three-Dimensional Non-Volatile NOR-type Flash Memory," filed on Sep. 21, 2015 and published on Mar. 24, 2016, discloses non-volatile NOR flash memory devices consisting of arrays of basic NOR memory groups in which individual memory cells are stacked along a horizontal direction parallel to the semiconductor substrate with source and drain electrodes shared by all field effect transistors located at one or two opposite sides of the conduction channel.

Three-dimensional vertical memory structures are disclosed, for example, in U.S. Pat. No. 8,878,278 to Alsmeier et al. ("Alsmeier"), entitled "Compact Three-Dimensional Vertical NAND and Methods of Making Thereof," filed on Jan. 30, 2013 and issued on Nov. 4, 2014. Alsmeier discloses various types of high-density NAND memory structures, such as "terabit cell array transistor" (TCAT) NAND arrays (FIG. 1A), "pipe-shaped bit-cost scalable" (P-BiCS) flash memory (FIG. 1B) and a "vertical NAND" memory string structure. Likewise, U.S. Pat. No. 7,005,350 to Walker et al. ("Walker I"), entitled "Method for Fabricating Programmable Memory Array Structures Incorporating Series—Connected Transistor Strings," filed on Dec. 31, 2002 and issued on Feb. 28, 2006, also discloses a number of three-dimensional high-density NAND memory structures.

U.S. Pat. No. 7,612,411 to Walker ("Walker II"), entitled "Dual-Gate Device and Method" filed on Aug. 3, 2005 and issued on Nov. 3, 2009, discloses a "dual gate" memory structure, in which a common active region serves independently controlled storage elements in two NAND strings formed on opposite sides of the common active region.

3-Dimensional NOR memory arrays are disclosed in U.S. Pat. No. 8,630,114 to H. T Lue, entitled "Memory Architecture of 3D NOR Array," filed on Mar. 11, 2011 and issued on Jan. 14, 2014.

A three-dimensional memory structure, including horizontal NAND strings that are controlled by vertical polysilicon gates, is disclosed in the article "Multi-layered Vertical gate NAND Flash Overcoming Stacking Limit for Terabit Density Storage" ("Kim"), by W. Kim et al., published in the 2009 Symposium on VLSI Tech. Dig. of Technical Papers, pp 188-189. Another three-dimensional memory structure, also including horizontal NAND strings with vertical polysilicon gates, is disclosed in the article, "A Highly Scalable 8-Layer 3D Vertical-gate (VG) TFT NAND Flash Using Junction-Free Buried Channel BE-SONOS Device," by H. T. Lue et al., published in the 2010 Symposium on VLSI: Tech. Dig. Of Technical Papers, pp. 131-132.

FIG. 1a shows three-dimensional vertical NAND strings 111 and 112 in the prior art. FIG. 1b shows basic circuit representation 140 of a three-dimensional vertical NAND string in the prior art. Specifically, vertical NAND string 111 and 112 of FIG. 1a and their circuit representation 150 are each essentially a conventional horizontal NAND string which—rather than each connecting 32 or more transistors in series along the surface of a substrate—is rotated 90 degrees, so as to be perpendicular to the substrate. Vertical NAND strings 111 and 112 are serially-connected thin-film transistors (TFTs) in a string configuration that rises like a skyscraper from the substrate, with each TFT having a storage element and a control gate provided by one of the word line conductors in an adjacent stack of word line conductors. As shown in FIG. 1b, in the simplest implementation of a vertical NAND string, TFTs 15 and 16 are the first and last memory transistors of NAND string 150, controlled by separate word lines WL0 and WL31, respectively. Bit line select transistor 11, activated by signal BLS, and ground select transistor 12, activated by signal SS, serve to connect an addressed TFT in vertical NAND string 150 to corresponding global bit line GBL at terminal 14 and global source line (ground) GSL, at terminal 13, during read, program, program-inhibit and erase operations. Reading or programming the content of any one TFT, (e.g., TFT 17) requires activation of all 32 TFTs in vertical NAND string 150, which exposes each TFT to read-disturb and program-disturb conditions. Such conditions limit the number of TFTs that can be provided in a vertical NAND string to no more than 64 or 128 TFTs. Furthermore, the polysilicon thin films upon which a vertical NAND string is formed have much lower channel mobility—and therefore higher resistivity—than conventional NAND strings formed in a single-crystal silicon substrate, thereby resulting in a low read current relative to the read current of a conventional NAND string.

U.S. Patent Application Publication 2011/0298013 ("Hwang"), entitled "Vertical Structure Semiconductor Memory Devices And Methods OF Manufacturing The Same," discloses three-dimensional vertical NAND strings. In its FIG. 4D, Hwang shows a block of three dimensional vertical NAND strings addressed by wrap-around stacked word lines 150 (reproduced herein as FIG. 1c).

U.S. Pat. No. 5,768,192 to Eitan, entitled "Memory Cell utilizing asymmetrical charge trapping" filed Jul. 23, 1996 and issued Jun. 16, 1998 discloses NROM type memory transistor operation of the type employed in an embodiment of the current invention.

U.S. Pat. No. 8,026,521 to Zvi Or-Bach et al, entitled "Semiconductor Device and Structure," filed on Oct. 11, 2010 and issued on Sep. 27, 2011 to Zvi-Or Bach et al discloses a first layer and a second layer of layer-transferred mono-crystallized silicon in which the first and second layers include horizontally oriented transistors. In that structure, the second layer of horizontally oriented transistors overlays the first layer of horizontally oriented transistors, each group of horizontally oriented transistors having side gates.

Transistors that have a conventional non-volatile memory transistor structure but short retention times may be referred to as "quasi-volatile." In this context, conventional non-volatile memories have data retention time exceeding tens of years. A planar quasi-volatile memory transistor on single crystal silicon substrate is disclosed in the article "High-Endurance Ultra-Thin Tunnel Oxide in Monos Device Structure for Dynamic Memory Application", by H. C. Wann and C. Hu, published in IEEE Electron Device letters, Vol. 16, No. 11, November 1995, pp 491-493. A quasi-volatile 3-D NOR array with quasi-volatile memory is disclosed in the U.S. Pat. No. 8,630,114 to H. T Lue, mentioned above.

The Article "A 768 Gb 3b/cell 3D-Floating-Gate NAND Flash Memory," by T. Tanaka et al., published in the Digest of Technical Papers, the 2016 IEEE International Solid-State Circuits Conference, pp. 142-144, discloses placing CMOS logic circuits underneath a 3-dimensional NAND memory array.

SUMMARY

According to one embodiment of the present invention, a high-density memory structure, referred to as a three-dimensional vertical NOR Flash memory string ("multi-gate vertical NOR string," or simply "vertical NOR string"). The vertical NOR string includes a number of thin-film transistors ("TFTs") connected in parallel, having a shared source region and a shared drain region each extending generally in a vertical direction. In addition, the vertical NOR string includes multiple horizontal control gates each controlling a respective one of the TFTs in the vertical NOR string. As the TFTs in a vertical NOR string are connected in parallel, a read current in a vertical NOR string is conducted over a much lesser resistance than the read current through a NAND string of a comparable number of TFTs. To read or program any one of the TFTs in a vertical NOR string, only that TFT needs to be activated, all other TFTs in the vertical NOR string can remain non-conducting. Consequently, a vertical NOR string may include many more TFTs (e.g., several hundreds or more), while allowing faster sensing and minimizing program-disturb or read-disturb conditions.

In one embodiment, the shared drain region of a vertical NOR string is connected to a global bit line ("voltage $V_{bl}$") and the shared source region of the vertical NOR string is connected to a global source line ("voltage $V_{ss}$"). Alternatively, in a second embodiment, only the shared drain region is connected to a global bit line biased to a supply voltage, while the shared source region is pre-charged to a voltage determined by a quantity of charge in the shared source region. To perform the pre-charge, one or more dedicated TFTs may be provided to pre-charge the parasitic capacitance C of the shared source region.

According to one embodiment of the present invention, multi-gate NOR flash thin-film transistor string arrays ("multi-gate NOR string arrays") are organized as arrays of vertical NOR strings each running perpendicular to the surface of a silicon substrate. Each multi-gate NOR string array includes a number of vertical active columns arranged in rows, each row extending along a first horizontal direction, with each active column having two vertical heavily-doped polysilicon regions of a first conductivity, which are separated by one or more vertical polysilicon regions that are undoped or lightly doped to a second conductivity. The heavily-doped regions each form a shared source or drain region and, in conjunction with one or more stacks of horizontal conductors each extending orthogonally to the first horizontal direction, the lightly-doped regions each form multiple channel regions. A charge-trapping material forms multiple storage elements, covering at least the channel regions of TFTs in the active column. The horizontal conductive lines in each stack are electrically isolated from each other and form control gates over the storage elements and the channel regions of the active column. In this manner, the multi-gate NOR string array forms a three-dimensional array of storage TFTs.

In one embodiment, support circuitry is formed in a semiconductor substrate to support multiple multi-gate NOR string arrays formed above the support circuitry and the semiconductor substrate. The support circuitry may include address encoders, address decoders, sense amplifiers, input/output drivers, shift registers, latches, reference cells, power supply lines, bias and reference voltage generators, inverters, NAND, NOR, Exclusive-Or and other logic gates, other memory elements, sequencers and state machines, among others. The multi-gate NOR string arrays may be organized as multiple blocks of circuits, with each block having multiple multi-gate NOR string arrays.

According to embodiments of the present invention, variations in threshold voltages of TFTs within a vertical NOR string may be compensated by providing one or more electrically programmable reference vertical NOR strings in the same or another multi-gate vertical NOR string array. Background leakage currents inherent to a vertical NOR string can be substantially neutralized during a read operation by comparing the results of the TFT being read to that of a TFT that is concurrently read on a programmable reference vertical NOR string. In some embodiments, each TFT of a vertical NOR string is shaped so as to amplify the capacitive coupling between each control gate and its corresponding channel region thereby to enhance tunneling from the channel regions into the charge-trapping material (i.e., the storage element) during programming, and to reduce the charge injection from the control gate to the charge-trapping material during erasing. This favorable capacitive coupling is particularly useful for storing more than one bit in each TFT of a vertical NOR string. In another embodiment, the charge-trapping material of each TFT may have its structure modified to provide a high write/erase cycle endurance, albeit at a lower retention time that requires refreshing of the stored data. However, as the refreshing required of a vertical NOR string array is expected to be much less frequently than in a conventional dynamic random-access memory (DRAM), the multi-gate NOR string arrays of the present invention may operate in some DRAM applications. Such use of the vertical NOR strings allows a substantially lower cost-per-bit figure of merit, as compared to conventional DRAMs, and a substantially lower read-latency, as compared to conventional NAND string arrays.

In another embodiment the vertical NOR string can be programmed, erased and read as NROM/Mirror-bit TFT string.

Organizing the TFTs as vertical NOR strings—rather than the prior art vertical NAND strings—results in (i) a reduced read-latency that can approach that of a dynamic random access memory (DRAM) array, (ii) reduced sensitivities to read-disturb and program-disturb conditions that are associated with long NAND Flash strings, and (iii) reduced cost per bit, as compared to a NAND Flash string.

According to an alternative embodiment of the present invention, each active column in the memory structure includes one or more vertical NOR strings, with each NOR string having thin-film storage transistors sharing a local source line and a local bit line, the local bit line is connected by one segment of a segmented global bit line to a sense amplifier provided in the semiconductor substrate. To significantly reduce the read sense latency, rather than a global bit line that spans a substantial distance (e.g., between a half to the complete length of the chip), multiple, shorter global bit line segments are provided. Each such global segment connects one or more neighboring local bit lines through a segment connector to a segment sense amplifier provided in the semiconductor substrate. In embodiments in which the local source lines are pre-charged to a virtual ground voltage (e.g., $V_{ss}$), the parasitic capacitance of the virtual ground is increased substantially by providing a short global source line segment connector which connects a group of neighboring local source lines into one local source line segment. The number of local source lines included in the segment determines the combined parasitic capacitance (C).

The present invention is better understood upon consideration of the detailed description below, in conjunction with the accompanying drawings.

BRIEF DESCRIPTION OF THE DRAWINGS

FIG. 4a-1 is a top view of a vertical NOR string of FIG. 4a, in which the conductivity of the vertical local source line or drain line is enhanced by including metallic material 420(M) in the core of the pillars of the local source line or drain line.

in FIG. 6a, global bit line 614-1 accesses alternate ones of local bit lines LBL-1, and predetermined curvature 675 of transistor channel 656L amplifies the capacitive coupling between each control gate and the corresponding channel during programming.

in FIG. 6b, global bit line 614-1 accesses alternate (odd) ones of local bit lines 654 (LBL-1), global bit line 614-2 addresses alternate (even) ones of local bit lines 657-2 (LBL-2), local source lines LSL-1 and LSL-2 are pre-charged to provide virtual supply voltage $V_{ss}$.

in FIG. 6c, adjacent word line stacks 623p are isolated from each other by air gap 610 or another dielectric isolation.

FIG. 7d-1 shows in the X-Y plane the inclusion of conductive material 720(M) at the core of vertical pillars of the local source line or local bit line.

in FIG. 8a, "WLs" represents the voltage on the selected word line, and all non-select word lines ("$WL_{NS}$") in the vertical NOR string are set at 0V during the read operation.

in FIG. 8b, "$WL_{CHG}$" represents the gate voltage on the pre-charge transistor (e.g., pre-charge transistor 317 or 370 in FIG. 3c).

DETAILED DESCRIPTION OF THE PREFERRED EMBODIMENTS

Figure 2:
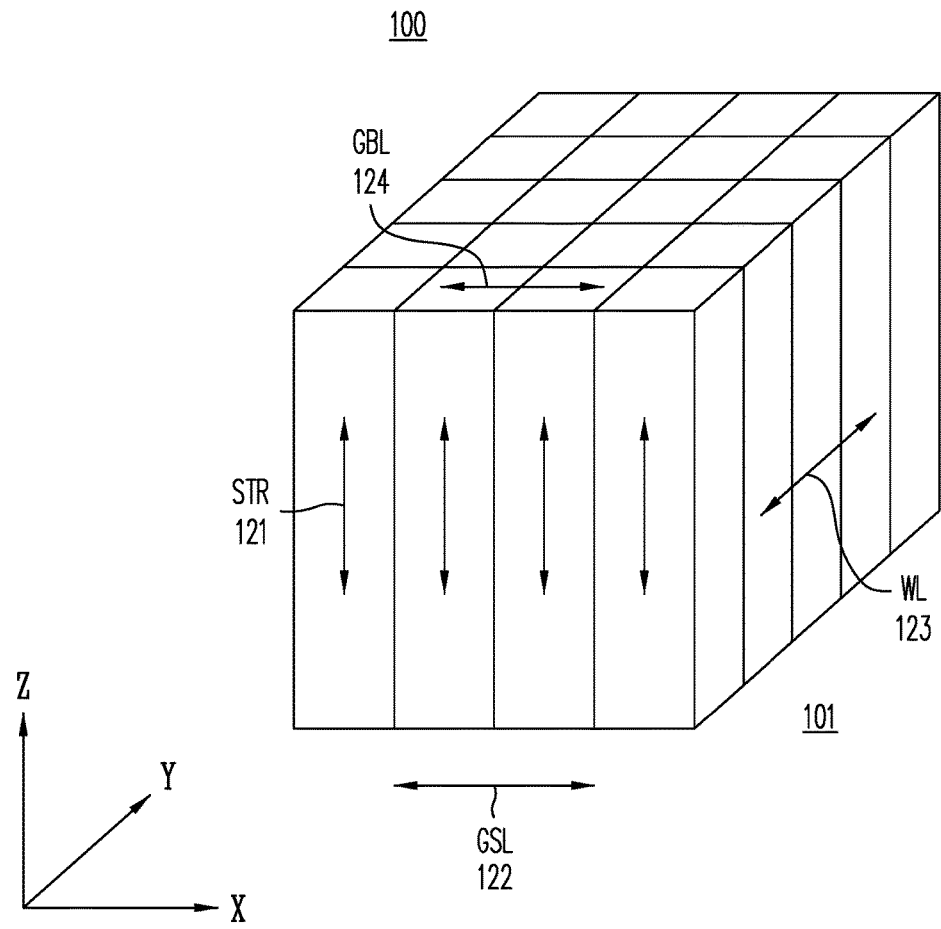
FIG. 2 shows conceptualized memory structure 100, which illustrates a 3-dimensional organization of memory cells; the memory cells are provided in vertical NOR strings, with each vertical NOR string having memory cells each being controlled by one of a number of horizontal word lines, according to one embodiment of the present invention.

FIG. 2 shows conceptualized memory structure 100, which illustrates a 3-dimensional organization of memory cells (or storage elements) provided in vertical NOR strings. In conceptualized memory structure 100, each vertical NOR string includes memory cells that are each controlled by a corresponding horizontal word line, according to one embodiment of the present invention. In conceptualized memory structure 100, each memory cell is formed in deposited thin films provided "vertically", i.e., along a direction perpendicular to the surface of substrate layer 101. Substrate layer 101 may be, for example, a conventional silicon wafer used for fabricating integrated circuits, familiar to those of ordinary skill in the art. In this detailed description, a Cartesian coordinate system (such as indicated in FIG. 2) is adopted solely for the purpose of facilitating discussion. Under this coordinate system, the surface of substrate layer 101 is considered a plane which is parallel to the X-Y plane. Thus, as used in this description, the term "horizontal" refers to any direction parallel to the X-Y plane, while "vertical" refers to the Z-direction.

In FIG. 2, each vertical column in the Z-direction represents storage elements or TFTs in a vertical NOR string (e.g., vertical NOR string 121). The vertical NOR strings are arranged in a regular manner in rows each extending along the X-direction. (Of course, the same arrangement may also be seen alternatively as an arrangement of rows each extending along the Y-directions). The storage elements of a vertical NOR string share a vertical local source line and a vertical local bit line (not shown). A stack of horizontal word lines (e.g., WL 123) run along the Y-direction, with each word line serving as control gates for corresponding TFTs of vertical NOR strings located adjacent the word line along the Y-direction. Global source lines (e.g., GSL 122) and global bit lines (e.g., GBL 124) are provided along the X-direction generally running either below the bottom of or on top of conceptualized memory structure 100. Alternatively, signal lines GSL 122 and GBL 124 can both be routed below (or both be routed on top of) conceptualized memory structure 100, each of these signal lines may be selectively connected by access transistors (not shown) to the local source lines and local bit lines of individual vertical NOR strings. Unlike a vertical NAND string of the prior art, in a vertical NOR string of the present invention, writing or reading any one of its storage elements does not involve activation of any other storage element in the vertical NOR string. As shown in FIG. 2, solely for illustrative purpose, conceptualized memory block 100 is a multi-gate vertical NOR string array consisting of a 4×5 arrangement of vertical NOR strings, with each NOR string typically having 32 or more storage elements and access selection transistors. As a conceptualized structure, memory block 100 is merely an abstraction of certain salient characteristics of a memory structure of the present invention. Although shown in FIG. 2 as a 4×5 arrangement of vertical NOR strings, with each vertical NOR strings having a number of storage elements, a memory structure of the present invention may have any number of vertical NOR strings in each row along either of the X- and Y-directions, and any number of storage elements in each vertical NOR string. For example, there may be thousands of vertical NOR strings arrayed in rows along both the X- and Y-directions, with each NOR string having, for example, 2, 4, 8, 16, 32, 64, 128, or more storage elements.

The number of storage elements in each vertical NOR string of FIG. 2 (e.g., vertical NOR string 121) corresponds to the number of word lines (e.g., WL 123) providing control gates to the vertical NOR string. The word lines are formed as narrow, long metallic strips each extending along the Y-direction. The word lines are stacked one on top of each other, and electrically isolated from each other by dielectric insulation layers there-between. The number of word lines in each stack may be any number, but preferably an integer power of 2 (i.e., $2^n$, where n is an integer). The selection of a power of 2 for the number of word lines follows a customary practice in conventional memory design. It is customary to access each addressable unit of memory by decoding a binary address. This custom is a matter of preference and need not be followed. For example, within the scope of the present invention, conceptualized memory structure 100 may have M vertical NOR strings along each row in the X- and Y-directions, with M being a number that is not necessarily $2^n$, for any integer n. In some embodiments to be described below, two vertical NOR strings may share a vertical local source line and a vertical local bit line, but their respective storage elements are controlled by two separate word line stacks. This effectively doubles the storage density of the vertical NOR string.

As conceptualized memory structure 100 of FIG. 2 is provided merely to illustrate an organization of memory cells, it is not drawn to specific scale in any of the X-, Y-, and Z-directions.

Figure 3A:
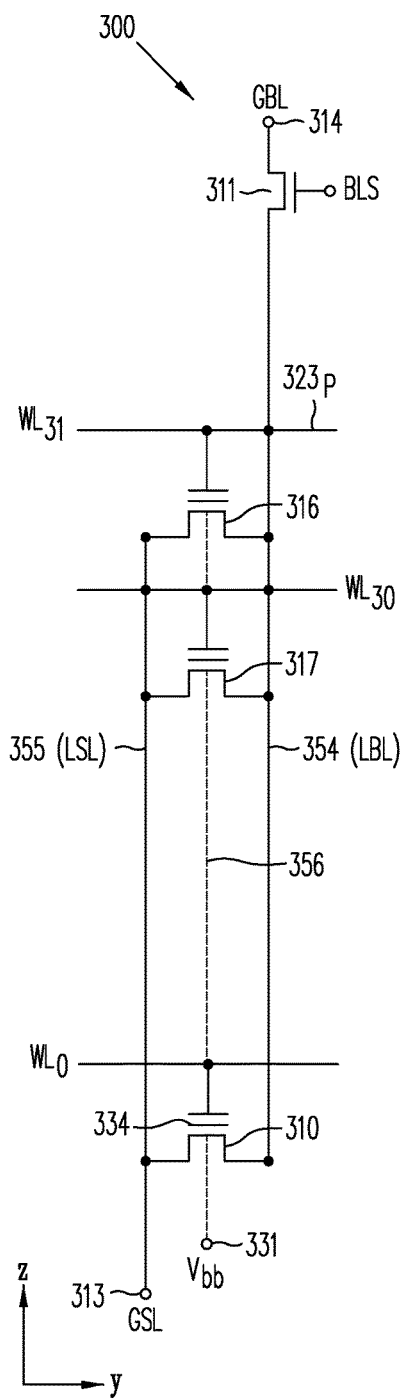
FIG. 3a shows a basic circuit representation in a Z-Y plane of vertical NOR string 300 formed in an active column; vertical NOR string 300 represents a three-dimensional arrangement of non-volatile storage TFTs, with each TFT sharing local source line (LSL) 355 and local bit line (LBL) 354, being accessed respectively by global bit line (GBL) 314 and global source line (GSL) 313 according to one embodiment of the current invention.

FIG. 3a shows a basic circuit representation in a Z-Y plane of vertical NOR string 300 formed in an active column; vertical NOR string 300 represents a three-dimensional arrangement of non-volatile storage TFTs, with each TFT sharing local source line 355 and local bit line 354, according to one embodiment of the current invention. In this detailed description, the term "active region," "active column" or "active strip" refers to a region, column or strip of one or more semiconductor materials on which an active device (e.g., a transistor or a diode) may be formed. As shown in FIG. 3a, vertical NOR string 300 runs along the Z-direction, with TFTs 316 and 317 connected in parallel between vertical local source line 355 and vertical local drain or bit line 354. Bit line 354 and source line 355 are spaced apart, with the region there-between (i.e., body region 356) providing channel regions for the TFTs in the vertical NOR string. Storage elements are formed at the intersections between channel region 356 and each horizontal word line 323p, where p is the index of the word line in the word line stack; in this example, p may take any value between 0 and 31. The word lines extend along the Y-direction. Local bit line 354 is connected through bit line access select transistor 311 to horizontal global bit line (GBL) 314, which runs along the X-direction and connects local bit line 354 to access bit line supply voltage $V_{bl}$. Local source line 355 is connected through horizontal global source line (GSL) 313 to source supply voltage $V_{ss}$. An optional source-select transistor (not shown in FIG. 3a) can be provided to connect between local source line 355 and GSL 313. The optional source-select transistor may be controlled by source decoding circuitry which can be implemented either in the substrate (e.g., semiconductor substrate 101 of FIG. 2) or above the substrate and below memory structure 100, as is known to a person skilled in the art. Body region 356 of the active column may be connected at terminal 331 to substrate bias voltage $V_{bb}$. Substrate bias voltage $V_{bb}$ may be used, for example during an erase operation. The $V_{bb}$ supply voltage can be applied to an entire multi-gate vertical NOR string array, or be applied selectively to one or more rows of vertical NOR strings via a decoding mechanism. Lines connecting the $V_{bb}$ supply voltage to body region 356 run preferably along the direction of the word lines.

Figure 1A:
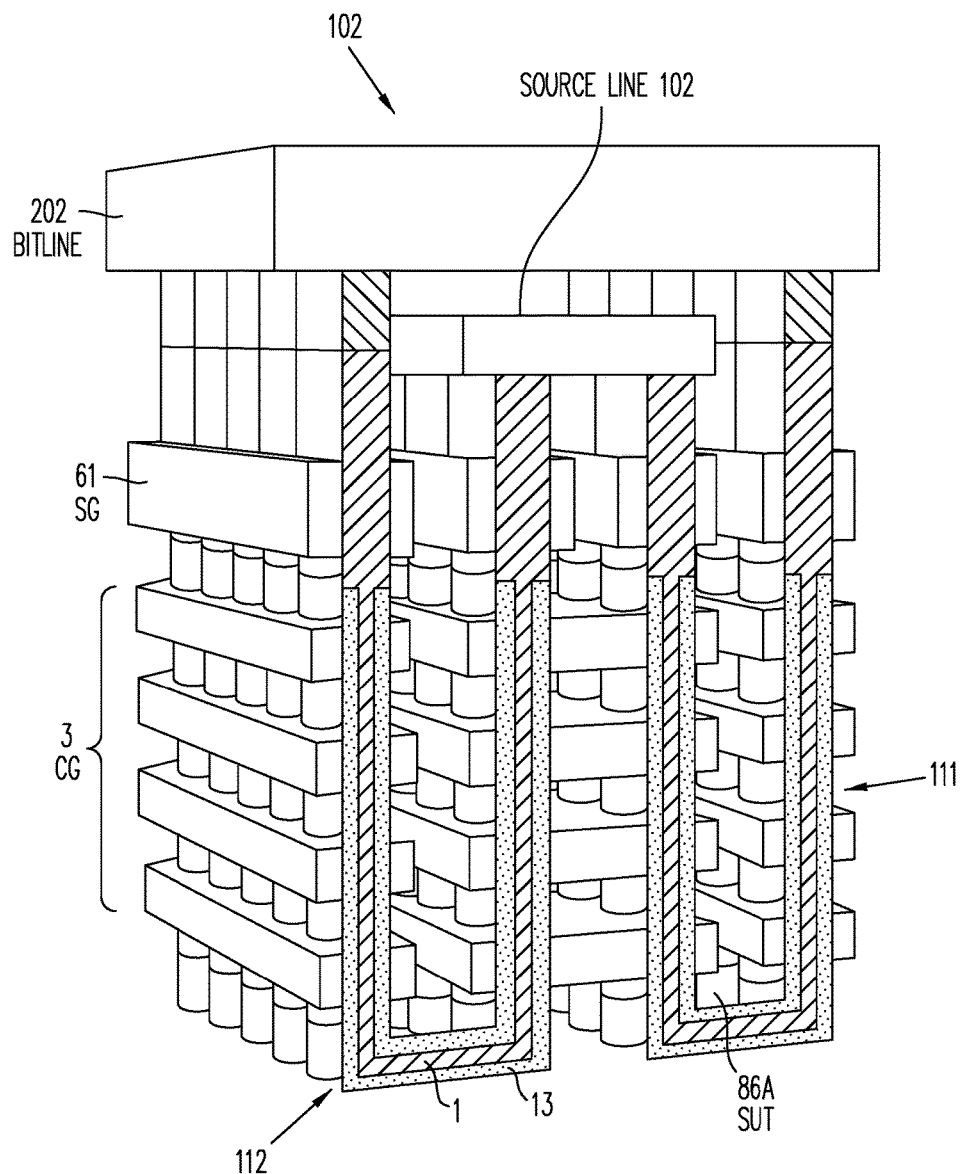
FIG. 1a shows three-dimensional vertical NAND strings 111 land 112 in the prior art.
Figures 1B, 3C:
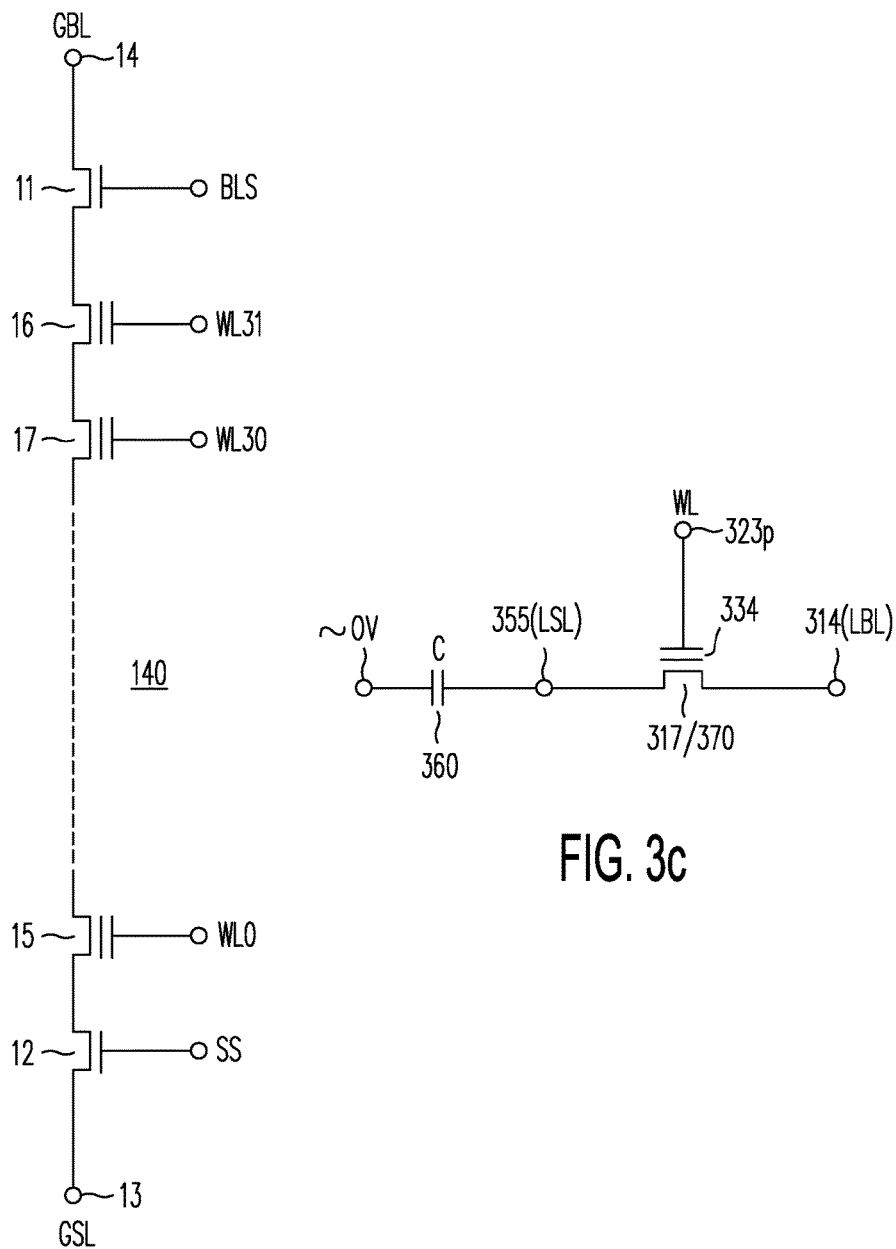
FIG. 1b shows basic circuit representation 140 of a three-dimensional vertical NAND string in the prior art.
FIG. 3c shows a basic circuit representation of dynamic non-volatile storage transistor 317 having one or more programmed threshold voltages and connected to parasitic capacitor 360; capacitor 360 is pre-charged to temporarily hold a virtual voltage $V_{ss}$ on source terminal 355 so as to allow the threshold voltage of transistor 317 to be dynamically detected by the discharging of voltage $V_{ss}$, when control gate 323p is raised to a voltage that exceeds the threshold voltage.
Figure 3B:
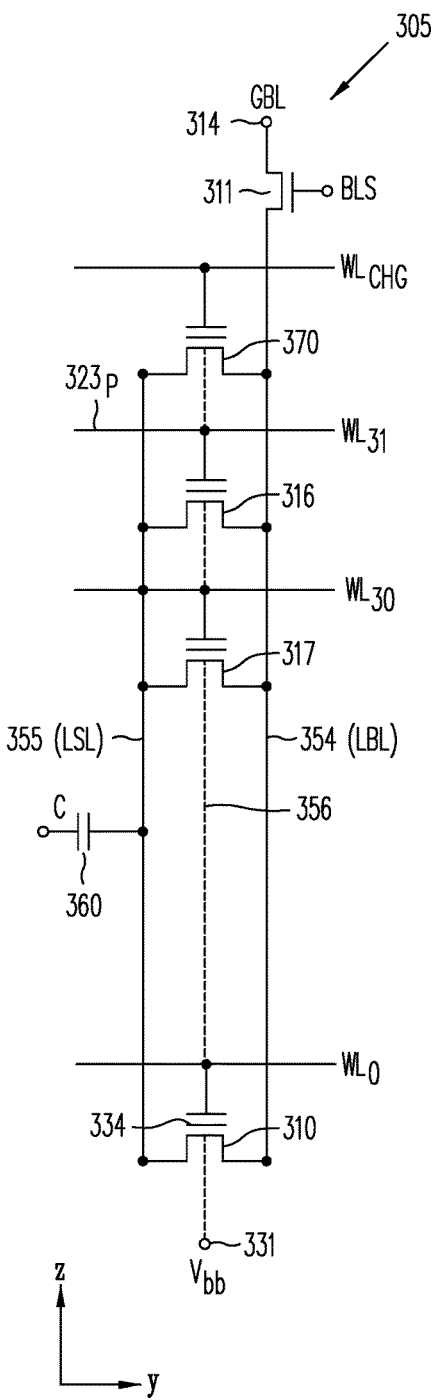
FIG. 3b shows a basic circuit representation in a Z-Y plane of vertical NOR string 305 formed in an active column; vertical NOR string 305 represents a three-dimensional arrangement of non-volatile storage TFTs, including a dedicated pre-charge TFT 370 for setting a voltage ("$V_{ss}$") on shared local source line 355, which has a parasitic capacitance C, according to one embodiment of the present invention.

FIG. 3b shows a basic circuit representation in a Z-Y plane of vertical NOR string 305 formed in an active column; vertical NOR string 305 represents a three-dimensional arrangement of non-volatile storage TFTs, including (optionally) dedicated pre-charge TFT 370 for momentarily setting a voltage ("$V_{ss}$") on shared local source line 355, which has a parasitic capacitance C (represented by capacitor 360), according to one embodiment of the present invention. Unlike vertical NOR string 300 of FIG. 3a, vertical NOR string 305 does not implement GSL 313, replacing it with pre-charge transistor 370 which pre-charges parasitic capacitor 360, which temporarily holds a voltage of $V_{ss}$ volts. Under this pre-charging scheme, global source lines (e.g., global source lines 313 of FIG. 3a) and its decoding circuitry are rendered unnecessary, thereby simplifying both the manufacturing process as well as circuit layout, and providing a very tight footprint for each vertical NOR string. FIG. 3c highlights the structure of non-volatile storage TFT 317, which can also be used, in addition to its normal storage function, to perform the pre-charge function of dedicated pre-charge transistor 370. A dynamic read operation for TFT 317 is described below in conjunction with sensing the correct one of several threshold voltages that is programmed into storage element 334 of TFT 317.

Figure 4A:
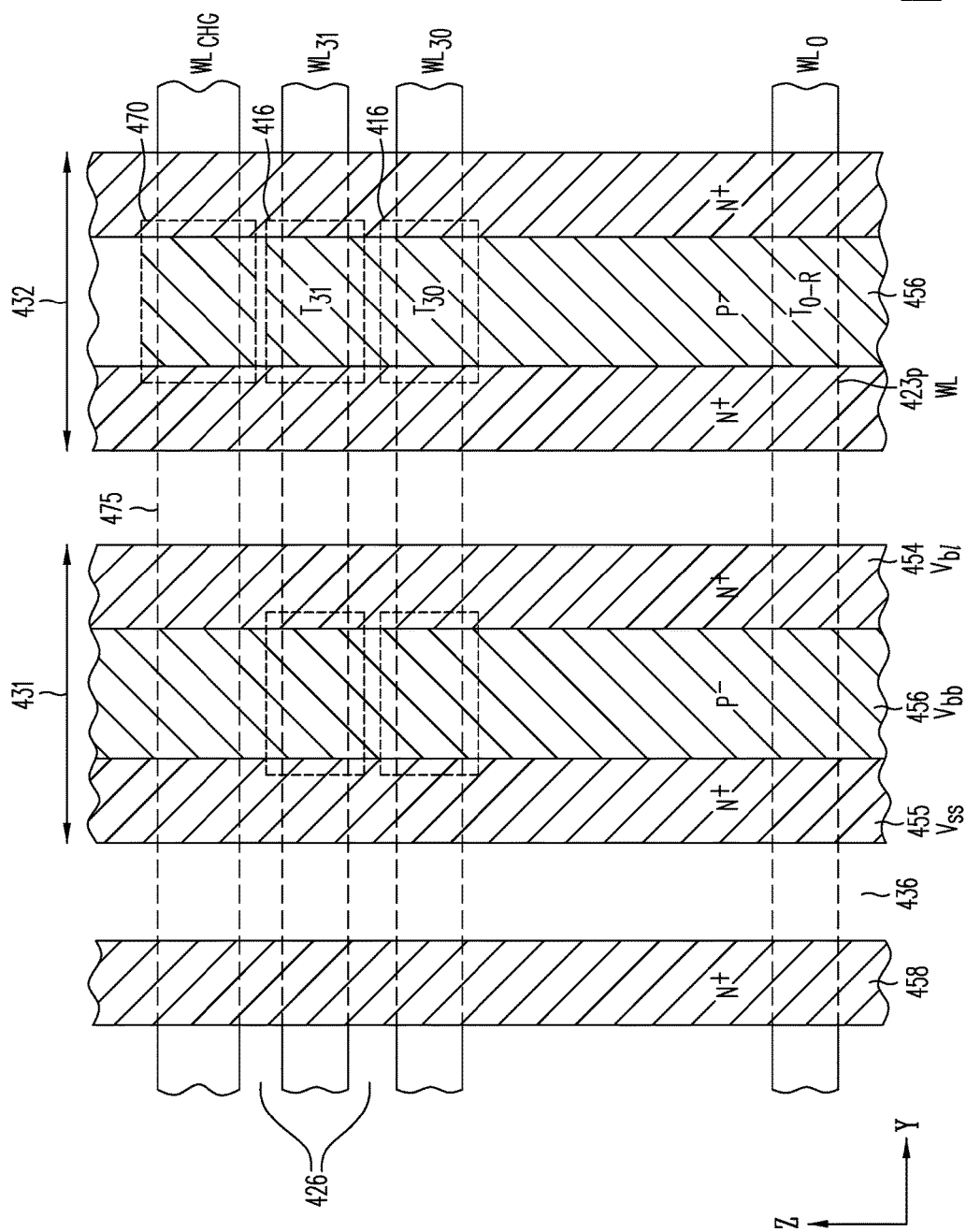
FIG. 4a is a cross section in a Z-Y plane showing side-by-side active columns 431 and 432, each of which may form a vertical NOR string that has a basic circuit representation illustrated in either FIG. 3a or FIG. 3b, according to one embodiment of the present invention.

FIG. 4a is a cross section in a Z-Y plane showing side-by-side active columns 431 and 432, each of which may form a vertical NOR string that has a basic circuit representation illustrated in either FIG. 3a or FIG. 3b, according to one embodiment of the present invention. As shown in FIG. 4a, active columns 431 and 432 each include vertical N+ doped local source region 455 and vertical N+ doped local drain or bit line region 454, separated by lightly P- doped or undoped channel region 456. P- doped channel region 456, N+ doped local source region 455 and N+ doped local drain or bit line region 454 may be biased to body bias voltage $V_{bb}$, source supply voltage $V_{ss}$, and bit line voltage $V_{bl}$, respectively. In some embodiments of the current invention, use of body bias voltage $V_{bb}$ is optional, such as when the active strip is sufficiently thin (e.g., 10 nanometers or less). For a sufficiently thin active strip, the active region is readily fully depleted under appropriate voltage on the control gate, such that voltage $V_{bb}$ may not provide a solid supply voltage to the channel regions of the TFTs along the vertical NOR string. Isolation region 436, which electrically insulates active columns 431 and 432, may be either a dielectric insulator or an air-gap. A vertical stack of word lines 423p, respectively labeled $WL_0$-$WL_{31}$ (and optionally $WL_{CHG}$), provides control gates to the TFTs in the vertical NOR strings formed in active columns 431 and 432. Word line stack 423p is typically formed as long narrow metallic conductors (e.g., tungsten, a silicide or silicide) that extend along the Y-direction, electrically isolated from each other by dielectric layers 426, each typically formed out of silicon oxide (e.g., $SiO_2$) or an air gap. A non-volatile storage element may be formed at the intersection of each word line 423p and each P- doped channel region 456 by providing a charge-trapping material (not shown) between word line 423p and P- doped channel region 456. For example, FIG. 4a indicates by dashed boxes 416 the locations where nonvolatile storage elements (or storage transistors) $T_0$ to $T_{31}$ may be formed. Dashed box 470 indicates where a dedicated pre-charge transistor may be formed, which, when momentarily switched on, allows charge to be transferred from common local bit line region 454 to common local source line region 455 when all transistors $T_0$ to $T_{31}$ are in their off state.

Figure 4B:
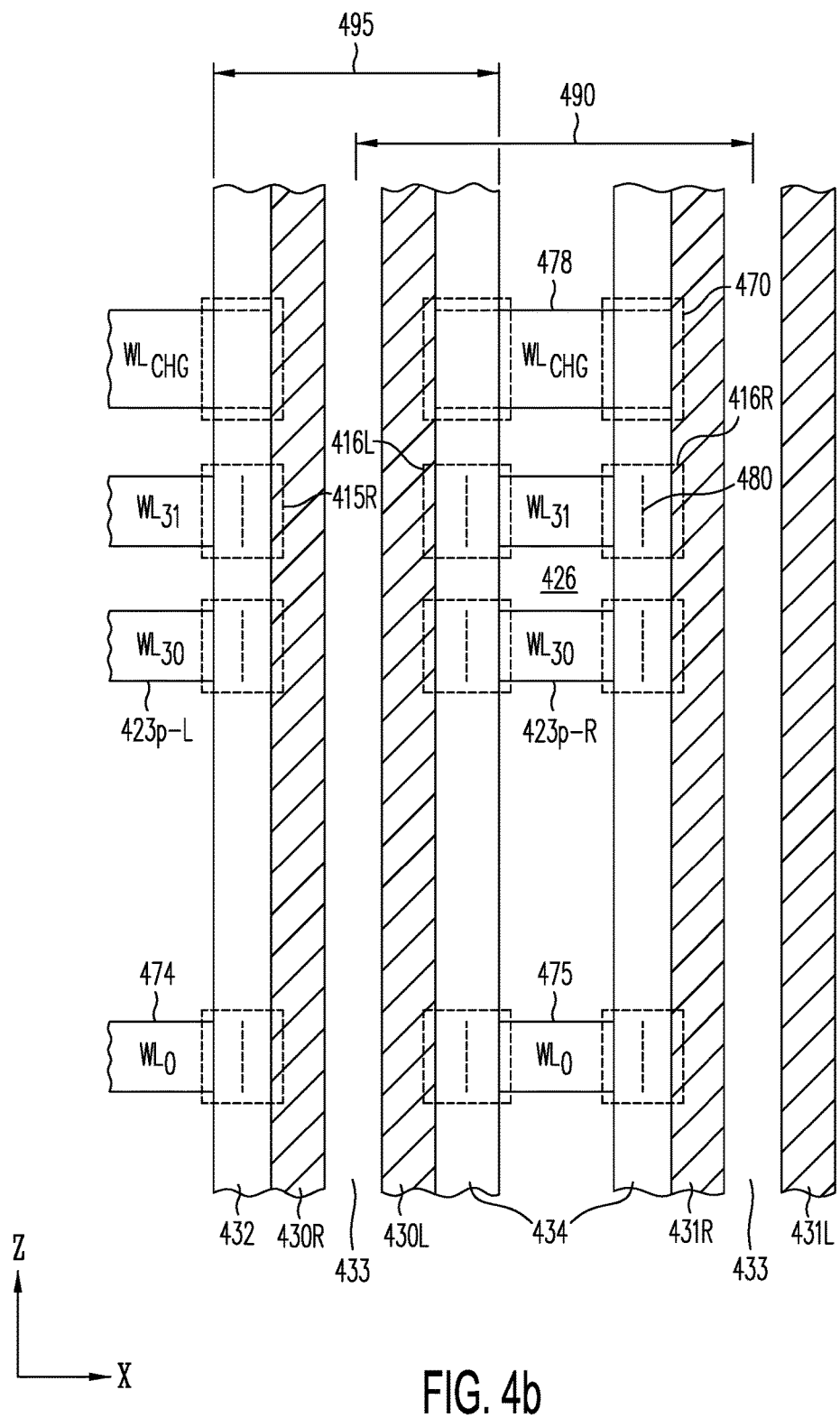
FIG. 4b is a cross section in the Z-X plane showing active columns 430R, 430L, 431R and 431L, charge-trapping layers 432 and 434, and word lines 423p-L and 423p-R, according to one embodiment of the present invention.

FIG. 4b is a cross section in the Z-X plane showing active columns 430R, 430L, 431R and 431L, charge-trapping layers 432 and 434, and word line stacks 423p-L and 423p-R, according to one embodiment of the present invention. Similar to FIG. 4a, each of vertical word line stacks 423p-L and 423p-R in FIG. 4b denotes a stack of long narrow conductors, where p is an index labeling the word lines in stack (e.g., word lines $WL_0$ to $WL_{31}$). As shown in FIG. 4b, each word line serves as control gates for the nonvolatile TFTs in the vertical NOR strings formed on adjacent active columns 430-L and 431-R on opposite sides of the word line (within region 490). For example, in FIG. 4b, word line $WL_{31}$ in word line stack 423p-R serves as control gates for both transistor 416L on active column 430L and transistor 416R on active column 431R. Adjacent word line stacks (e.g., word lines stacks 423p-L and 423p-R) are separated by a distance 495, which is the width of a trench formed by etching through successive word line layers, as described below. Active columns 430R and 430L, and their respective charge-trapping layers 432 and 434, are subsequently formed inside the trench etched through the word line layers. Charge-trapping layer 434 is provided interposed between word line stack 423p-R and vertical active columns 431R and 430L. As elaborated below, during programming of transistor 416R, charge injected into charge-trapping layer 434 is trapped in the portion of charge-trapping layer 434 within dash box 480. The trapped charge alters the threshold voltage of TFT 416R, which may be detected by measuring a read current flowing between local source region 455 and local drain region 454 on active column 431R (these regions are shown, e.g., FIG. 4a in the orthogonal cross section of the active column). In some embodiments, pre-charge word line 478 (i.e., $WL_{CHG}$) is provided as control gate of pre-charge TFT 470 that is used to charge parasitic capacitance C of local source line 455 (see, capacitor 360 of FIG. 3*b* and local source line 455 of FIG. 4*a*) to a ground or source supply voltage $V_{ss}$. For expediency, charge-trapping layer 434 also provides a storage element in pre-charge transistor 470, which however is not itself used as a memory transistor. Pre-charging may alternatively be performed using any of memory transistors $T_0$ to $T_{31}$ formed on active column 431R. One or more of these memory transistors, in addition to their storage function, can perform the function of the pre-charge transistor. To perform the pre-charge, the voltage on the word line or control gate is temporarily raised to a few volts above its highest programmable threshold voltage, thereby allowing voltage $V_{ss}$ applied to local bit line 454 to be transferred to local source line 455 (FIG. 4*a*). Having memory transistors $T_0$ to $T_{31}$ perform the pre-charge function eliminates the need for separate dedicated pre-charge TFT 470. Care must be taken, however, to avoid unduly disturbing the threshold voltage of such memory TFT when it is performing its pre-charging function.

Although active columns 430R and 430L are shown in FIG. 4*b* as two separate active columns separated by an air-gap or dielectric insulation 433, the adjacent vertical N+ local source lines may be implemented by a single shared vertical local source line. Likewise, the vertical N+ local drain or bit lines may be implemented by a single shared vertical local bit line. Such a configuration provides "vertical NOR string pair". In that configuration, active columns 430L and 430R may be seen as two branches (hence the "pair") in one active column. The vertical NOR string pair provides double-density storage through charge-trapping layers 432 and 434 interposed between active columns 430R and 430L and word lines stacks 423*p*-L and 423*p*-R on opposite sides. In fact, active columns 430R and 430L may be merged into one active string by eliminating the air gap or dielectric insulation 433, yet still achieve the pair of NOR TFT strings implemented at the two opposite faces of the single active column. Such a configuration achieves the same double-density storage, as the TFTs formed in the opposite faces of the active columns are controlled by separate word line stacks and are formed out of separate charge-trapping layers 434 and 432. Maintaining separate thin active columns 430R and 430L (i.e., instead of merging them into one active column) is advantageous because TFTs on each active column are thinner than the merged column and can therefore more readily be fully depleted under appropriate control gate voltage conditions, thereby substantially reducing source-drain subthreshold leakage current between vertical source regions 455 and vertical drain regions 454 of the active columns (FIG. 4*a*). Having ultra-thin (and therefore highly resistive) active columns is possible for even very long vertical NOR strings (e.g., 128 TFTs or longer) because the TFTs in a vertical NOR string are connected in parallel and because only one of the many TFTs is switched on at any one time, in contrast with the high resistance of a NAND TFT string where TFTs in the string are connected in series and must therefore all be switched on to sense any one of TFTs in the string. For example, in a 32-TFT vertical NOR string, to be able to read transistor $T_{30}$ (FIG. 4*a*), the channel length of channel region 456 may span just 20 nanometers, as compared to the corresponding channel length of a NAND string, which may be 32 times longer, or 640 nanometers.

Figure 4C:
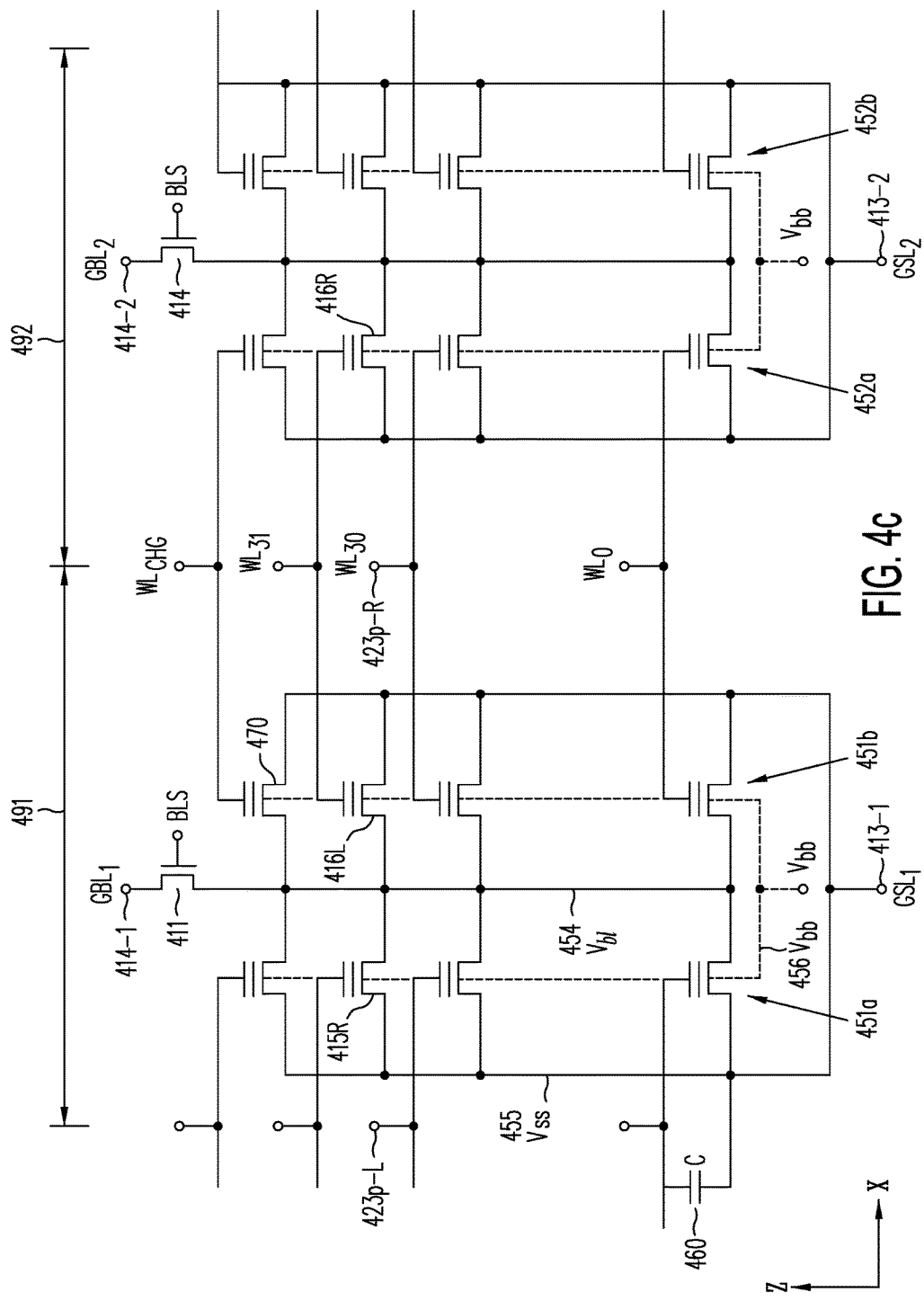
FIG. 4c shows a basic circuit representation in the Z-X plane of vertical NOR string pairs 491 and 492, according to one embodiment of the present invention.

FIG. 4*c* shows a basic circuit representation in the Z-X plane of vertical NOR string pairs 491 and 492, according to one embodiment of the present invention. As shown in FIG. 4*c*, vertical NOR strings 451*b* and 452*a* share a common word line stack 423*p*-R, in the manner shown for the vertical NOR strings of active strips 430L and 431R of FIG. 4*b*. For their respective commonly-connected local bit lines, vertical NOR string pairs 491 and 492 are served by global bit line 414-1 ($GBL_1$) through access select transistor 411 and global bit line 414-2 ($GBL_2$) through access select transistor 414, respectively. For their respective commonly-connected local source lines, vertical NOR string pairs 491 and 492 are served by global source line 413-1 ($GSL_1$) and global source line 413-2 ($GSL_2$), respectively (source line select access transistors can be similarly provided and are not shown in FIG. 4*c*). As shown in FIG. 4*c*, vertical NOR string pair 491 includes vertical NOR strings 451*a* and 451*b* that share local source line 455, local bit line 454, and optional body connection 456. Thus, vertical NOR string pair 491 represent the vertical NOR strings formed on active columns 430R and 430L of FIG. 4*b*. Word line stacks 423*p*-L and 423*p*-R (where, in this example, 31≥p≥0) provide control gates for vertical NOR string 451*a* and vertical NOR string 451*b*, respectively. The word lines to control gates in the stack are decoded by decoding circuitry formed in the substrate to ensure that appropriate voltages are applied to the addressed TFT (i.e., the activated word line) and to the unaddressed TFTs (i.e., all other non-activated word lines in the string). FIG. 4*c* illustrates how storage transistors 416L and 416R on active columns 430L and 431R of FIG. 4*b* are served by the same word line stack 423*p*-R. Thus, vertical NOR string 451*b* of vertical NOR string pair 491 and vertical NOR string 452*a* of vertical string pair 492 correspond to the adjacent vertical NOR strings formed on active columns 430L and 431R of FIG. 4*b*. Storage transistors of vertical NOR string 451*a* (e.g., storage transistor 415R) are served by word line stack 423*p*-L.

In another embodiment, the hard-wired global source lines 413-1, 413-2 of FIG. 4*c* are eliminated, to be substituted for by a parasitic capacitance (e.g., the parasitic capacitance represented by capacitor 460 of FIG. 4*c* or capacitor 360 of FIG. 3*c*) between shared N+ local source line 455—which is common to both vertical NOR strings 451*a* and 451*b*—and its numerous associated word lines 423*p*-L and 423*p*-R. In a vertical stack of 32 TFTs, each of the 32 word lines contribute their parasitic capacitance to provide total parasitic capacitance C, such that it is sufficiently large to temporarily hold the voltage supplied by pre-charge TFT 470 to provide a virtual source voltage $V_{ss}$ during the relatively short duration of read or programming operations. In this embodiment, the virtual source voltage temporarily held on the parasitic capacitor (C) is provided to local source line 455 from global bit line $GBL_1$ through access transistor 411 and pre-charge transistor 470. Alternatively, dedicated pre-charge transistor 470 can be eliminated, if one or more of the memory TFTs in the vertical NOR sting are used, in addition to their storage function, to pre-charge local source line 455, by bringing its word line voltage momentarily higher than its highest programmed voltage. Using a storage TFT for this purpose, care must be taken, however, to avoid over-programming the storage TFT. Using the virtual $V_{ss}$ voltage provides the significant advantage of eliminating hard-wired global source lines (e.g., $GLS_1$, $GLS_2$) and their associated decoding circuitry and access transistors, thereby materially simplifying the process flow and design challenges and resulting in a significant more compact vertical NOR string.

Figure 5A:
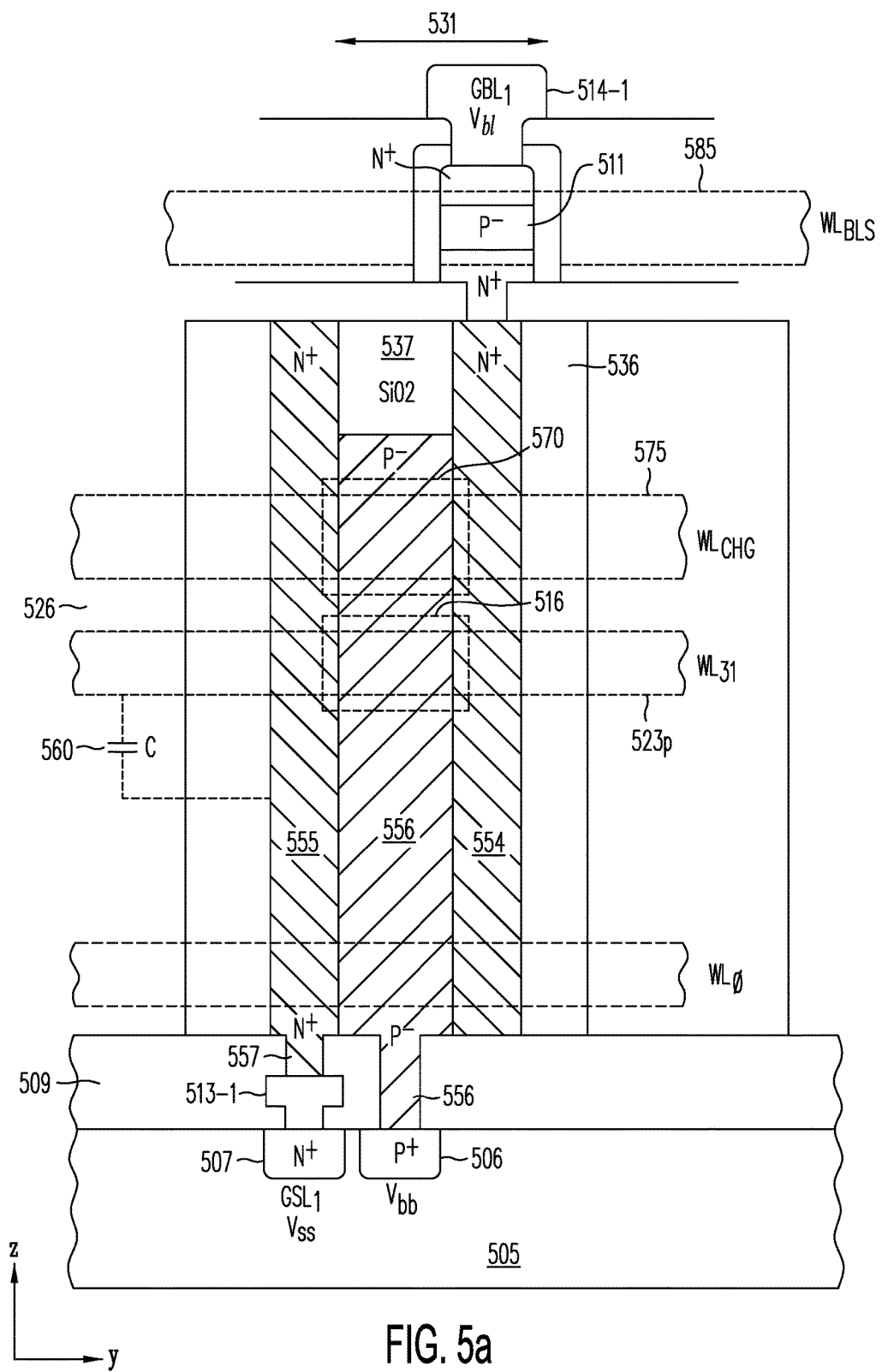
FIG. 5a is a cross section in the Z-Y plane showing connections of a vertical NOR string of active column 531 to global bit line 514-1 ($GBL_1$), global source line 507 ($GSL_1$), and common body bias source 506 ($V_{bb}$), according to one embodiment of the present invention.

FIG. 5*a* is a cross section in the Z-Y plane showing connections of vertical NOR string of active column 531 to global bit line 514-1 ($GBL_1$), global source line 507 ($GSL_1$), and common body bias source 506 ($V_{bb}$), according to one embodiment of the present invention. As shown in FIG. 5a, bit-line access select transistor 511 connects $GBL_1$ with local bit line 554, and buried contact 556 optionally connects a P− body region on the active strip to body bias source 506 ($V_{bb}$) in the substrate. Bit-line access select transistor 511 is formed in FIG. 5a above active column 531. However, alternatively, bit-line access select transistor 511 may be formed at the bottom of active column 531 or in substrate 505 (not shown in FIG. 5a). In FIG. 5a, bit-line access select transistor 511 can for example be formed in an isolated island of an N+/P−/N+ doped polysilicon stack together with access select word line 585. When a sufficiently large voltage is applied to select word line 585, the P− channel is inverted, thereby connecting local bit line 554 to $GBL_1$. Word line 585 runs along the same direction (i.e., the Y-direction) as the word lines 523p which serve as control gates to the TFTs of the vertical NOR string. Word line 585 may be formed separately from word lines 523p. In one embodiment, $GBL_1$ runs horizontally along the X-direction (i.e., perpendicular to the directions of the word lines), and bit-line access select transistor 511 provides access to local bit line 554, which is the local bit line of merely one of many vertical NOR strings that are served by $GBL_1$. To increase read and program operation efficiency, in a multi-gate NOR string array, thousands of global bit lines may be used to access in parallel the local bit lines of thousands of vertical NOR strings that are accessed by word line 585. In FIG. 5a, local source line 555 is connected through contact 557 to global source line 513-1 ($GSL_1$), which may be decoded, for example by decoding circuitry in substrate 505. Alternatively, as described already, the global source line may be eliminated by providing a virtual source voltage $V_{ss}$ on local bit line 555 and temporarily pre-charging the parasitic capacitor 560 (i.e., parasitic capacitance C) of local source line 555 through TFT 570.

Support circuitry formed in substrate 505 may include address encoders, address decoders, sense amplifiers, input/output drivers, shift registers, latches, reference cells, power supply lines, bias and reference voltage generators, inverters, NAND, NOR, Exclusive-Or and other logic gates, other memory elements, sequencers and state machines, among others. The multi-gate NOR string arrays may be organized as multiple blocks of circuits, with each block having multiple multi-gate NOR string arrays.

Figure 6A:
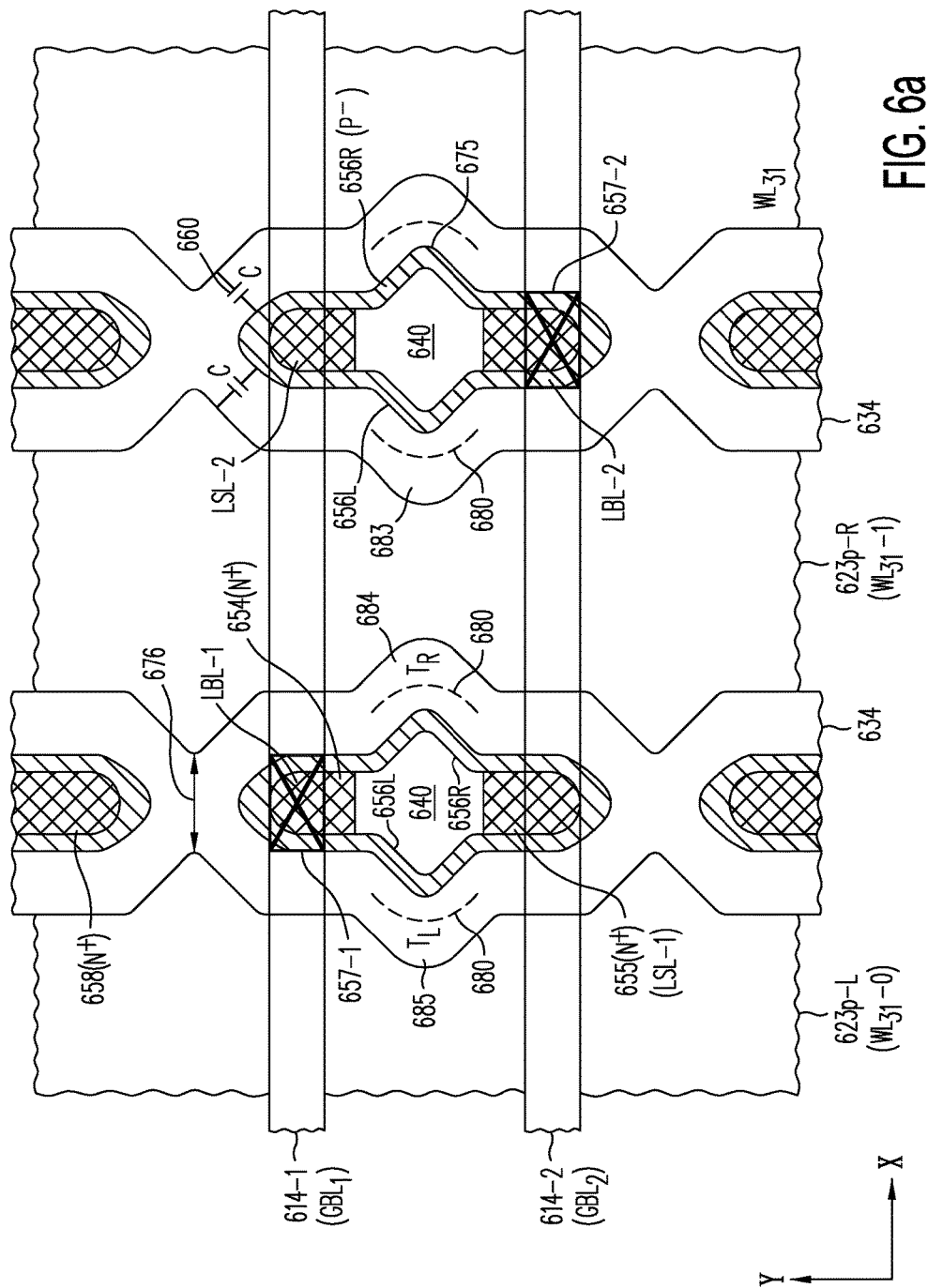
FIG. 6a is a cross section in the X-Y plane showing, according to one embodiment of the present invention, TFT 685 ($T_L$) of vertical NOR string 451a and TFT 684 ($T_R$) of vertical NOR string 451b in vertical NOR string pair 491, as discussed in conjunction with FIG. 4c.

FIG. 6a is a cross section in the X-Y plane, showing TFT 685 ($T_L$) of vertical NOR string 451a and TFT 684 ($T_R$) of vertical NOR string 451b in vertical NOR string pair 491, as discussed above in conjunction with FIG. 4c. As shown in FIG. 6, TFTs 684 and 685 share N+ local source region 655 and N+ local drain or bit line region 654, both regions extending in long narrow pillars along the Z-direction. (N+ local source region 655 corresponds to local source line 455 of FIG. 4a, N+ local drain region 654 corresponds to local bit line 454 of FIG. 4a). In this embodiment, P− doped channel regions 656L and 656R form a pair of active strings between local source pillar 655 and local drain pillar 654 and extend along the Z-direction, isolated from each other by isolation region 640. Charge-trapping layer 634 is formed between word lines 623p-L ($WL_{31-0}$) and 623p-R ($WL_{31-1}$) and the outside of channel regions 656L and 656R respectively. Charge trapping layer 634 may be a transistor gate dielectric material consisting of, for example, a thin film of tunnel dielectric (e.g., silicon dioxide), followed by a thin layer of charge trapping material such as silicon nitride or conductive nanodots embedded in a non-conducting dielectric material, or isolated floating gates, and is capped by a layer of blocking dielectric such as ONO (an oxide-nitride-oxide triple-layer) or a high dielectric constant film such as aluminum oxide or hafnium oxide or some combination of such dielectrics. Source-drain conduction is controlled by word lines 623p-L and 623p-R, respectively, forming control gates on the outside of charge-trapping layer 634. When programming or reading TFT 684 ($T_R$), TFT 685 ($T_L$) is turned off by maintaining an appropriate inhibit voltage at word line 623p-L. Similarly, when programming or reading TFT 685 ($T_L$), TFT 684 ($T_R$) is turned off by maintaining an appropriate inhibit voltage at word line 623p-R.

In the embodiment shown in FIG. 6a, word lines 623p-L and 623p-R are contoured to enhance tunneling efficiency into the TFTs 684 and 685 during programming, while reducing reverse-tunneling efficiency during erasing. Specifically, as is known to a person skilled in the art, curvature 675 of channel region 656R amplifies the electric field at the interface between the active channel polysilicon and the tunneling dielectric during programming, while reducing the electric field at the interface between the word line and the blocking dielectric during erasing. This feature is particularly helpful when storing more than one bit per TFT transistor in a multi-level cell (MLC) configuration. Using this technique, 2, 3, or 4 bits or more may be stored in each TFT. In fact, TFTs 684 and 685 may be used as analog storage TFTs with a continuum of stored states. Following a programming sequence (to be discussed below), electrons are trapped in charge-trapping layer 634, as indicated schematically by dashed lines 680. In FIG. 6a, global bit lines 614-1 and 614-2 run perpendicularly to word lines 623p-R and 623p-L and are provided either above or underneath the vertical NOR strings, corresponding to bit lines 414-1 and 414-2 respectively of FIG. 4c. As discussed above in conjunction with FIG. 2, the word lines may span the entire length of memory block 100 along the X-direction, while the global bit lines span the width of memory block 100 along the Y-direction. Of importance, in FIG. 6a, word line 623p-R is shared by TFTs 684 and 683 of two vertical NOR strings on opposite sides of word line 623p-R. Accordingly, to allow TFTs 684 and 683 to be read or programmed independently, global bit line 614-1 ($GBL_1$) contacts local drain or bit line region 657-1 ("odd addresses"), while global bit line 614-2 ($GBL_2$) contacts local drain or bit line region 657-2 ("even addresses"). To achieve this effect, contacts along global bit lines 614-1 and 614-2 are staggered, with each global bit line contacting every other one of the vertical NOR string pair along the X-direction row.

In like manner, global source lines (not shown in FIG. 6a), which may be located either at the bottom or above the multi-gate NOR string array, may run parallel to the global bit lines and may contact the local source lines of vertical NOR string pairs according to even or odd addresses. Alternatively, where pre-charging of the parasitic capacitor (i.e., capacitor 660) temporarily to virtual source voltage $V_{ss}$ is used, the global source lines need not be provided, thereby simplifying the decoding scheme as well as the process complexity.

Figure 6B:
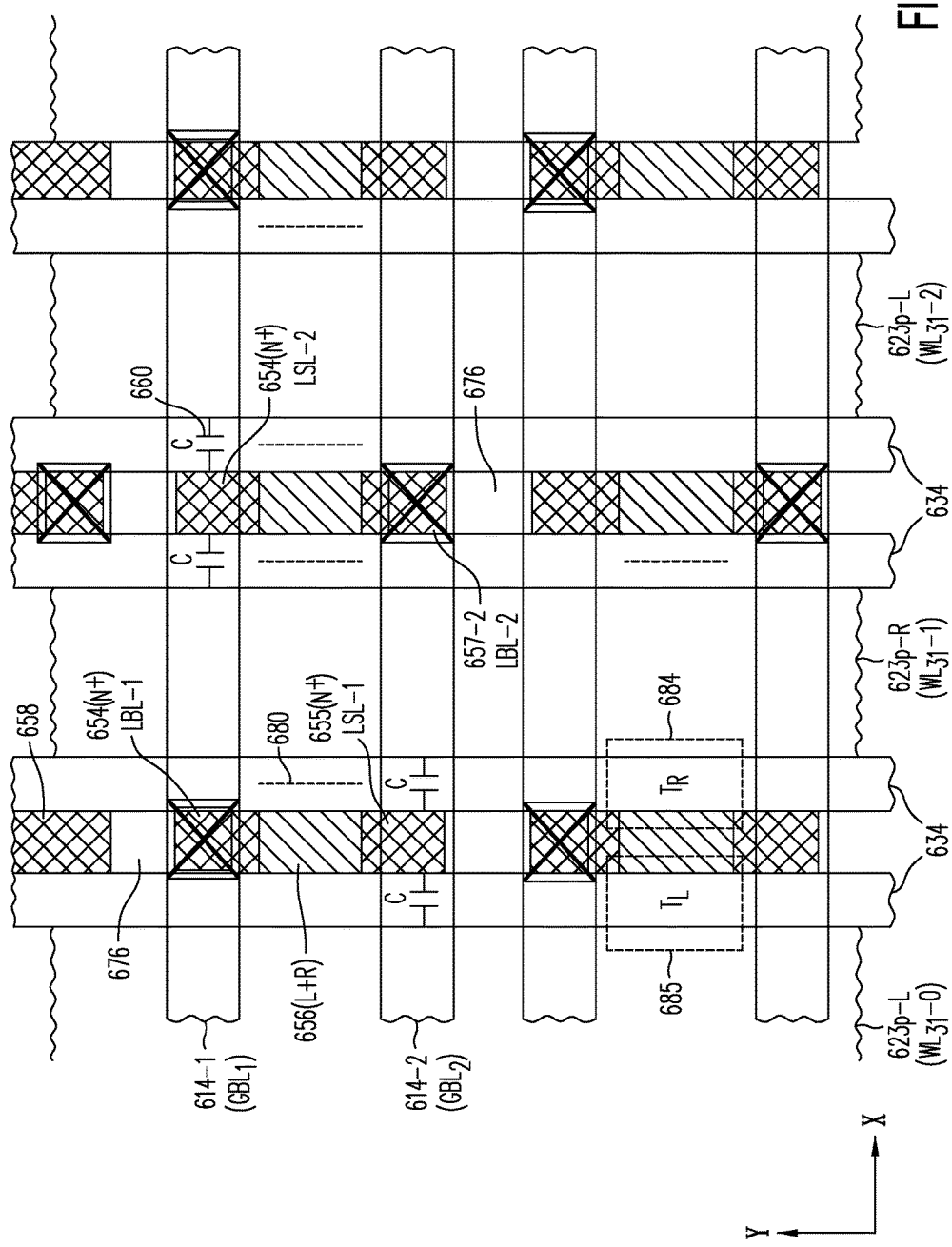
FIG. 6b is a cross section in the X-Y plane showing, according to one embodiment of the current invention, TFT 685(TL) of vertical NOR string 451a sharing an active region with TFT 684 ($T_R$) of vertical NOR string 451b in vertical NOR string pair 491, as discussed in conjunction with FIG. 4c.

FIG. 6a shows only one of several possible embodiments by which vertical NOR string pairs may be provided with stacked word lines. For example, curvature 675 in channel region 656R can be further accentuated. Conversely such curvature can be altogether eliminated (i.e. straightened out) as shown in the embodiment of FIG. 6b. In the embodiment of FIG. 6b isolation spacing 640 of FIG. 6a may be reduced or altogether eliminated by merging channel regions 656L and 656R into a single region 656(L+R), achieving greater area efficiency without sacrificing the dual-channel configuration: for example TFTs 685 ($T_L$) and 684 ($T_R$) reside on opposite faces of the same active strip. In the embodiments of FIGS. 6a, 6b, vertical NOR strings sharing a word line may be laid out in a staggered pattern relative to each other (not shown), such that they may be brought closer to each other, thereby reducing the effective footprint of each vertical NOR string. Although FIGS. 6a and 6b show direct connection via a contact between global bit line 614-1 and N+ doped local drain bit line pillar 654 (LBL-1), such connection can also be accomplished using a bit-line access selection transistor (e.g., bit line access select transistor 511 of FIG. 5a, not shown in already crowded FIGS. 6a and 6b).

In the embodiments of FIGS. 6a and 6b, dielectric isolation between N+ doped local drain region 654 and its adjacent local N+ doped source region 658 (corresponding to isolation region 436 of FIG. 4a) can be established by, for example, defining the separation 676 between word lines 623p-R and 623p-L to be less than the thicknesses of two back-to-back charge-trapping layers, so that the charge-trapping layers are merged together during their deposition. The resulting merging of the deposited charge-trapping layers creates the desired dielectric isolation. Alternatively, isolation between adjacent active strings can be achieved by using a high aspect-ratio etch of N+ polysilicon to create gap 676 (air gap or dielectric filled) isolating N+ pillar 658 of one string from N+ pillar 654 of the adjacent string (i.e., creating gap 436 shown in FIG. 4a).

Contrasting between the prior art vertical NAND strings and the vertical NOR strings of the current invention, although both types of devices employ thin-film transistors with similar word line stacks as control gates, their transistor orientations are different: in the prior art NAND string, each vertical active strip may have 32, 48 or more TFTs connected in series. In contrast, each active column forming the vertical NOR strings of the present invention the vertical column may have one or two sets of 32, 48 or more TFTs connected in parallel. In the prior art NAND strings, the word lines in some embodiments typically wrap around the active strip. In some embodiments of the vertical NOR string of the present invention separate designated left and right word lines are employed for each active strip, thereby to achieve a doubling (i.e. a pair) storage density for each global bit line, as illustrated in FIGS. 4c, 6a and 6b. The vertical NOR strings of the present invention do not suffer from program-disturb or read-disturb degradation, nor do they suffer from the slow latency of the prior art NAND strings. Thus, a much larger number of TFTs may be provided in a vertical NOR string than in a vertical NAND strings. Vertical NOR strings, however, may be more susceptible to subthreshold or other leakage between the long vertical source and drain diffusions (e.g., local source region 455 and local drain region 454, respectively, illustrated in FIG. 4a).

Figure 6C:
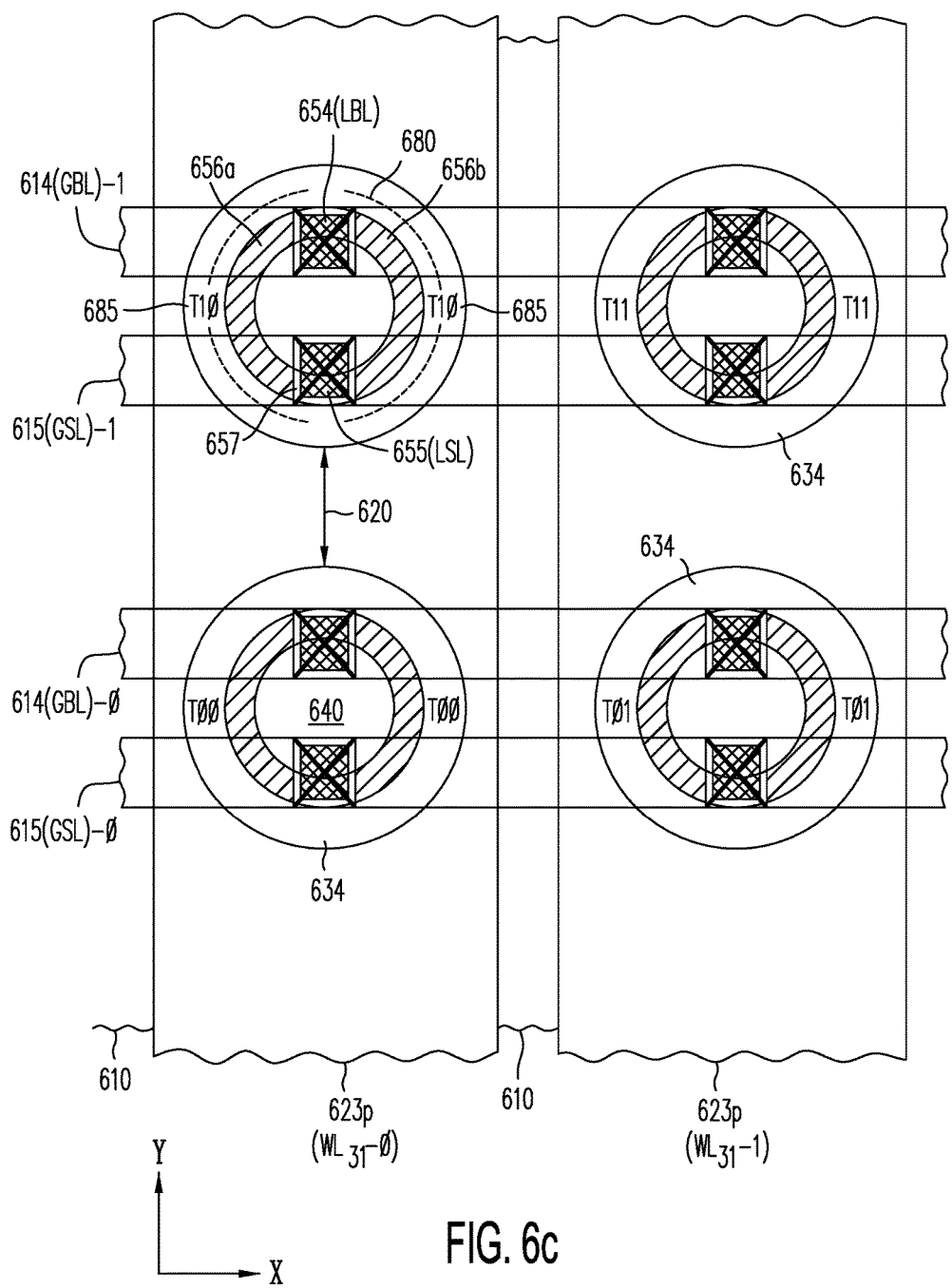
FIG. 6c is a cross section in the X-Y plane showing, in accordance with one embodiment of the current invention, dedicated word line stacks 623p, each having word lines each surrounding ("wrapping around") a TFT of a vertical NOR string, and local vertical pillar bit line 654 (extending along the Z-direction) and local vertical pillar source line 655 (extending along the Z-direction), which are accessed by global horizontal bit line 614 and global horizontal source line 615, respectively.
Figure 6D:
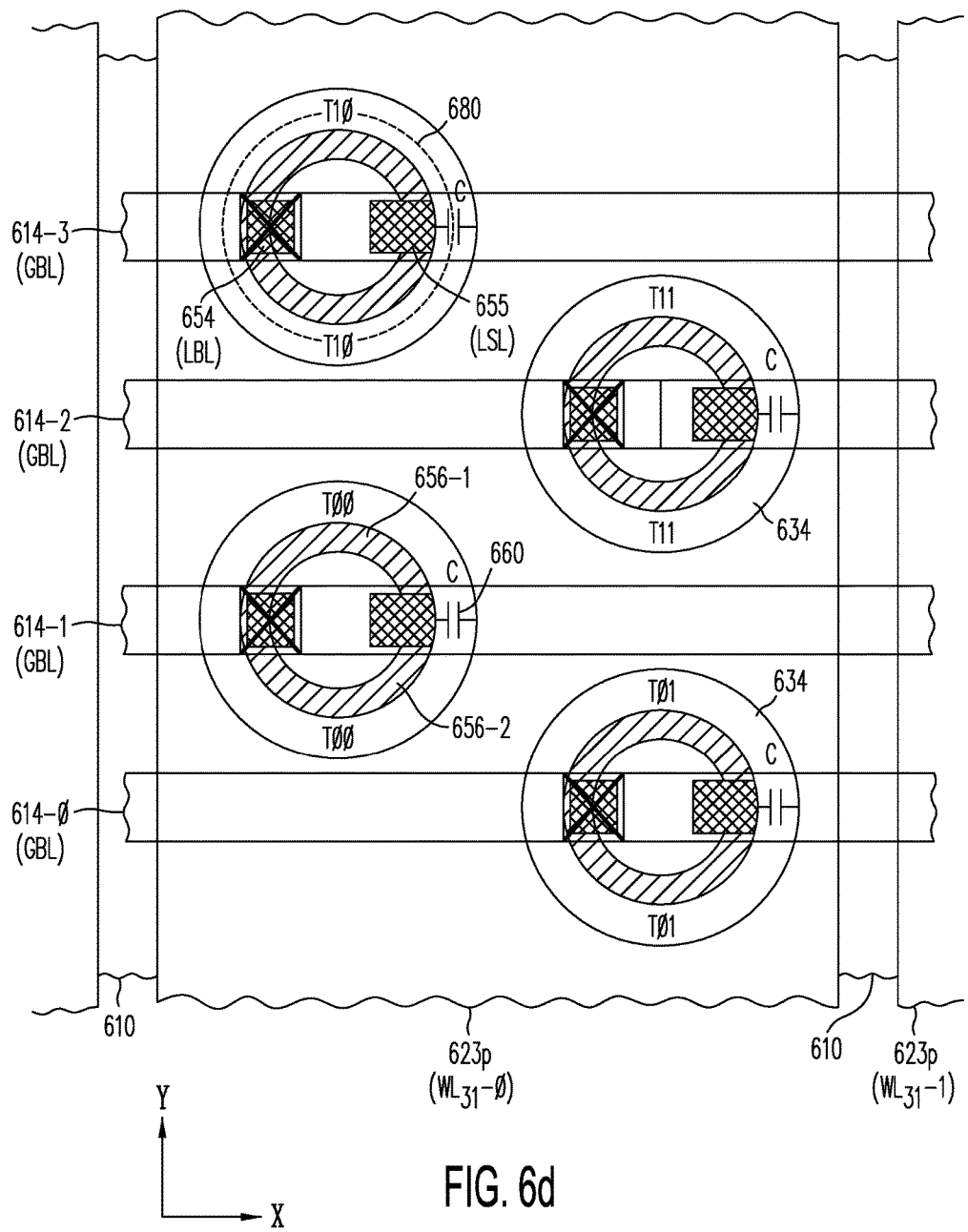
FIG. 6d is a cross section in the X-Y plan showing, according to the embodiment of the present invention, staggered close-packing of vertical NOR strings, similar to those shown in FIG. 6c, sharing word-line stacks 623p and with pre-charged parasitic capacitors 660 each providing a pre-charged virtual $V_{ss}$ supply voltage.

Two additional embodiments of the vertical NOR string of this invention are shown in FIG. 6c and FIG. 6d. In these embodiments, all word lines in each word-line stack wrap around the vertical active strip.

In FIG. 6c, a vertical NOR string is formed inside the voids that are formed by etching through a stack of metal word lines and the dielectric isolation layers between the word lines. The manufacturing process flow is similar to that of the prior art vertical NAND strings, except that the transistors in a vertical NOR string are provided parallel to each other, rather than serially in a vertical NAND string. Formation of transistors in a vertical NOR string is facilitated by the N+ doped vertical pillars extending to the entire depth of the void, providing shared local source line 655 (LSL) and shared local bit line (drain) 654 (LBL) for all the TFTs along the vertical NOR string, with undoped or lightly doped channel region 656 adjacent to both. Charge storage element 634 is positioned between channel 656 and word line stack 623p, thus forming a stack of 2, 4, 8, ... 32, 64 or more TFTs (e.g., device 685 ($T_{10}$)) along the vertical active strip. In the embodiment of FIG. 6c, the word line stacks run in the Y-direction, with individual horizontal strips 623p ($WL_{31-0}$), 623p ($WL_{31-1}$) being separated from each other by air gap or dielectric isolation 610. Global bit lines 614 (GBL) and global source lines 615 (GSL) run horizontally in rows along the X-direction, perpendicular to the word lines. Each global bit line 614 accesses local bit line pillars 654 (LBL) along the row of vertical strips through access select transistors (511 in FIG. 5a, not shown here) that can be positioned either below the memory array or above it. Similarly, each global source line 615 accesses the local source line pillars along the row. While the structures shown in FIGS. 6a and 6b are able to fit a pair of vertical NOR strings in roughly the same area taken up by a single vertical NOR string in the embodiment of FIG. 6c, each TFT in each vertical NOR string shown in FIG. 6c has two parallel conduction channels (i.e., channel regions 656a and 656b), and therefore may store more charge and increase or double the read current, thereby enabling storing more bits in each TFT.

Figure 1C:
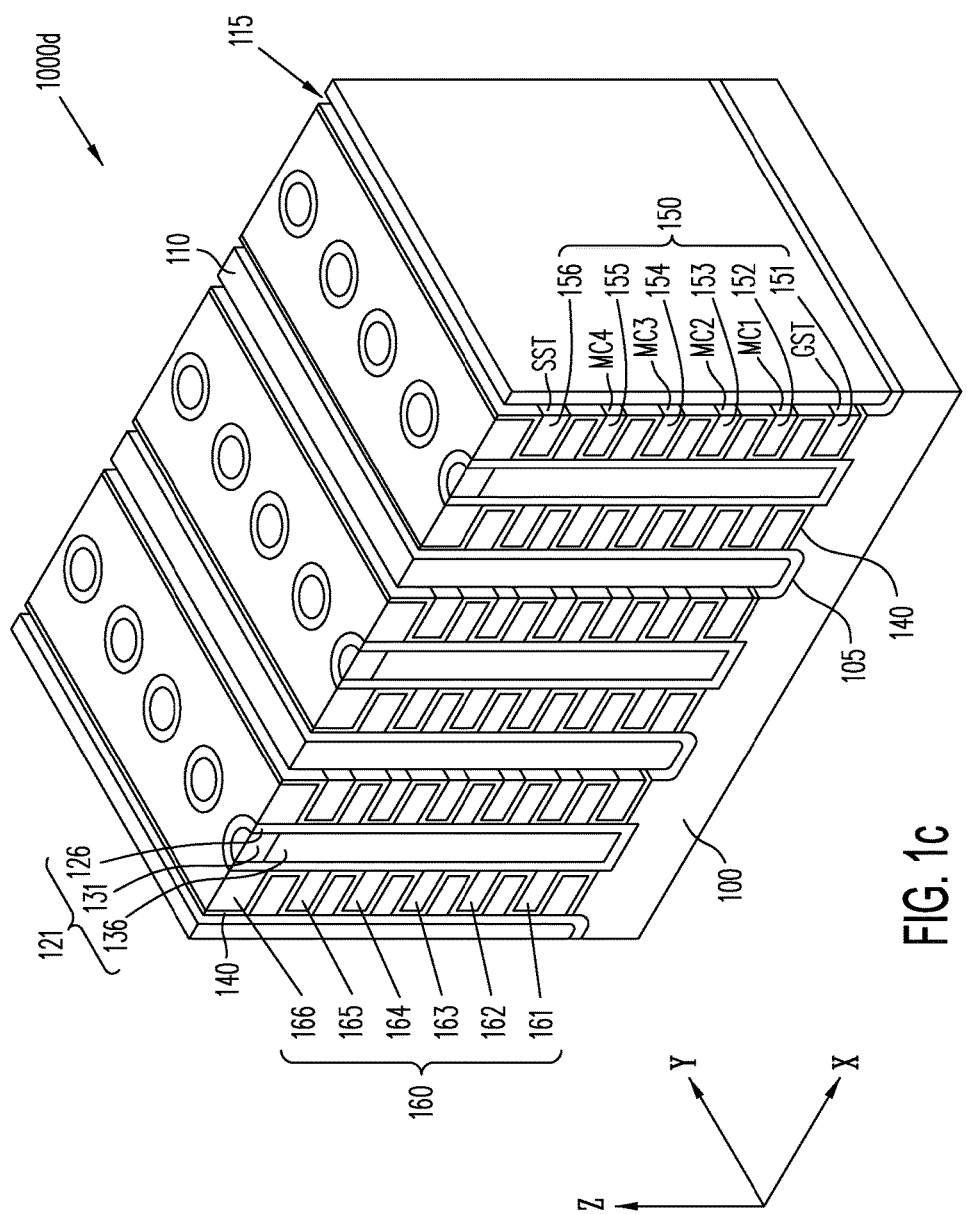
FIG. 1c shows a three-dimensional representation of a block of three-dimensional vertical NAND strings addressed by wrap-around stacked word lines 150.

FIG. 6d shows a more compact vertical NOR string with wrap-around word lines, according to one embodiment of the present invention. As shown in FIG. 6d, vertical NOR strings are staggered as to be closer together, so that word line stack 623p ($WL_{31-0}$) can be shared by more vertical NOR strings. The staggered configuration is enabled by using the parasitic capacitor (i.e., parasitic capacitors 660) of local source line pillar 655 (LSL). By pre-charging capacitors 660 to temporarily hold virtual voltage $V_{ss}$ during read and program operations, as described below, the need for hard-wired global source lines (e.g., GSL 615 in FIG. 6c) is obviated. Although the vertical NOR strings of FIGS. 6c and 6d may not by themselves offer significant areal efficiencies, as compared to prior art vertical NAND strings (e.g., the NAND strings of FIG. 1c), such vertical NOR strings achieve much greater string lengths than vertical NAND strings. For example, while vertical NOR strings of the present invention may well support strings of length 128 to 512 or more TFTs in each stack, such string lengths are simply not practical for a vertical NAND string, given the serious limitations attendant with series-connected TFT strings.

Alternative Embodiments with Long Global Bit Lines that are Partitioned into Short, Segmented Bit Lines to Facilitate Fast Access to Sense Amplifiers The inventor notes that, with sense amplifiers and other support circuits provided in the semiconductor substrate, routing global bit lines using global interconnect conductors provided above or below a memory array to connect to vertical local bit lines (e.g., global bit line GBL1 connecting to the vertical local bit line 554 of FIG. 5a) results in large RC delays because of the substantial length of the wiring involved. Furthermore, it is highly desirable to use the area of the silicon substrate underneath the memory arrays (as opposed to taking up precious silicon area beside the arrays) to form the numerous support circuitry, such as sense amplifiers, decoders, voltage sources and other circuits necessary for memory operations.

According to one embodiment of the present invention, a conductor that otherwise would be used as a global bit line may be segmented into a multiplicity of relatively short line segments (e.g., each line segment may have a length that is ¹⁄₁₀₀ or less of the global bit line). Each line segment provides a horizontal line connector for connecting a group of neighboring vertical local bit lines. The bit line segment may reside preferably between, and dielectrically isolated from, the substrate and the memory arrays. The bit line segment facilitates connections between the neighboring vertical local bit lines in the group and dedicated sense amplifiers and other support circuits formed in the semiconductor substrate underneath the array of vertical NOR strings. In this detailed description, the term "bit line segment" may refer to the collection of local bit lines connected by a line connector.

Similarly, a conductor that otherwise would be used as a global source line may also be segmented into a multiplicity of relatively short line segments each providing a horizontal line connector for connecting a group of neighboring local vertical source lines. The line connector and its associated local vertical source lines form a common source line whose parasitic capacitance is multiple times the parasitic capacitance of just one local vertical source line. The common source line connector may be connected by a segment-select transistor to a global source line, preferably at the top of the array. In this detailed description, the term "source line segment" may refer to the collection of local source lines connected by a line connector. Where the source line segment may be further divided into smaller groups of connected local source lines, each such smaller group may be referred to as a "source line sub-segment."

In another alternative embodiment of the present invention, global source lines running on top of, or below the memory stacks are not provided, but each source line segment and its associated group of neighboring local vertical source lines is operated as a local common source region. In that configuration, one or more of pre-charge transistors are provided in each active column connected to the source line segment to transfer a virtual ground voltage ($V_{ss}$) from the substrate. In a 64-layer vertical NOR memory array, each local source line may have a parasitic capacitance that is about 1 femtofarad (i.e., $1.0 \times 10^{-15}$ farads), which provides in some instances too small a charge to maintain a virtual ground voltage ($V_{ss}$) during a charge-sharing read operation. By combining the capacitances of a group of, say 64 local source lines, their combined pre-charged capacitance C is increased to approximately 64 femtofarads, which would be more than adequate for the charge-sharing read operation.

Figure 3D:
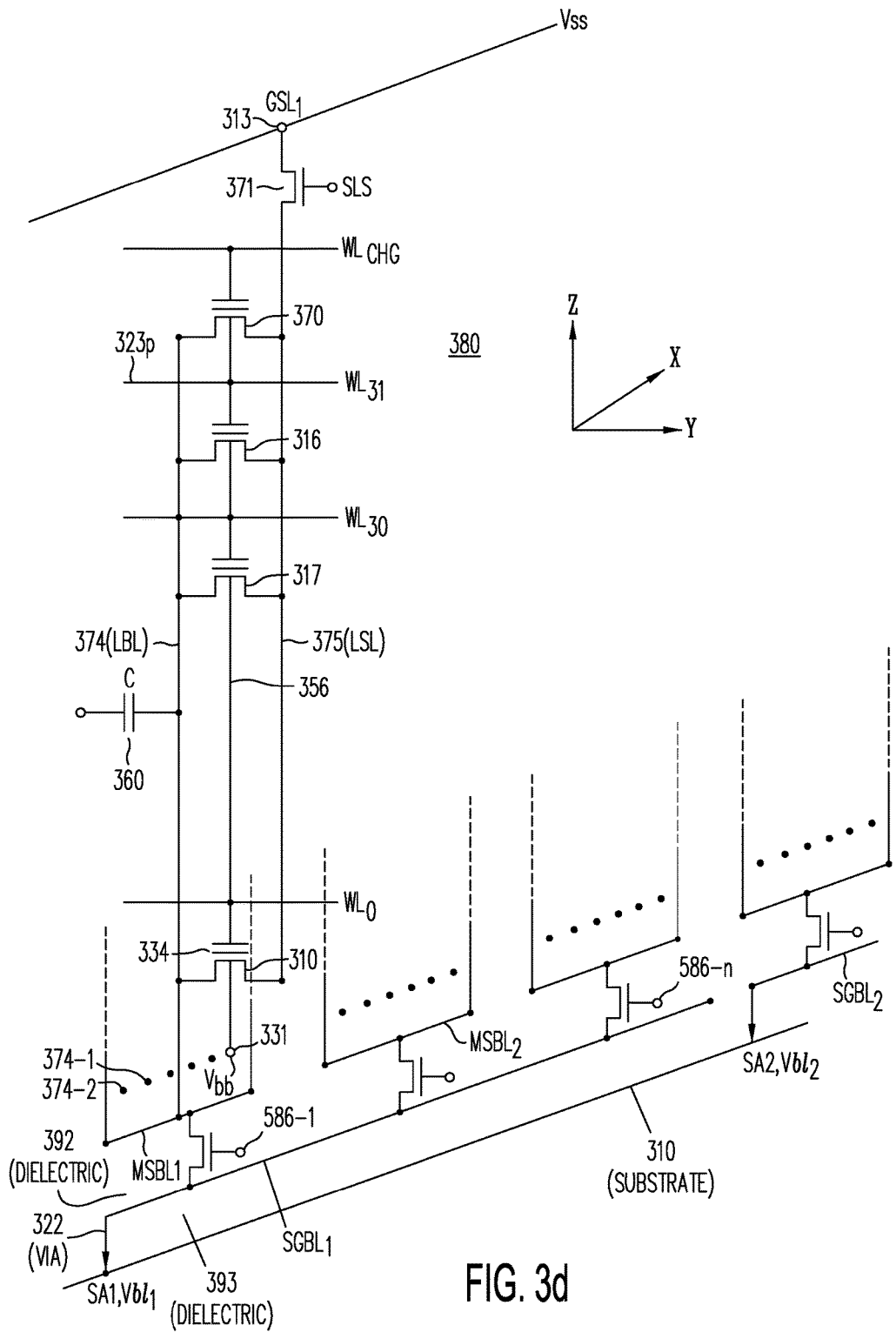
FIG. 3d shows a variation of the vertical NOR memory array circuit architecture in the embodiment of FIG. 3a, in which global bit line (GBL) 314 is replaced by bit line segments $MSBL_1$, $MSBL_2$, . . . , each connecting multiple neighboring local vertical bit lines 374-1, 374-2, . . . ; the segments are in turn connected through segment-select thin-film transistors 586-1, . . . , 586-n to regional bit line segments $SGBL_1$, $SGBL_2$, . . . that are each associated with multiple bit line segments, and that are isolated by dielectric 393 from the sense amplifiers and other circuitry in silicon substrate 310 below them.

FIGS. 3d, 3e, 3f and 3g show embodiments of the present invention that achieve fast read access and utilize the silicon substrate underneath the array to form support circuitry, such as sense amplifiers, decoders, registers, and voltage sources. As shown in FIG. 3d, vertical NOR string 380 represents a three-dimensional arrangement of non-volatile storage TFTs, with each TFT sharing local source line 375 and local bit line 374, according to one embodiment of the present invention. Local bit line 374 and local source line 375 are spaced apart by body region 356, which provides channel regions for the TFTs in vertical NOR string 380. Storage elements are formed at the intersections between channel region 356 and each horizontal word line 323p, where p is the index of the word line in the word line stack; in this example, p may take any value between 0 and 31. The word lines extend along the Y-direction. In this embodiment, source line supply voltage Vss is provided to local vertical source line 375 through source select transistor (SLS) 371 from substrate 310 through global source line ($GSL_1$) 313 shown running on top of the vertical column. Note that body region 356, providing the transistor channels of the active column, may be connected at terminal 331 to substrate bias voltage $V_{bb}$. However, electrically connecting the P– doped channel 556 can also be achieved from the top of the vertical NOR string (see below the discussion relating to FIG. 5b).

In FIG. 3d, neighboring active columns (e.g., the active column of vertical NOR string 380) are grouped, with the local bit lines of each group of active columns being connected to an associated bit line segment (e.g., bit line segments $MSBL_1$ and $MSBL_2$) provided beneath the memory array. Bit line segment $MSBL_1$ provides a low-resistivity connector 373, which may be implemented by, for example, a narrow strip of N+ doped polysilicon, a silicide or a refractory metal. The group of neighboring local vertical bit lines 374-1, 374-2, . . . 374-n connected by horizontal bit line segment $MSBL_1$ may be provided lengthwise along the X-direction, orthogonally to word lines $WL_0$ to $WL_{31}$. Bit line segments $MSBL_1$, $MSBL_2$, . . . are formed on dielectric insulator 392 and may be relatively short, such as encompassing from 1 (i.e., no segmentation) to 16, 64, 256, 512 or more vertical local bit lines. Each bit line segment can be connected through a segment-select transistor (e.g., segment-select transistors 586-1, . . . , 586-n, which may be implemented as thin-film transistors) to longer horizontal conductors forming regional bit line segments $SGBL_1$, $SGBL_2$ that include multiple $MSBL_1$-type bit line segments. Horizontal regional bit line segment $SGBL_1$ may be formed on an insulating layer 393 above substrate 310, to allow logic elements such as sense amplifiers to be formed in the substrate immediately underneath the regional bit line segment. Preferably the regional segment is sufficiently long to allow sense amplifiers, decoders, registers, voltage sources and other circuitry formed in the substrate to physically fit underneath the regional bit line segment.

Figure 6E:
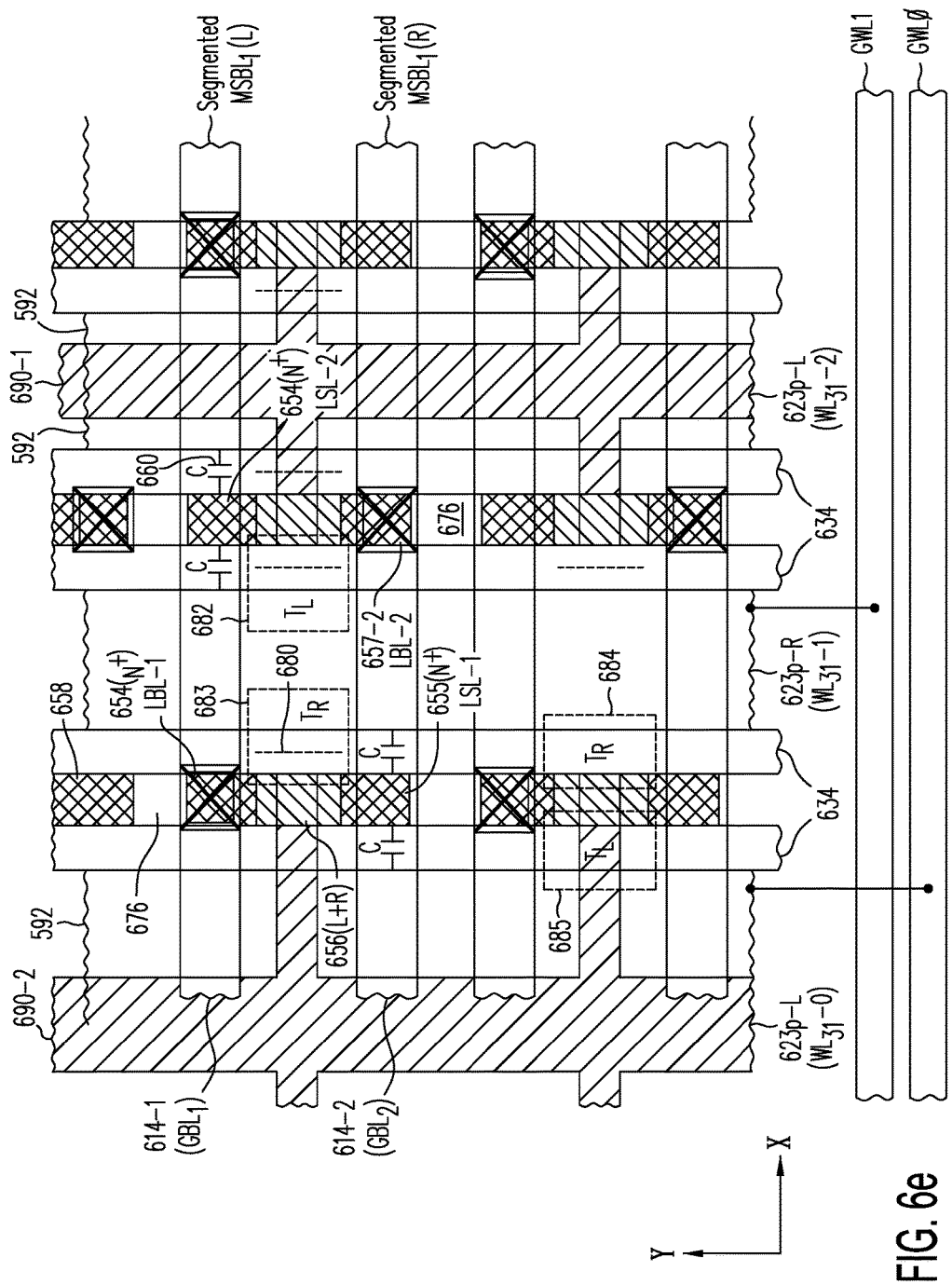
FIG. 6e shows in the X-Y plane providing body bias voltage $V_{bb}$ (e.g., through conductors 690-1 and 690-2) that is shared between body regions 656 (L+R) in adjacent rows of active columns, using the layout of the embodiment shown in FIG. 6b.

In a double-density configuration, such as shown in FIG. 6e, each word line services both active columns on both sides of the word line. In that configuration, two adjacent local bit lines on opposite sides of the word line are associated respectively with bit line segments $MSBL_1(L)$ and $MSBL_1(R)$ and their respective segment sense amplifiers and decoders, which are closely spaced apart from and run parallel to each other. This spacing is also the spacing along the Y-direction between adjacent vertical active columns in the memory array. It may not be possible to provide a dedicated sense amplifier and other supporting circuits for each of the bit line segments laid out along the Y-direction. In such an arrangement, each sense amplifier may serve 1, 2, 4, 8 or more adjacent bit line segments through a segment-select decoder in the substrate. In the X-direction, a 1-terabit 3-dimensional vertical NOR flash memory chip may have hundreds of regional bit line segments, rather than a long global bit line, thereby significantly reducing the bit-line RC delay.

Figure 3E:
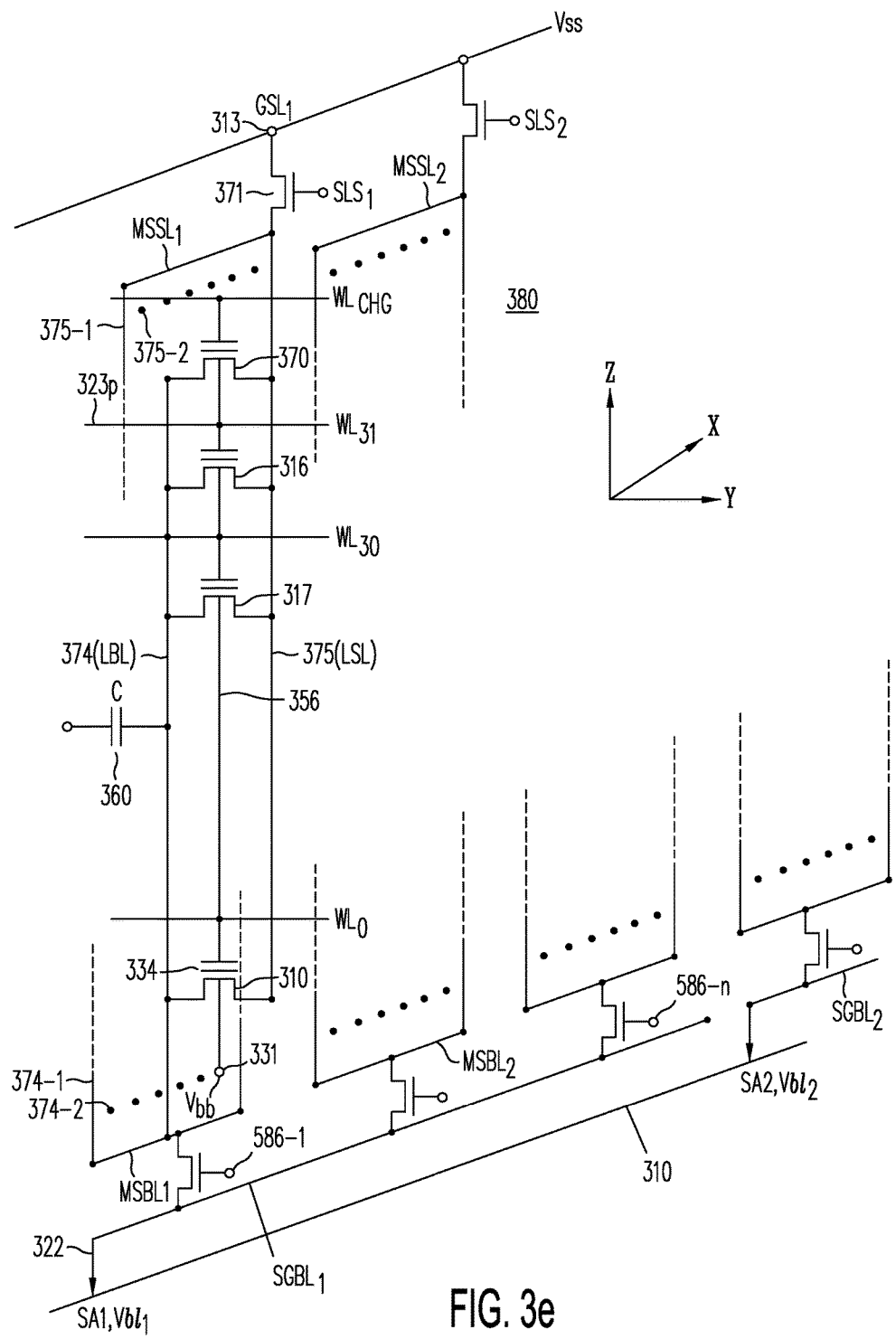
FIG. 3e shows a variation in the circuit architecture in the embodiment of FIG. 3d, in which global source-select line 313 accesses, through source-select transistor $SLS_1$, a group of neighboring vertical local source lines 375-1, 375-2, . . . that are associated with source line segment $MSSL_1$.

FIG. 3e shows a variation of the circuit architecture in the embodiment of FIG. 3d, in which groups of neighboring vertical local source lines 375-1, 375-2, . . . are connected by source line segments $MSSL_1$, $MSSL_2$, . . . running along the same X-direction as the bit-line segments. This grouping of local source lines connected by source line segments reduces the number of source line select transistors $SLS_1$, $SLS2$, . . . needed to provide source voltage $V_{ss}$ to each of the vertical NOR strings associated with the source line segment. Furthermore, as previously noted, connecting a group of vertical local source lines by a source line segment contributes directly to increasing the cumulative parasitic capacitance (C). The vertical local source lines connected by a horizontal source line segment are also closely associated with the vertical local bit lines connected by the corresponding horizontal bit line segment. However, the number of vertical local bit-lines associated with a bit line segment need not be the same as the number of vertical local source lines associated with a source line segment. As a result, a bit line segment may be associated, for example, with multiple source line segments. For example, bit line segment $MSBL_1$ may be associated with 256 local vertical bit lines 374-1, 374-2, . . . , which may be associated with eight source line segments, each of which may only be associated with 32 local source lines 375-1, 375-2, . . . . Each source line segment can have its voltage $V_{ss}$ separately imparted to it through its dedicated source-line select transistor (e.g., source-line select transistor $SLS_1$).

Figure 3F:
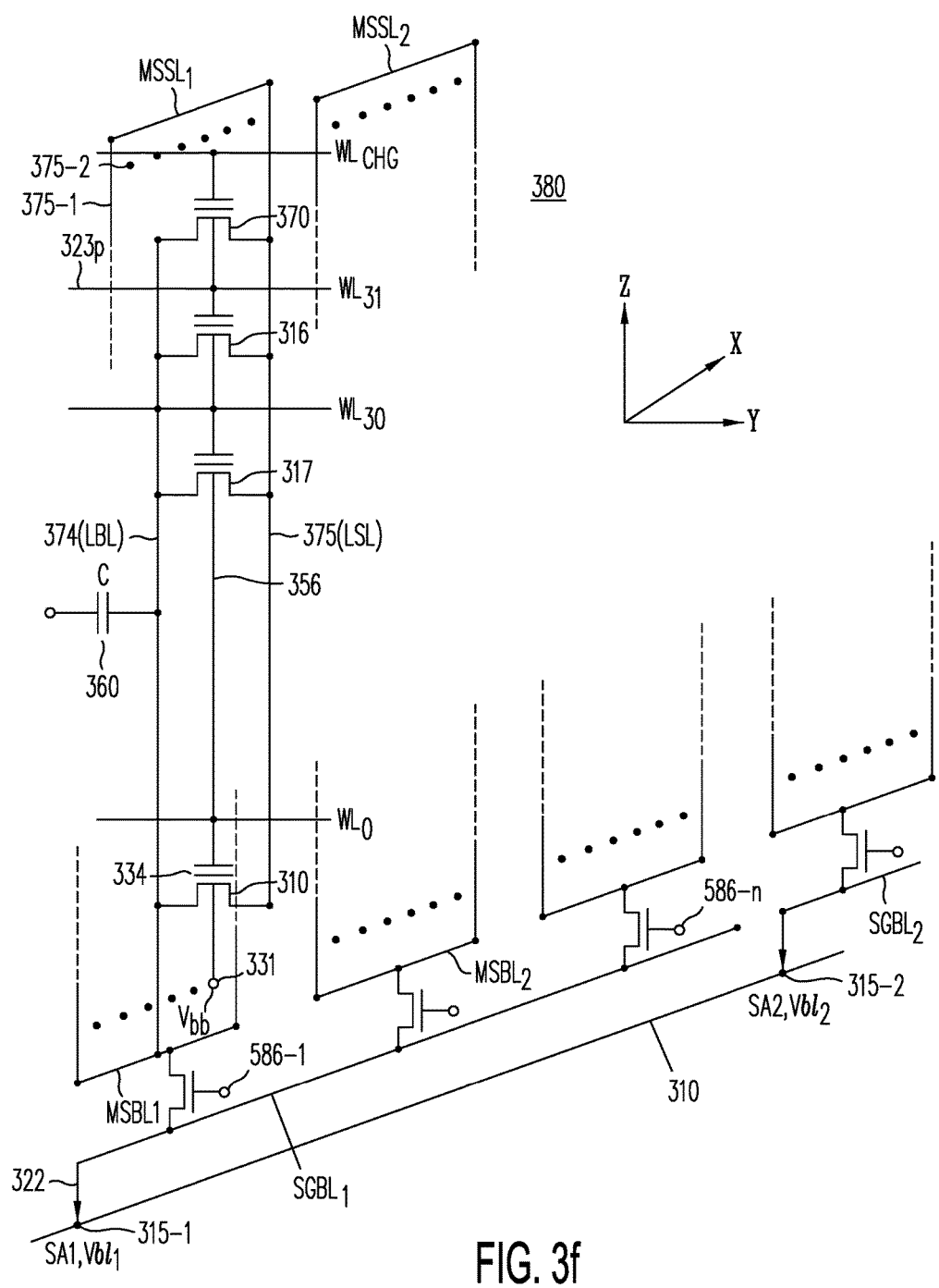
FIG. 3f shows a variation in circuit architecture in the embodiment of FIG. 3e, in which global source line 313 is eliminated and replaced by local source line segment $MSSL_1$ connecting vertical local source lines 375-1, 375-2, . . . , which are charged and held at virtual ground voltage Vss through pre-charge transistors (e.g., pre-charge transistor 370).

FIG. 3f shows a variation of the circuit architecture of the embodiment in FIG. 3e, in which neither global source line (e.g., global source line 313) nor source line-select transistor (e.g., source-select transistor $SLS_1$) is provided. In FIG. 3f, the local vertical source lines associated with each source line segment are pre-charged to source voltage $V_{ss}$ through a pre-charge transistor (e.g., pre-charge transistor 370) whose word line $W_{CHG}$ is turned on with a voltage pulse sufficient to transfer voltage $V_{bl}$ supplied from the circuitry in substrate 310 through the associated local vertical bit lines associated with the source line segment. The number of local vertical bit lines associated with the source line segment is an optimization between maximizing the parasitic capacitance (C) of the source line segment to hold the virtual ground voltage $V_{ss}$ during a read of the cell, balanced by the need to keep the background leakage current attendant to all the "off" transistors in the vertical NOR strings associated with the source line segment sufficiently low, so as not to interfere with reading the accessed storage transistor within the source line segment. Within a bit line segment, any unselected source line sub-segment can be pre-charges to have its $V_{ss}$ voltage equalized with its associated bit line segment voltage $V_{bl}$ to eliminate its background leakage current.

Figure 3G:
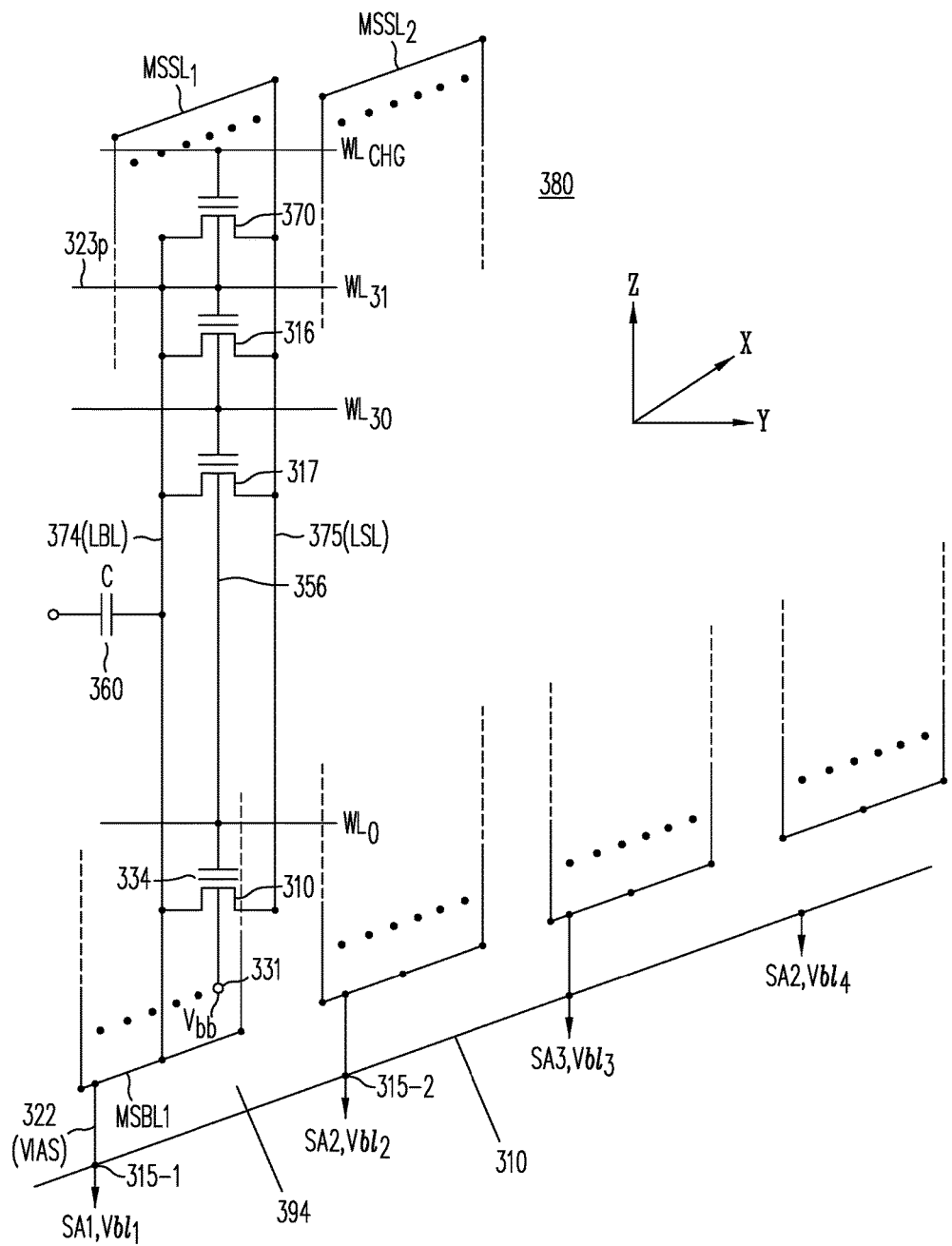
FIG. 3g shows a variation in circuit architecture in the embodiment of FIG. 3f, in which regional bit line segments $SGBL_1$, $SGBL_2$, . . . , are merged with bit line segments $MSBL_1$, $MSBL_2$, . . . , and are connected through vias 322 to segment-select transistors 315-1, 315-2 . . . , which are located in the substrate (thereby replacing segment-select thin-film transistors 586-1, 586-2, . . . , of FIG. 3d.

FIG. 3g is a variation of the circuit architecture in the embodiment of FIG. 3e. In FIG. 3g, the connectivity between the memory array and the substrate is further simplified by merging regional bit line segments $SGBL_1$, $SGBL_2$, . . . with their respective local bit line segments $MSBL_1$, $MSBL_2$, . . . , and having each bit line segment connecting through respective vias or conductors (e.g., buried contacts) to segment-select transistors 315-1, 315-2, . . . in the substrate underneath the bit line segments. In this configuration, rather than providing thin-film segment-select transistors above the silicon substrate (e.g., segment-select transistors 586-1, . . . , 586-n of FIG. 3f), the segment-select transistors are provided by high-efficiency transistors in single-crystal substrate 310. This configuration provides robust access to the sense amplifiers, decoders, registers, voltage sources and other circuitry associated with the bit line segment. By eliminating global source line select transistors $SLS_1$, $SLS_2$, . . . , made possible by the pre-charge path, and by eliminating segment-select thin-film transistors 586-1, . . . , 586-n (or select transistors built with costly selective epitaxy silicon, as is commonly done in conventional 3D NAND arrays), made possible by having each bit line segment positioned close to its segment circuitry in the substrate, materially simplifies the process integration flow.

Figure 3H:
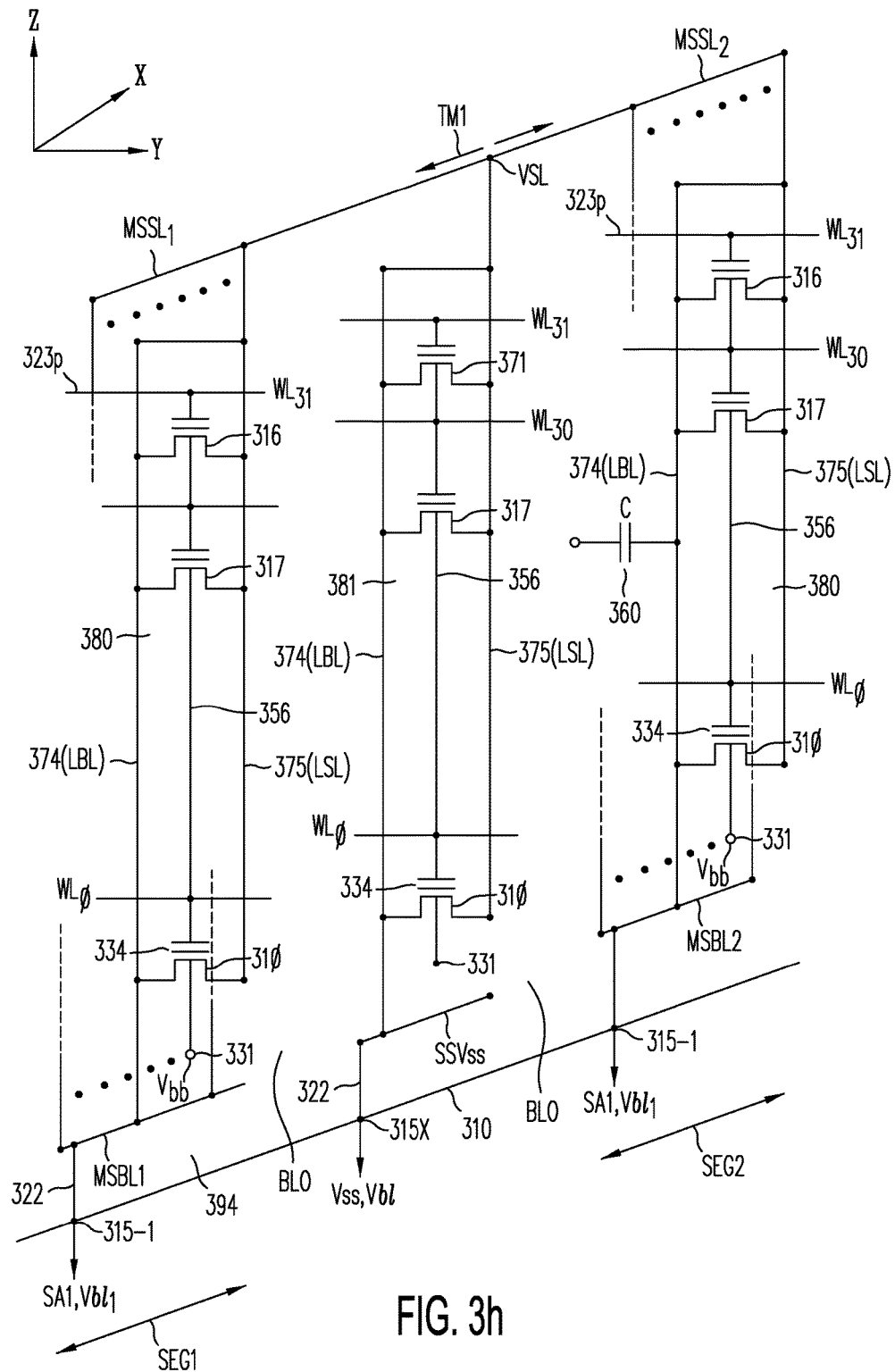
FIG. 3h shows a circuit architecture of the embodiment in FIG. 3g, in which two neighboring bit line segments $MSBL_1$, $MSBL_2$ have their local source line segments $MSSL_1$, $MSSL_2$ connected from substrate 310 through dedicated active vertical column 381 formed in the space labeled BL0 between the two bit line segments.
Figure 3I:
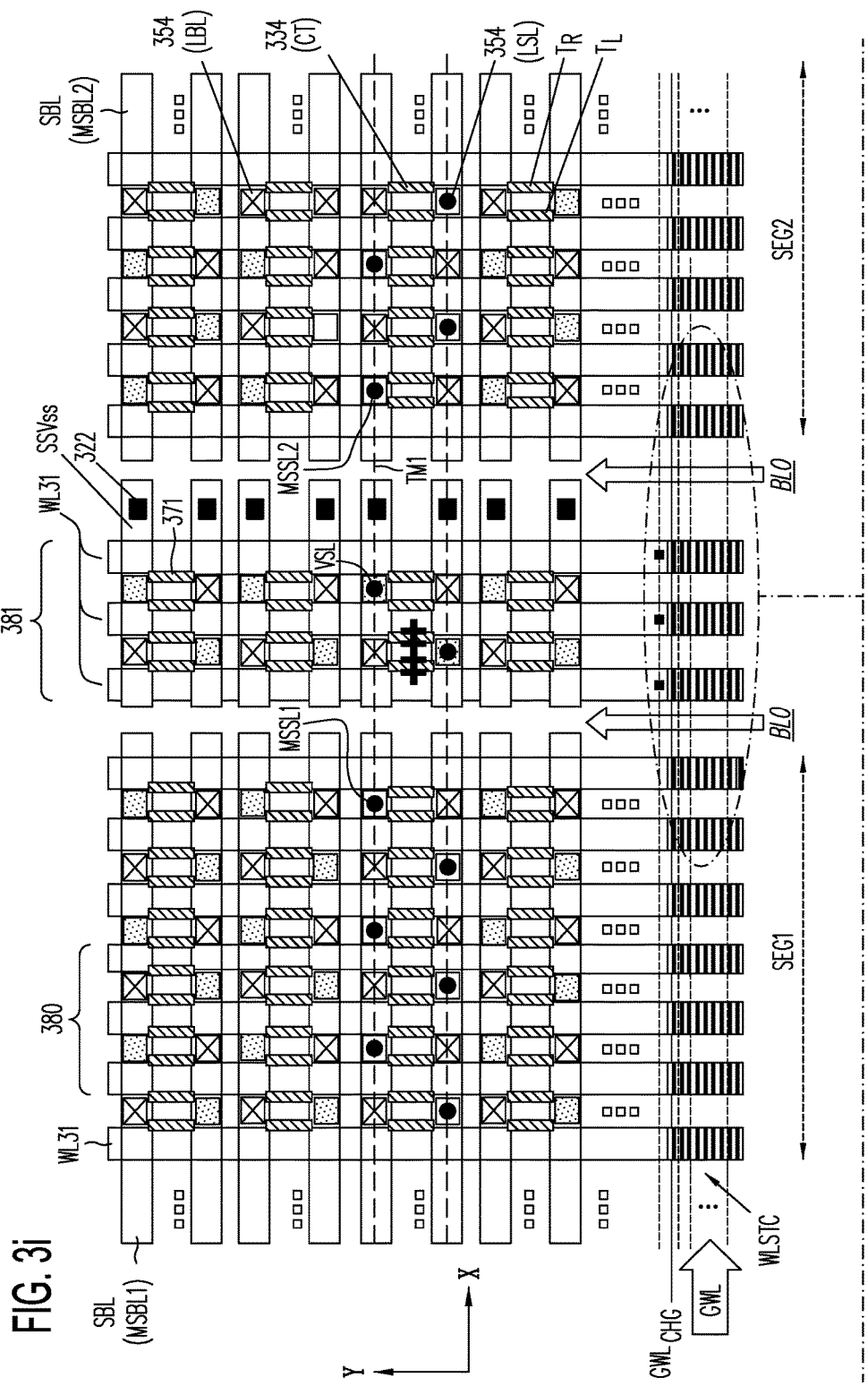
FIGS. 3i and 3i-1 (the the key to 3i and 3i-1) is show a top X-Y plane view of the embodiment of FIG. 3h, in which each vertical local source line in source segment $MSSL_1$ is held at voltage Vss or Vbl supplied through column 381.

FIGS. 3h and 3i show another embodiment similar to the embodiment of FIG. 3g. In FIGS. 3h and 3i, the voltage on source line segment connectors $MSSL_1$ and $MSSL_2$, and hence also the voltage on local vertical source lines 375 (LSL) within each source line segment, is supplied from substrate 310 through an active column 381 ("charging column") that mimics in construction any of the storage active columns (e.g., active column 380) of the memory array but is however not used for memory storage. In other words, charging column 381 is dedicated to charging the local source lines in source line segments $MSSL_1$ and $MSSL_2$. (In other embodiments, each charging column may supply only a single source line segment.) As shown in FIG. 3h, charging column 381 may be formed, for example, in the opening BLO between neighboring bit line segments $SEG_1$ and $SEG_2$. Throughout a read operation (and optionally, any programming, program-inhibit, or erase operation), charging column 381 delivers and holds a required voltage on the vertical local source lines in source line segments $MSSL_1$ and $MSSL_2$. (Source line segments $MSSL_1$ and $MSSL_2$ are both served by charging column 381.) In this regard, charging column 381 obviates the need for global source line GSL1 313 of FIG. 3e, for example, and eliminates the need for the associated source line segment-select transistor $SLS_1$. It also eliminates, for example, the need for pre-charge transistors 370—which requires extra word line plane $WL_{chg}$—in the memory stack, such as shown for the embodiment of FIG. 3g.

In the segmentation structure of FIGS. 3h and 3i, in a read operation of any storage transistor on any of the memory planes, the source voltage on each local source line of source line segments $MSSL_1$ and $MSSL_2$ are imposed at $V_{ss}$ (e.g., 0 volts) through connection VSL from vertical source line 375(LSL) of charging column 381. Voltage $V_{ss}$ is delivered from substrate 310 through a decoded select transistor (shown in FIG. 3h as 315X) in silicon substrate 310, bit-line mini-segment SSVss, vertical local bit line 374(LBL), pass transistor 371 and vertical local source line 375(LSL). (Pass transistor 371 is activated and held in the conducting or "on" state by word line $WL_{31}$ throughout the read operation.) Source voltage to be imposed on source line segments $MSSL_1$ and $MSSL_2$ during any programming, program-inhibit or erase operation may be similarly provided. Select transistor 315X in silicon substrate 310 may be a high voltage transistor that is able to withstand a high voltage imposed on local bit line 374 (LBL) during an erase operation.

FIG. 3i shows in greater detail a top X-Y plane view of the embodiment of FIG. 3h, in which each vertical local source line in source segment $MSSL_1$ is held at voltage $V_{ss}$ or $V_{bl}$ supplied through column 381. In FIG. 3i, the memory array has a layout similar to that shown in the embodiment of FIG. 6b. As shown in FIG. 3i, between bit line segments $SEG_1$ and $SEG_2$ is provided an array of charging columns, with each row extending along the X-direction having two charging columns and a predetermined number (e.g. 2048) of such rows laid out in along the Y-direction. This array of charging columns is provided between the two discontinuities or openings in the bit lines (labeled in FIG. 3i as "BLO".) In one row of the active columns, between the two dash lines, a source line connector extending along the X-direction connects the right charging column to the local source lines in source line segment $MSSL_1$ (i.e., every other active column along the upper dash line) in bit line segment $SEG_1$. The same right charging column is connected to the local source lines of the active columns of source line segment $MSSL_2$ in bit line segment $SEG_2$. The source voltage is provided from the silicon substrate to a bit line connector to the local bit line of the right active column. The word lines labeled "$WL_{31}$" activate a pass transistor in the charging column to transfer the source voltage to the local source line labeled VSL, which provides the source voltage to the local source lines of source line segments MSSL$_1$ and MSSL$_2$. (This circuit configuration is shown in the circuit of FIG. 3h.) The left charging column in this row of charging columns between the dash lines is connected to another pair of source line segments along the lower dash line in similar manner.

Figure 6F:
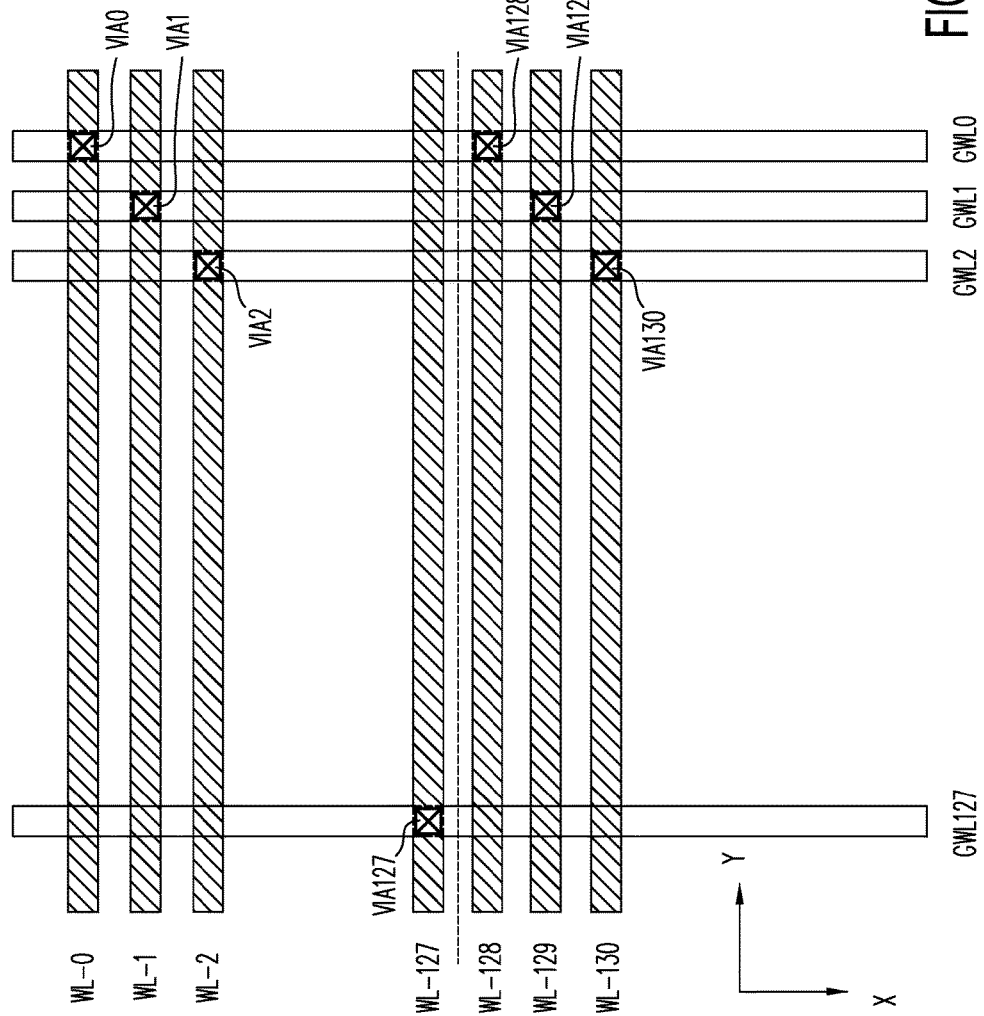
FIG. 6f illustrates one implementation of global word lines for connecting the local word lines on one plane (i.e., at one stair-case step) in conjunction with the bit line segmentation scheme of the present invention.
Figure 6G:
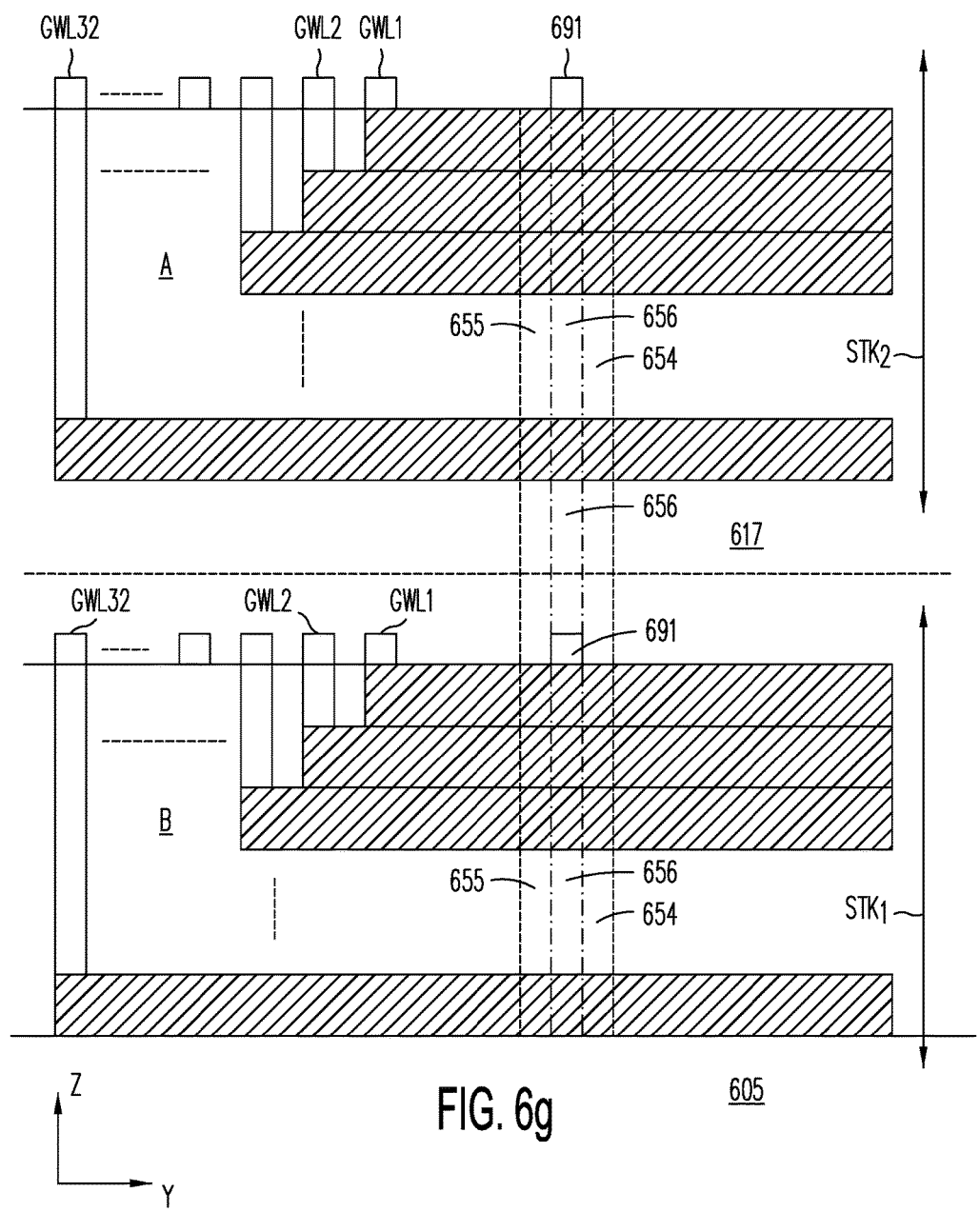
FIG. 6g illustrates one implementation of a vertical NOR string memory array that avoids doubling of the silicon area taken up by word line stair-case steps when the number of layers of storage transistors are doubled in the vertical direction, according to one embodiment of the present invention.

In a 3-dimensional vertical NOR string memory array having multiple word-line planes, the local word lines for all planes in a stack may be arranged in staircase steps WL$_{STC}$ at the edge of the array (see, e.g., FIG. 3i and FIG. 6g). One or more dedicated global word lines (labeled, for example, "GWL$_{chg}$" in FIG. 3i) may be required for each memory plane to activate a charging column (e.g., charging column 381) for each pair of neighboring bit line segments (e.g., bit line segments SEG$_1$ and SEG$_2$ in FIG. 3h). As shown in the example of FIG. 3i (see the insert), the global word lines labeled GWL$_{chg}$ are all connected to local word line WL$_{31}$ corresponding to active column 381 and skip over all other word lines in bit line segments SEG$_1$ and SEG$_2$. In contrast, each global word line for the storage transistors of the memory array (e.g., GWL) is hard wire-connected to the numerous local word lines associated with bit line segments SEG$_1$ and SEG$_2$, while skipping over the word lines of charging column 381. The global word lines of charging column 381 (all labeled "GWL$_{chg}$" in the insert of FIG. 3i) on different memory planes can be shorted together at the periphery circuitry (not shown), thereby activating any (or all) of the pass transistors of charging column 381 associated with word lines WL$_0$-WL$_{31}$. In one embodiment, the pass transistors of all charging columns in a block of connected source line segments may be activated together when the chip is powered up; however, any source line segment or source line segment pair within the block can be unselected by having its corresponding charging column isolated from the silicon substrate by switching off its associated segment-select transistor (e.g., segment-select transistor 315X).

The embodiment of FIGS. 3h and 3i eliminates the need for a pre-charge sequence of the floating source, such as performed in the embodiment of FIG. 3g. Eliminating the pre-charge sequence speeds up a read operation because the source voltage can be set and then held steady at voltage V$_{ss}$ before the start of the read operation, thus eliminating the overhead time required for the floating source pre-charge pulse. Furthermore, as charging column 381 holds the local source lines of source line segment MSSL$_1$ at voltage Vss throughout the read operation (i.e. not just a momentary pre-charge pulse), the steady current provided through connection VSL compensates for any source-drain leakage which, if excessive, could compromise the read sensing of the addressed storage transistor.

To summarize, charging column 381 serves as a local vertical connector for transferring voltages V$_{ss}$ or V$_{bl}$ from the silicon substrate to the local source lines in the vertical NOR memory strings. Any voltage V$_{ss}$ or V$_{bl}$ on the vertical local source line of a charging column can be transferred to its associated local bit line through a pass transistor (e.g., pass transistor 371), although the local bit line may also be directly charged from bit line connector MSBL1, which may be connected to voltage sources in the silicon substrate through segment-select decoders 315-1.

In a three-dimensional vertical NOR memory stack with 64 or 128 memory planes, the height of the stack, which is also the length of charging column 381, can exceed 5 microns, which is a rather long distance for vertical local source line 375(LSL) or local bit line 374 (LBL) of charging column 381 (FIG. 3h). The electrical resistance (R; in ohms) of the corresponding N+ doped polysilicon pillars 455 and 454 (see, FIG. 4a; also shown as 655(N+) LSL-1 and 654 (N+) LBL-1 in FIG. 6e and sometimes referred to as pylons) may become excessive, introducing an RC delay that adversely impacts the read path primarily. The pillar's resistance R can be reduced by an order of magnitude or more by providing a low-resistivity metallic material in the core of the pillar. For example, in the detailed description below, FIG. 4a-1 shows metallic core 420 (M) and FIG. 7d-1 shows metallic core 720 (M).

Figure 5B:
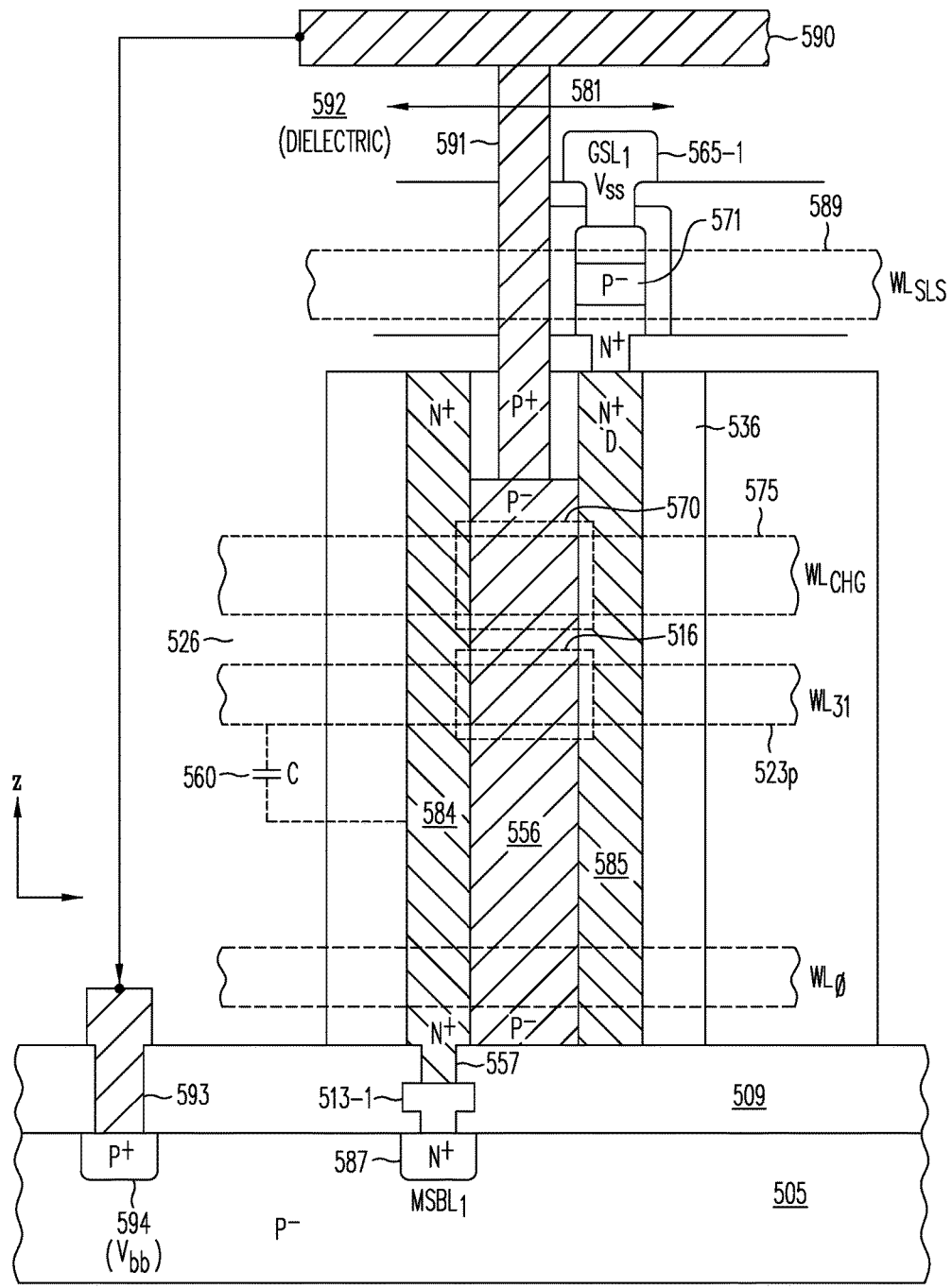
FIG. 5b is a cross section in the Z-Y plane showing, according to one embodiment of the present invention, connection of body region 556 (providing the P⁻ channel material) to conductive pillar 591, which is formed in dielectric layer 592 out of P⁺ polysilicon, for example, to conductor 590 provided above active column 581 and running parallel to the word lines; conductor 590 receives body bias voltage $V_{bb}$ from voltage source 594 in substrate 505 through via 593 in an opening through dielectric isolation 509.

FIG. 5b is a cross section in the Z-Y plane showing, according to one embodiment of the present invention, connection of body region 556 (providing the P$^-$ channel material) by conductive pillar 591, which is formed in dielectric layer 592 out of P$^+$ polysilicon, for example, to a conductor 590 provided above active column 581 and running in one configuration parallel to the word lines. Conductor 590 may also be formed out of heavily doped polysilicon, or a silicide or metallic conductor. In this arrangement, body bias voltage (V$_{bb}$) 594 can be provided to conductor 590 from substrate 505 through via 593 in an opening in dielectric isolation 509, to facilitate block erase operations.

FIG. 6e illustrates providing the body bias voltage through conductors 690-1 and 690-2("body bias conductors"). The body bias voltage is shared between body regions in adjacent rows of active columns, using the layout of the embodiment shown in FIG. 6b. In this configuration, word line 592 (i.e., word line 623p-L) runs coincidentally with body bias conductor 690-1. The block size of an erase operation is limited to the active columns on the left and the active columns on the right of each body bias conductor (e.g., conductor 690-1). Larger erase blocks can be configured for example by having a cluster of body bias conductors tied together to match the number of word lines addressing a bit line segment. A decoder in the substrate provides the appropriate body bias voltage (e.g., the erase voltage) to one or more selected erase blocks.

Referring back to FIG. 5b, after the active columns (e.g., active column 581) are formed, dielectric layer 592 is formed over the active columns. Thereafter, via holes are anisotropically etched from the top of dielectric layer 592 to the top of body region 556. A layer of P$^+$-doped polysilicon is then deposited over dielectric layer 592, filling the via holes to form conductive pillars (e.g., conductive pillars 591). This layer of P$^+$-doped polysilicon is then patterned and etched to form conductors (e.g., conductor 590) to connect through vias 593 to voltage source 594, which provides body bias voltage V$_{bb}$. Body bias voltage V$_{bb}$ can be a positive high voltage applied during erase or a low negative substrate bias voltage applied during read to raise the TFT threshold voltage or reduce its sub-threshold leakage. FIG. 6e is a top view showing P$^+$-doped polysilicon features 690-1 and 690-2 formed.

In the embodiment shown in FIG. 5b, conductor 590 is provided above body region 556. In other embodiments, however, conductor 590 may be provided underneath body region 556 to contact body region 556 from below. In fact, it may be advantageous to provide a body bias voltage from both above body region 556 and from below. In case of providing a body bias voltage from below, a conductor similar to conductor 590 may be provided or directly from the substrate through a via in the interlayer dielectric, similar to that shown in FIG. 5a.

Modes of Operation of Segmented Local Bit Line and Segmented Local Source Line Arrays.

In a memory stack of say 64 planes of word lines with bit line segments, such as described above with respect to the embodiments of the current invention, when reading a storage transistor on any plane (e.g., plane 25) associated with a selected bit line segment, all word lines at all planes that are associated with the selected bit line segment are held at their "off" threshold voltage, except for the word line on the selected plane that is addressing the selected storage transistor. When the word line voltage is brought up, a storage transistor that is in the erased state (i.e. conducting or "on" state) will discharge its bit line voltage ($V_{bl}$) to its local source line (and its associated source line segment, if applicable), which has previously been pre-charged to virtual ground potential ($V_{ss}$). The rate of discharge of bit line voltage $V_{bl}$ is sensed by the sense amplifier for the bit line segment. Other storage transistors on the selected plane (i.e., $25^{th}$ plane, in this example) that are associated with other bit line segments along the Y-direction sharing the same word line, or other storage transistors associated with other bit line segments along the X-direction that are addressed by different word lines, can be read concurrently, since each bit line segment has its dedicated sense amplifier. For a read operation, the virtual source voltage is first pre-charged by setting the local bit line to 0V during the pre-charge operation. (Alternatively, the virtual source voltage can be elevated to ~1V.) After the pre-charge, the local bit line is charged to the sense amplifier voltage (e.g., at ~0.1V to 0.5V higher than the source voltage), the substrate is set to voltage $V_{bb}$ (e.g., ~0V to ~–2V) and word line WL is raised to ~1V-3V above the erase threshold voltage.

For embodiments in which the storage transistors on both sides of each word line (e.g., embodiments of FIGS. 6a and 6e), care must be taken to ensure that only one of the two storage transistors is conducting at any time during a read operation. This is achieved, as discussed above, by providing separate bit line segments running parallel to each other, but each being served by their own sense amplifiers, decoders, voltage sources and other support circuitry. As shown in FIG. 6e, the bit line segments are $MSBL_1(L)$ for the left-side storage transistors and $MSBL_1(R)$ for the right-side storage transistor.

To program a storage transistor, all word lines on all planes except the selected plane (i.e., $25^{th}$ plane, in this example) are set at ground potential, while the word line addressing the selected storage transistor (i.e., on the $25^{th}$ plane) is raised to a suitable programming voltage using, for example, incremental voltage steps (e.g., starting at ~8 volts and applying voltage pulses of increasing magnitude in incremental steps) until the desired programmed voltage is verified by a read operation to have been reached. During the programming operation, the voltage on the bit line segment is held at ground potential, as is the associated source line segment.

To inhibit further programming while continuing to program storage transistors on the selected plane that are associated with other bit line segments sharing the same word line, the bit line segment and the source line segment are raised to a program-inhibit voltage (e.g., around one third to one half of the programming voltage), until the end of the programming sequence, with read verify cycles in-between successive programming pulses. All program and program inhibit voltages to the local bit lines and the local source lines within a bit line or source line segment are provided solely through the bit line segment (through pre-charge operation for the source line). As with the read operation, storage transistors associated with other bit line segments along the Y-direction (i.e., sharing the same word line as the selected storage transistor), and storage transistors associated with other bit line segments along the X-direction (i.e., associated with different word lines), can be programmed or program-inhibited concurrently.

An erase operation may be accomplished by holding all word lines for storage transistors associated with the bit line segments, the source line segments, or blocks to be erased at 0V, while raising the body bias voltage ($V_{bb}$) to ~12V for virgin storage transistors (i.e., storage transistors that have never been programmed or erased), and up to 20V or higher for high cycle-count storage transistors. All sense amplifiers associated with a bit line segment may be isolated from their bit lines or bit line segments, as the floating N+ vertical local source lines and N+ vertical local bit lines within the erase block follow the positive voltage applied to their p– body regions.

It is possible to read, program, program-inhibit and erase through other conditions familiar to a person of ordinary skill in the art.

Low-Latency Partitioned Local and Global Word Lines.

The bit line segmentation in embodiments of the present invention serves to significantly reduce the RC delays in conventional global bit lines of conventional 3D NAND and 3D NOR memory arrays. Another major contributor to long read latency are the long and highly capacitive local word line conductors that typically run almost half or the entire width of the chip, orthogonal to the global bit lines. Thus, the 3D vertical NOR Flash memory arrays of US 2017/0092371 A1, like conventional 3D NAND Flash memory arrays, require a minimum of one layer of local word line conductors for each memory plane. In a 64-plane NAND or NOR memory array, these word line conductors are constructed in tall stair-case steps. Because local word lines supply high voltage during programming, their decoders require high voltage transistors circuitry that can occupy significant silicon real estate for each such stair-case step.

To reduce their associated overhead cost, word lines are typically made to be very long, which translates into high RC delays and poor read latency (e.g., in the range of a few microseconds). In a conventional 3D NAND memory array, the global bit lines too are long and have slow rise or fall times, which essentially hides the long word line latency. With the bit line segments of the present invention, since the bit-line response time can be very short (e.g., in the range of 100 nanoseconds), long word line RC delays become the limiting factor to fast read access. According to one embodiment of the present invention, one partial solution makes the 3D NOR memory chip long and narrow (i.e, short along the direction of the word lines and long along the direction of the bit line segments). While such a design does not reduce the silicon area for forming the word line decoders, the lengths and the RC delays of the word lines are significantly reduced without significantly increasing the RC delays along the bit line segments.

According to another embodiment of the present invention, word line delays may be further reduced by partitioning the memory array into more blocks with shorter word lines, each formed with its repeat stair-case steps. Partitioning the memory arrays by doubling the number of stair-case steps and their word line decoders reduce the RC delays by 4-fold.

Another significant contributor to long read latency is the large RC delays of the global word lines (GWL) that run in the X-direction spanning the length of the memory array above the stair-case steps along the sides of the memory array. FIG. 6f illustrates one implementation of global word lines for connecting the local word lines on one plane (i.e., at one stair-case step) in conjunction with the bit line segmentation scheme of the present invention. In FIG. 6f, only the local word lines at one X-Y plane through a stair-case step along the side of a memory array, the global word lines above the stair-case steps and their interconnections are shown. For clarity of illustration, all other details (e.g., P− channel material layers and charge trapping layers) are omitted. As shown in FIG. 6f, word lines $WL_0$, $WL_1$, . . . , of the memory array (e.g., the memory array corresponding to the embodiment shown in FIG. 6e) run along the Y-direction. Global word lines $GWL_0$, $GWL_1$, . . . , run along the X-direction above the stair-case steps. The global word lines connect the word lines at each plane of the memory array to their respective decoders, voltage sources and other support circuitry in substrate 605. In applying bit line segmentation to the architecture, for example, of FIGS. 3d, 3e, 3f and 3g, each step in the stair-case accommodates up to n global word lines that matches the number n of local word lines within a bit line segment. In the embodiment of FIG. 6f, for example, each bit line segment may include 128 bit lines and each storage transistor at each step is selected by a corresponding word line. Thus, there are 128 word lines at each step of a bit line segment. Hence, each global word line connects to every $128^{th}$ word line. For example, on each plane, global word line $GWL_0$ connects to word lines WL-0, WL-127, . . . through vias $VIA_0$, $VIA_{127}$, . . . , and $GWL_1$ connects to word lines WL-1, WL-129, . . . through vias $VIA_1$, $VIA_{128}$, . . . to its substrate decoders and voltage sources in substrate 605. This arrangement allows 128 sets of storage transistors on each plane to be concurrently read by activating the common global word line and their dedicated sense amp decoders. For example, storage transistors associated with word lines WLi, $WL_{i+128}$, . . . (generally, $WL_{i+128k}$, k=0, 1, . . . ) may be simultaneously read or programmed by activating global word line GWLi, while all other global word lines at the same step and at the other steps can be at ground potential (i.e all other storage transistors off) or floated at ground potential.

The embodiment illustrated in FIG. 6f may be considered costly in silicon real estate: if there are 128 word lines in each bit line segment and 64 steps in the stair-case, 128 global word lines would be required for every step of a 64-step stair-case (or 8192 global word lines in total). According to one embodiment of the present invention, the number of global word lines required can be reduced by a factor of 2, 4, 8, 16 or more by having each global word line contact more than one local word line within each bit-line segment. For example, global word line $GSL_1$ may contact not only word line $WL_1$, $WL_{129}$, . . . but also word lines $WL_{33}$, $WL_{65}$, . . . , (generally, $WL_{1+32k}$, k=0, 1, . . . ) thereby reducing by a factor of four the number of global word lines required per step, and reducing by a factor of four the total width of the stair-case. Of course, either additional decoding circuitry, or four times the number of dedicated sense amplifiers for each bit line segment, are required in the silicon substrate. (Alternatively, the single sense amplifier of the bit line segment may be time-shared through four consecutive read or program sequences.)

As the global word lines are implemented at the top of the memory array above the stair-case steps, the global word lines can be implemented using low resistivity copper interconnects. Capacitance between adjacent global word lines within a step can be reduced by substitution air gaps as the dielectric between them, as known to a person of ordinary skill in the art. The global word line RC delays can be reduced further by connecting global word line decoders and voltage sources in the silicon substrate underneath the stair-case steps to access the global word lines every half, quarter or eighth of their length through breaks along the length of the global word lines.

When going from say, a 32-layer stack to a 64-layer stack, the number of word line stair-case steps is doubled from 32 to 64. FIG. 6g shows an implementation of a vertical NOR string memory array that avoids such step-doubling, according to one embodiment of the present invention. In FIG. 6g, a Z-Y cross section of a memory array is shown with the total number of planes in the memory array being provided as two or more successively formed stacks (e.g., $STK_1$ and $STK_2$), one on top of another. Each stack is provided its own set of stair-case steps completed before the next stack is formed. In 3-dimensional NAND memory arrays of the prior art, two stacks of memory cells, each of 32 planes, are formed. Thereafter, a 64-plane stair-case of steps are then formed separately, followed by forming their associated global word lines. In contrast, FIG. 6f shows forming stacks $STK_1$ and stack $STK_2$ each having just 32 stair-case wide steps (Steps A, Steps B), each step being a word line (running along the Y-direction) connected by one of global word line $GWL_1$, $GWL_2$, . . . , $GWL_{32}$ (running along the X-direction). Stacks STK1 and STK2 are isolated from each other by isolation layer 617, thus reduced in half the total width of providing 64 stair-case steps. Under this scheme, local bit line (e.g., BL 654) and local source line (e.g. SL 655) in stack $STK_2$ are connected to their corresponding local bit line and local source line in stack $STK_1$ by etching openings through isolation layer 617 to expose the top of the N+ doped vertical columns, thereby connecting the vertical active columns of the top 32 planes to their counterparts in the lower 32 planes above substrate 605. Likewise, P− doped channel regions (e.g., channel region 656, corresponding to channel region 556 of FIG. 5b) of both stacks $STK_1$ and $STK_2$ are connected together by P+ doped plugs 691, which is formed in isolation layer 617 prior to forming $STK_2$.

The silicon substrate area associated with the global word lines can be reduced by positioning the global word line decoders and voltage sources either below the stair-case steps or on top of the memory arrays rather than outside of the arrays in the substrate. Such placement may be provided in conjunction with memory arrays of FIGS. 3f and 3g. In those embodiments, the top surface of the memory array is clear of any source line or bit line interconnects. Of course, such word line decoders and voltage sources are implemented using thin-film transistors that must be able to support the relatively high voltages (e.g., in the range of 12V-20V) required on the global word lines during programming. Such thin-film transistors may be achieved through shallow (Excimer) laser anneal to partially recrystallize deposited polysilicon or through other seeding techniques developed for solar panels or LED displays or other applications. The top surface of the memory array can also be exploited to run wider or taller global word line interconnects with greater spacing in-between to reduce their RC delays without unduly increasing the memory chip area.

3D Vertical NOR Arrays with Segmented Bit Lines for Quasi-Volatile NOR Strings.

Non-provisional Patent Application III, which is incorporated by reference above and which is now published as US 2017/0092371A1 ("the '237 publication"), discloses quasi-volatile NOR strings (see the '237 publication, at paragraphs [0128]-[0131]) that are suitable for replacing DRAM in certain storage applications that do not require extremely high cycle endurance. To that end, the read access time of quasi-volatile NOR strings approaches the read access time of DRAM, which, at under 100 nanoseconds, is approximately 500 times faster than conventional 3D NAND flash memory. In the three-dimensional vertical NOR strings disclosed in this detailed description, the segmented bit-lines at the bottom of the array with their dedicated sense amplifiers, decoders in the substrate beneath the bit line segment (e.g., shown in FIGS. 3d, 3e, 3f, and 3g) closely emulate the horizontal strings of Non-Provisional Patent Application III and are equally capable of achieving near-DRAM read latency. The process steps for building these quasi-volatile vertical NOR strings are similar to the steps described at paragraph [0129] of '237 publication. Because of the relatively short retention time (e.g., in the range of one hour to a few days) of the quasi-volatile storage transistors, they need to be frequently read-refreshed; in that context, having the ability to read or reprogram a large number of storage transistors concurrently (i.e. reading and reprogramming storage transistors associated with many bit line segments in parallel) is critical for minimizing interruption of normal reads when chip densities approach 1-terabit.

Non-Provisional Patent Application III also discloses pairing two storage transistors for a fast-read cache memory in horizontal NOR strings (see, the '237 publication, at paragraphs [0194]-[0196]). The segmented bit line with dedicated segment sense amplifier in the vertical NOR strings, as disclosed in this detailed description, is well-suited for such fast read cache memory, wherein a dual transistor pair may be used to program data on one transistor and the inverse data (i.e. the erased state) on an adjacent transistor sharing the same word line. For example, in FIG. 6e, the read output signals from the two transistors $T_L$(683), $T_R$ (682) in two adjacent bit-line segments $MSBL_1(L)$, $MSBL_1(R)$ sharing the two sides of the same word line $WL_{31-1}$ are fed into a differential sense amplifier in the silicon substrate. The differential sense amplifier is shared between the two adjacent bit line segments along the Y-direction. This dual segment arrangement, although it cuts by 50% the array bit efficiency, provides superior immunity to process variations and string leakage, parameter drifts or device sensitivities across the chip, while providing very fast sensing, higher cycle endurance, and dispensing with the need for programmable reference strings. Because of the isolation between bit line segments along the X-direction (i.e., along the same direction as the global bit lines), it is possible to have on the same chip blocks of bit line segments that are configured with paired transistors differential sensing for cache storage while other blocks employ the regular sensing of single transistors at a time for double density. This flexibility allows the same chip to serve as partially a cache memory, part a storage memory. It also allow storing files that require many pages of storage (e.g., one photo image requiring 4 MB of storage occupies 2,000 pages each of 2 KB) to have their first one or more pages written into the segments with fast cache memory and the rest in the non-cache segments on the same chip, then retrieve the image by reading its first page very fast, while employing pipeline reads for the other pages to enjoy the lower read latency for the entire 4 MB.

Although the segmentation of a global bit line into regional bit line segments with corresponding segment sense amplifiers and the global word line segmentation (discussed in conjunction with FIGS. 6f and 6h) of the present invention have been described for 3-dimensional vertical NOR strings, it can be similarly applied to conventional 3D vertical NAND memory strings.

Fabrication Process

FIGS. 7a, 7b, 7c and 7d are cross sections of intermediate structures formed in a fabrication process for a multi-gate NOR string array, in accordance with one embodiment of the present invention.

Figure 7A:
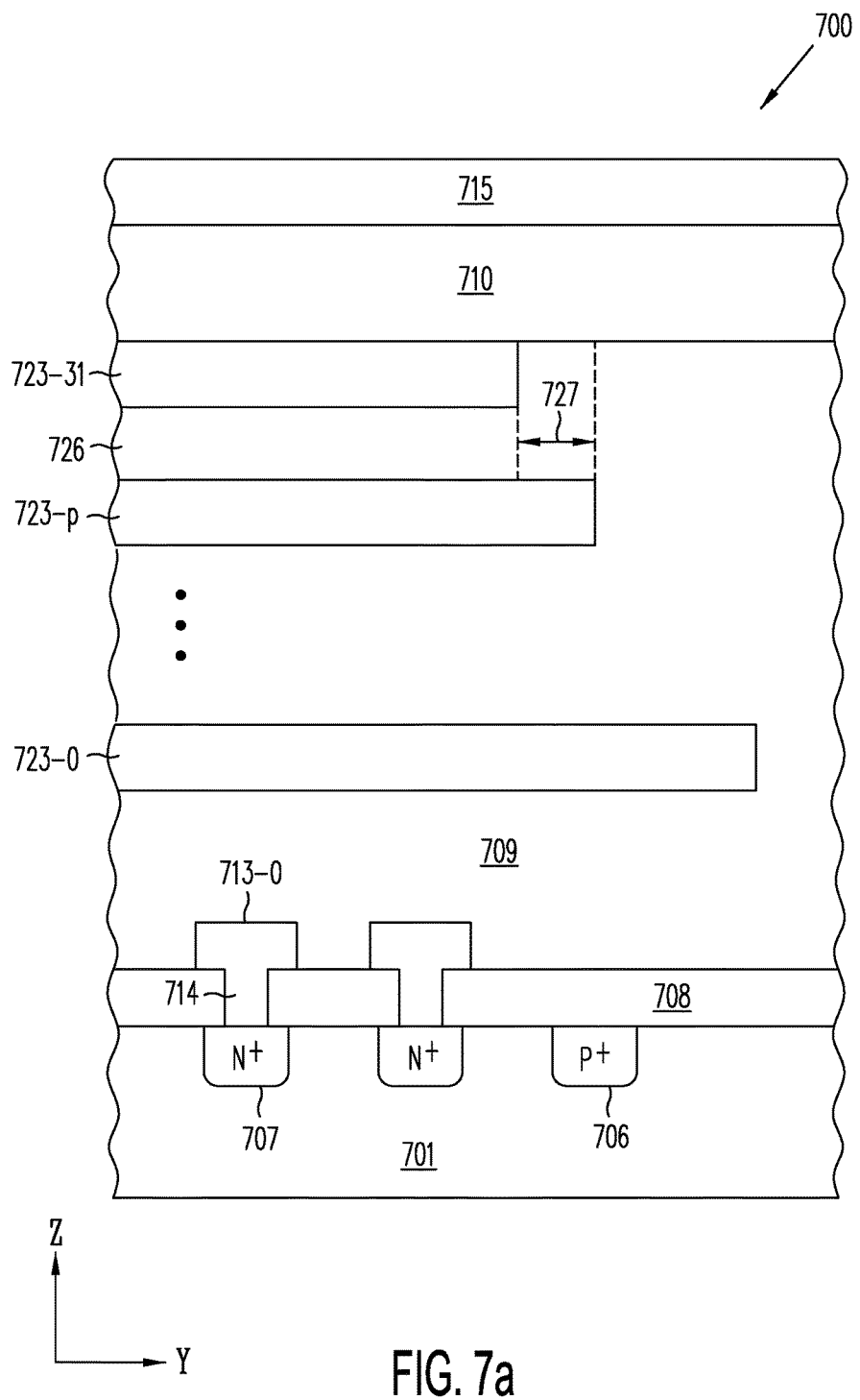
FIGS. 7a, 7b, 7c and 7d are cross sections of intermediate structures formed in a fabrication process for a multi-gate NOR string array, in accordance with one embodiment of the present invention.

FIG. 7a shows a cross section in the Z-Y plane of semiconductor structure 700, after low resistivity layers 723p have been formed above substrate 701, in accordance with one embodiment of the present invention. In this example, p is an integer between 0 and 31, representing each of 32 word lines. As shown in FIG. 7a, semiconductor structure 700 includes low resistivity layers 723-0 to 723-31. Semiconductor substrate 701 represents, for example, a P-doped bulk silicon wafer on and in which support circuits for memory structure 700 may be formed prior to forming the vertical NOR strings. Such support circuits may include both analog and digital logic circuits. Some examples of such support circuits may include shift registers, latches, sense amplifiers, reference cells, power supply lines, bias and reference voltage generators, inverters, NAND, NOR, Exclusive-OR and other logic gates, input/output drivers, address decoders, including bit-line and word line decoders, other memory elements, sequencers and state machines. To provide these support circuits, the building blocks of conventional N-Wells, P-Wells, triple wells (not shown), $N^+$ diffusion regions (e.g., region 707-0) and $P^+$ diffusion regions (e.g., region 706), isolation regions, low and high voltage transistors, capacitors, resistors, diodes and interconnects are provided, as known to a person skilled in the art.

After the support circuits have been formed in and on semiconductor substrate 701, insulating layers 708 are provided, which may be deposited or grown thick silicon dioxide, for example. In some embodiments, one or more metallic interconnect layers may be formed, including global source line 713-0, which may be provided as horizontal long narrow strips running along a predetermined direction. Global source line 713-0 is connected through etched openings 714 to circuitry 707 in substrate 701. To facilitate discussion in this detailed description, the global source lines are presumed to run along the X-direction. The metallic interconnect lines may be formed by applying photo-lithographical patterning and etching steps on one or more deposited metal layers. (Alternatively, these metallic interconnect lines can be formed using a conventional damascene process, such as a conventional copper or tungsten damascene process). Thick dielectric layer 709 is then deposited, followed by planarization using conventional chemical mechanical polishing (CMP).

Conductor layers 723-0 to 723-31 are then successively formed, each conductor layer being insulated from the layer underneath it and the layer above it by an intervening insulating layers 726. In FIG. 7a, although thirty two conductor layers are indicated, any number of such layers may be provided. In practice, the number of conductor layers that can be provided may depend on the process technology, such as the availability of a well-controlled anisotropic etching process that allows cutting through the multiple conductor layers and dielectric isolation layers 726 there-between. For example, conductor layers 723p may be formed by first depositing 1-2 nm thick layer of titanium nitride (TiN), followed by depositing a 10-50 nm thick layer of tungsten (W) or a similar refractory metal, or a silicide such as silicides of nickel, cobalt or tungsten among others, or a salicide, followed by a thin layer of etch-stop material such as aluminum oxide ($Al_2O_3$). Each conductor layer is etched in a block 700 after deposition, or is deposited as a block through a conventional damascene process. In the embodiment shown in FIG. 7a, each successive conductor layer 723p extends in the Y– direction a distance 727 short of (i.e. recessed from) the edge of the immediately preceding metal layer, so that all conductor layers may be contacted from the top of structure 700 at a later step in the process. However, to reduce the number of masking and etch steps necessary to form the stepped conductors stack of FIG. 7a, it is possible to achieve recessed surfaces 727 simultaneously for multiple conductor layers by employing other process techniques known to a person skilled in the art that do not require each individual conductor plane to be separately masked and etched to create exposed recessed surfaces 727. After the conductor layer is deposited and etched, the corresponding one of dielectric isolation layers 726 is then deposited. Dielectric isolation layers 726 may be, for example, a silicon dioxide of a thickness between 15 and 50 nanometers. Conventional CMP prepares the surface of each dielectric layer for depositing the next conductor layer. The number of conductor layers in the stack of block 700 corresponds to at least the number of memory TFTs in a vertical NOR string, plus any additional conductor layers that may be used as control gates of non-memory TFTs such as pre-charge TFTs (e.g., pre-charge TFT 575 of FIG. 5a), or as control gates of bit-line access select TFTs (e.g., 585 bit-line access select TFT 511 of FIG. 5a). The conductor layer deposition and etch steps and the dielectric layer deposition and CMP process are repeated until all conductor layers are provided.

Dielectric isolation layer 710 and hard mask layer 715 are then deposited. Hard mask 715 is patterned to allow etching of conductor layers 723p to form long strips of yet to be formed word lines. The word lines extend in length along the Y-direction. One example of a masking pattern is shown in FIG. 6 for word lines 623p-R, 623p-L, which includes features such as the extensions in adjacent word lines towards each other at separation 676 and the recesses in each word line to create the desired curvatures 675. Deep trenches are created by anisotropically etching through successive conductor layers 723p and their respective intervening dielectric insulator layers 726, until dielectric layer 709 at the bottom of conductor layers 723p is reached. As a large number of conductor layers are etched, a photoresist mask by itself may not be sufficiently robust to hold the desired word line pattern through numerous successive etches. To provide a robust mask, hard mask layer 715 (e.g., carbon) is preferred, as is known to a person of ordinary skill in the art. Etching may terminate at dielectric material 709, or at landing pads 713 on the global source lines, or at substrate 701. It may be advantageous to provide an etch-stop barrier film (e.g., aluminum oxide) to protect landing pads 713 from etching.

Figure 7B:
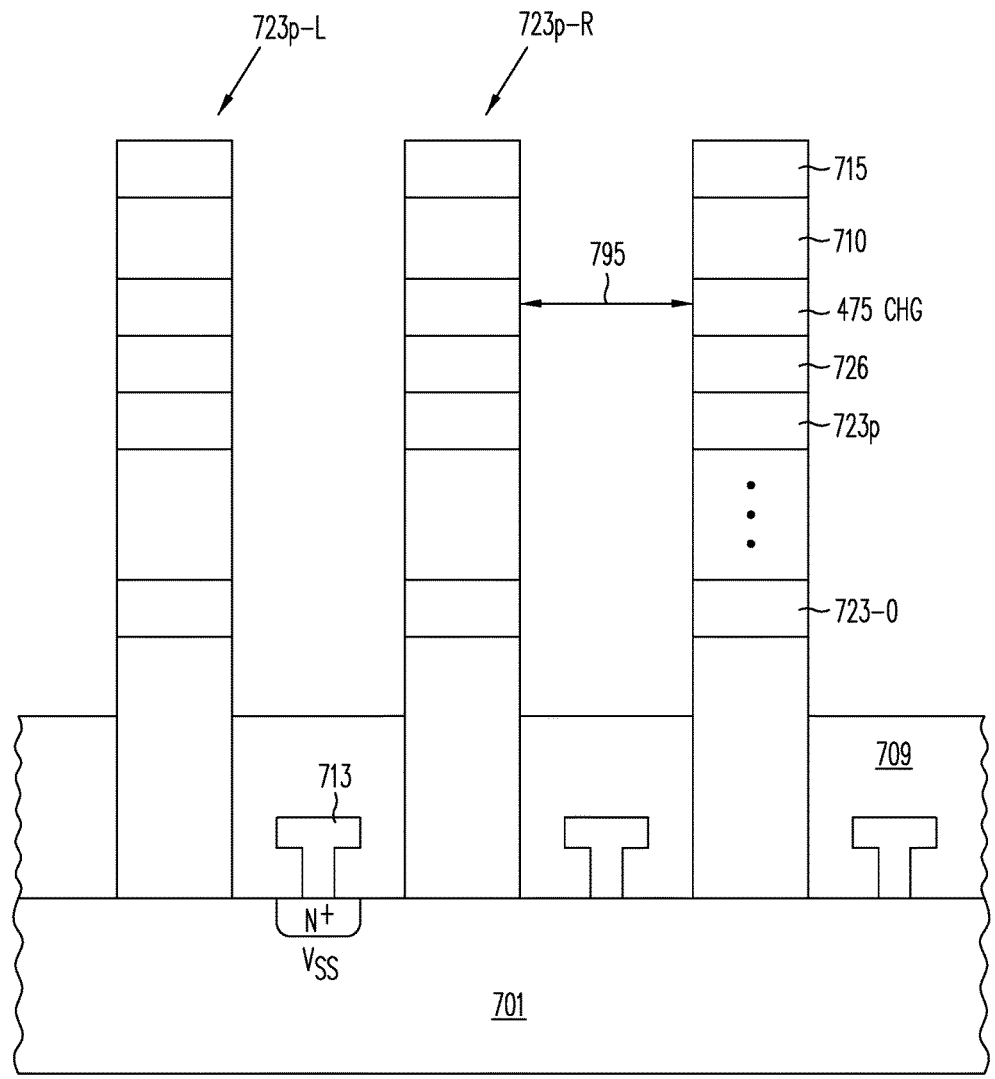

FIG. 7b illustrates, in a cross section in the Z-X plane of semiconductor structure 700, etching through successive conductor layers 723p and corresponding dielectric layers 726 to form trenches (e.g., deep trench 795), which reach down to dielectric layer 709, according to one embodiment of the present invention. In FIG. 7b, conductor layers 723p are anisotropically etched to form conductor stacks 723p-R and 723p-L, which are separated from each other by deep trench 795. This anisotropic etch is a high aspect-ratio etch. To achieve the best result, etch chemistry may have to be alternated between conductor material etch and dielectric etch, as the materials of the different layers are etched through, as in known to a person skilled in the art. The anisotropy of the multi-step etch is important, as undercutting of any of the layers should be avoided, so that a resulting word line at the bottom of a stack would have approximately the same conductor width and trench spacing as the corresponding width and spacing of a word line near or at the top of the stack. Naturally, the greater the number of conductor layers in the stack, the more challenging it becomes to maintain a tight pattern tolerance through the numerous successive etches. To alleviate the difficulty associated with etching through, for example, 64 or 128 or more conductor layers, etching may be conducted in sections of, say, 32 layers each. The separately etched sections can then be stitched together, as taught, for example, in the Kim reference mentioned above.

Etching through multiple conductor layers 723p of conductor material (e.g., tungsten or other refractory materials) is much more difficult and time-consuming than etching of the intervening insulating layers 726. For that reason, an alternative process may be adopted that eliminates the need for multiple etches of conductor layers 723p. That process, well known to a person skilled in the art, consists of first substituting sacrificial layers of a readily etchable material in place of conductor layers 723p of FIG. 7b. For example, insulating layers 726 can be silicon dioxide and sacrificial layers (occupying the spaces shown as 723p in FIG. 7b) can be silicon nitride or another fast etching dielectric material. Deep trenches are then etched anisotropically through the ONON (Oxide-Nitride-Oxide-Nitride) alternating dielectric layers to create tall stacks of the dual dielectrics. At a later step in the manufacturing process flow (to be described below), these stacks are supported by active vertical strips of polysilicon, allowing the sacrificial layers to be etched away, preferably through selective chemical or isotropic etch. The cavities thus created are then filled through conformal deposition of the conductor material, resulting in conductor layers 723p separated by intervening insulating layers 726.

Figure 7C:
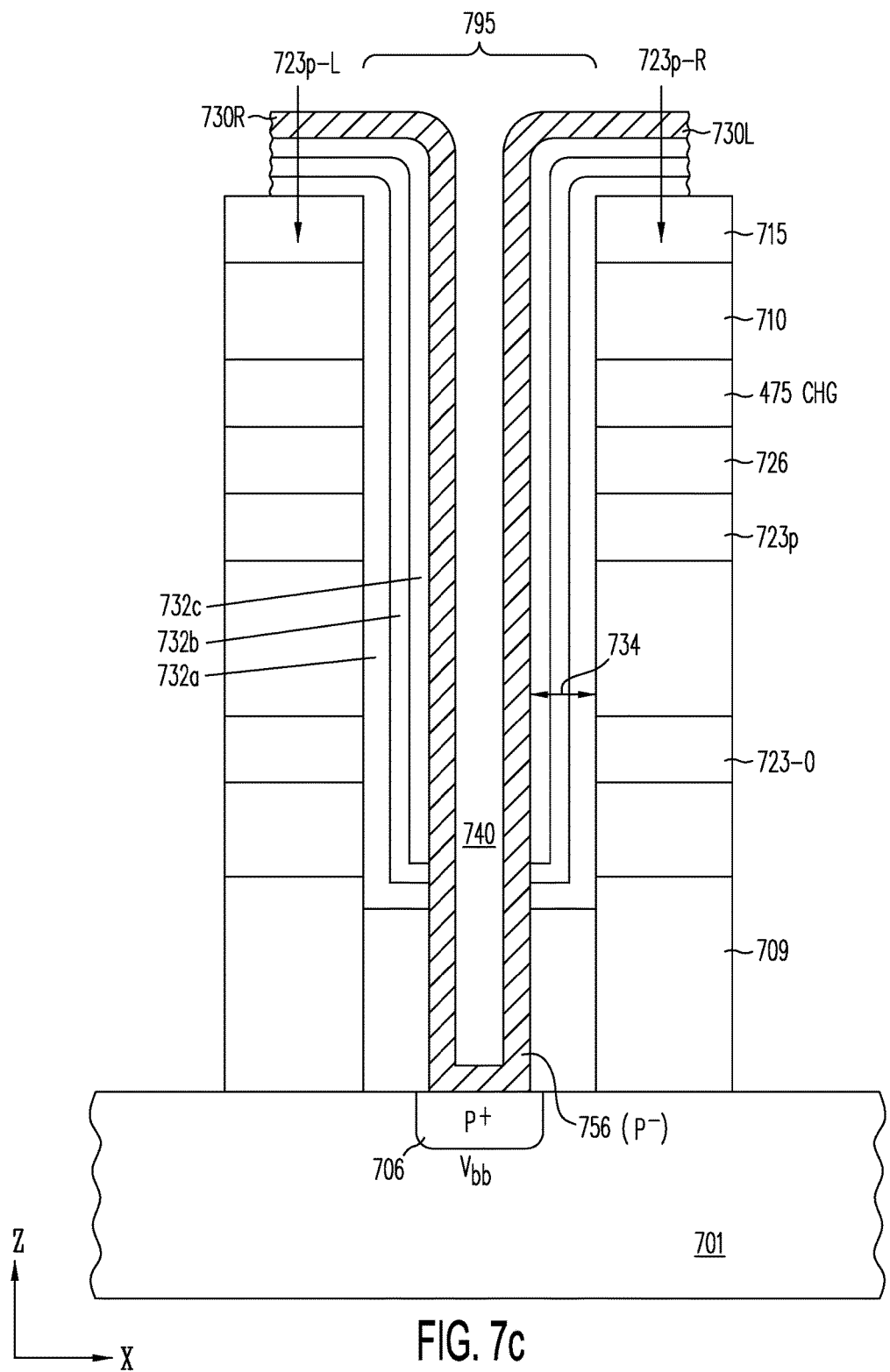
Figure 7D:
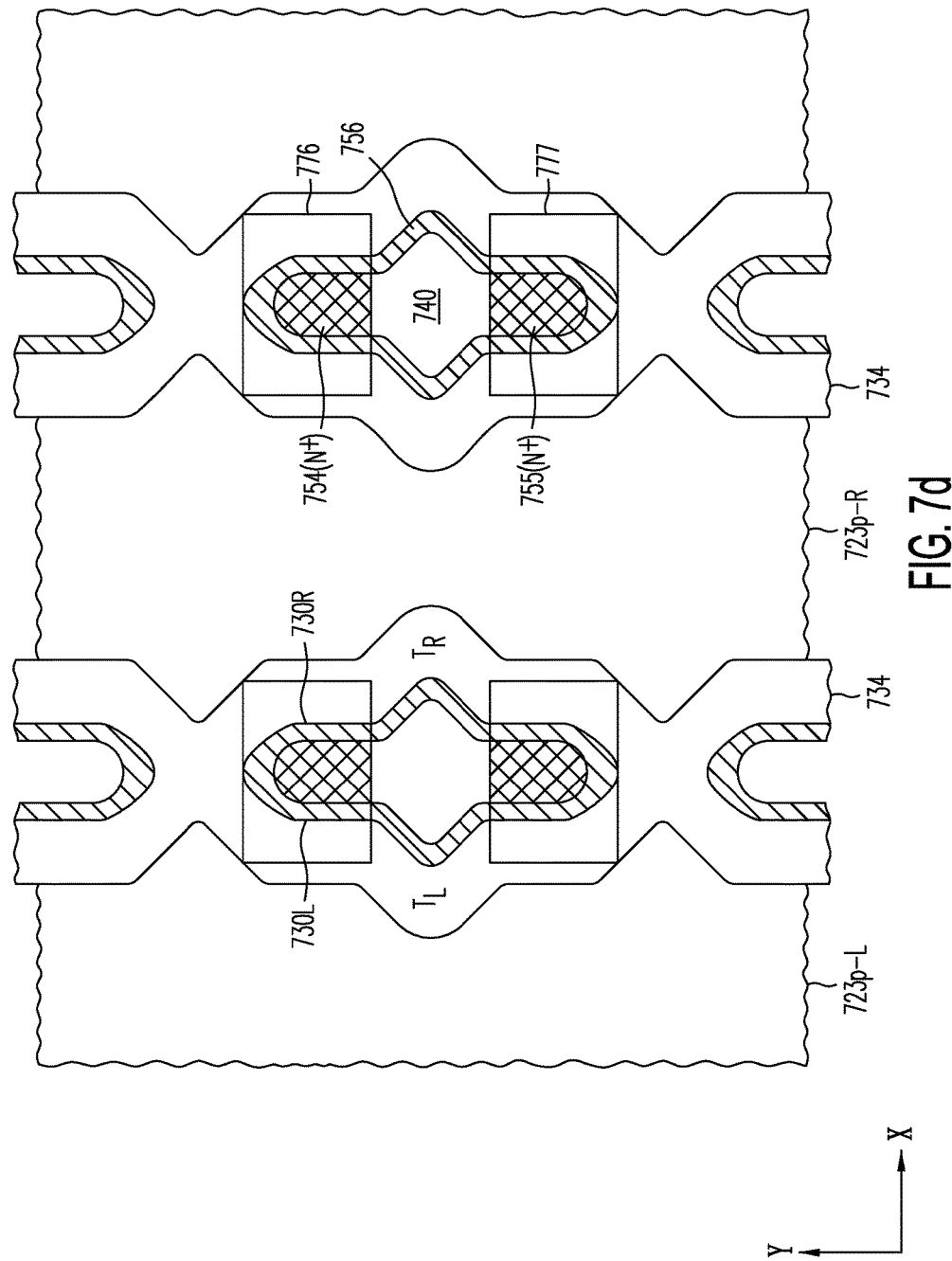
Figures 1, 7D:
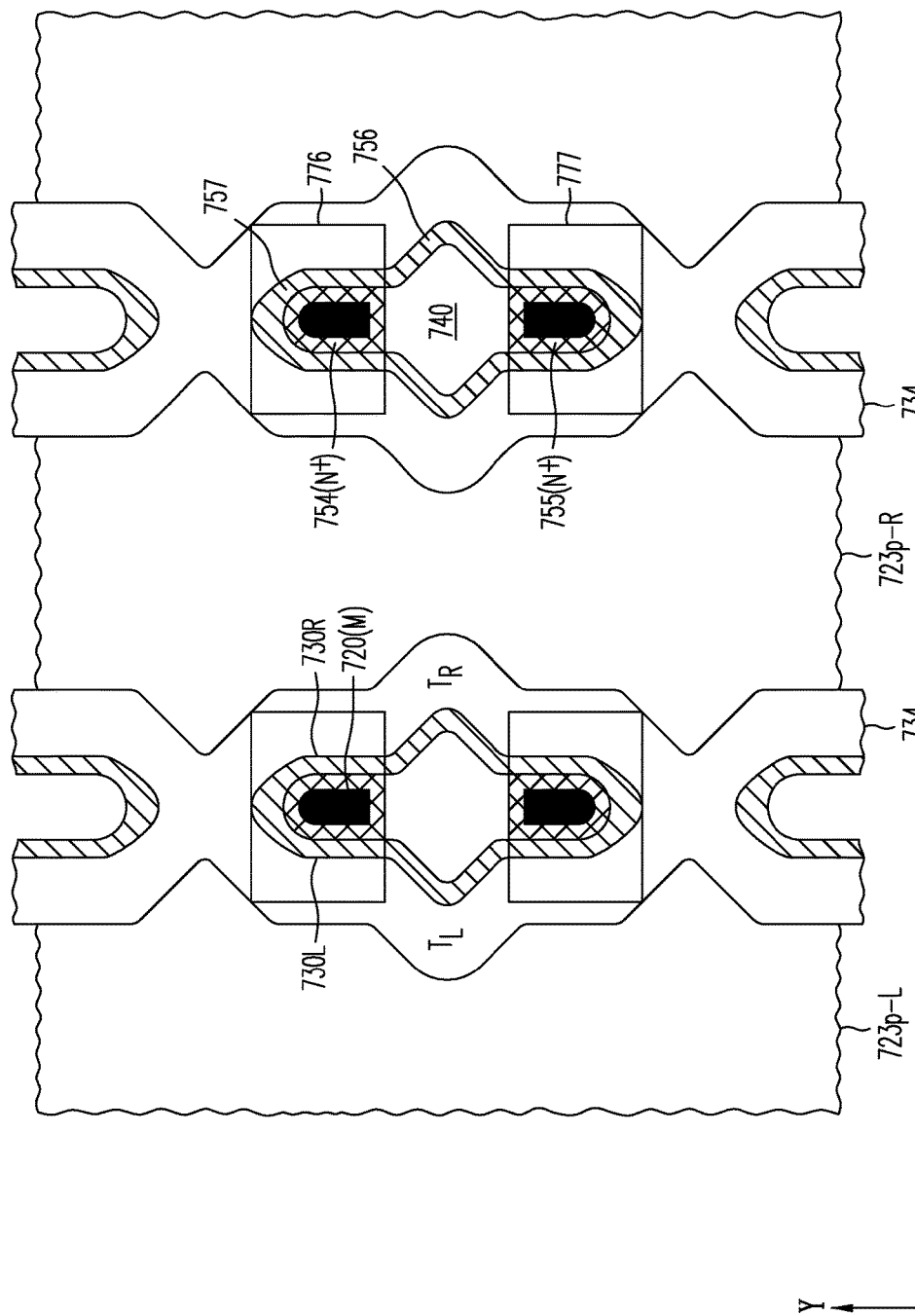

After the structure of FIG. 7b is formed, charge-trapping layers 734 and polysilicon layers 730 are then deposited in succession conformally on the vertical sidewalls of the etched conductor word line stacks. A cross section in the Z-X plane of the resulting structure is shown in FIG. 7c. As shown in FIG. 7c, charge-trapping layers 734 are formed, for example, by first depositing blocking dielectric 732a, between 5 to 15 nanometers thick and consisting of a dielectric film of a high dielectric constant (e.g., aluminum oxide, hafnium oxide, or some combination silicon dioxide and silicon nitride). Thereafter, charge-trapping material 732b is deposited to a thickness of 4 to 10 nanometers. Charge-trapping material 732b may be, for example, silicon nitride, silicon-rich oxynitride, conductive nanodots embedded in a dielectric film, or thin conductive floating gates isolated from adjacent TFTs sharing the same vertical active strip. Charge-trapping 732b may then be capped by a deposited conformal thin tunnel dielectric film in the thickness range of 2 to 10 nanometers (e.g., a silicon dioxide layer, or a silicon oxide-silicon nitride-silicon oxide ("ONO") triple-layer). The storage element formed out of charge-trapping layers 734 may be any one of SONOS, TANOS, nanodot storage, isolated floating gates or any suitable charge-trapping sandwich structures known to a person of ordinary skill in the art. The combined thickness of charge-trapping layers 734 is typically between 15 and 25 nanometers.

After deposition of charge-trapping layer 734, contact openings are made at the bottom of trench 795, using a masking step and by anisotropically etching through charge-trapping layers 734 and dielectric layer 709 at the bottom of trench 795, stopping at bottom global source line landing pad 713 for the source supply voltage $V_{ss}$ (see, FIG. 7b), or at global bit line voltage Vbl (not shown), or at P+ region 706 for contact to a back bias supply voltage $V_{bb}$ (see, FIG. 7c). In some embodiments, this etch step is preceded by a deposition of an ultra-thin film of polysilicon (e.g. 2 to 5 nanometers thick) to protect the vertical surfaces of tunnel dielectric layer 732c during the contact-opening etch of charge-trapping material 734 at the bottom of trench 795. In one embodiment, each global source line is connected only to alternate ones in a row of vertical NOR string pairs. For example, in FIG. 5a, for odd address word lines, electrical contacts (e.g., contact opening 557) are etched to connect the N+ doped local source lines (e.g., local source line 555 in FIG. 5a) to global source line 513-1. Likewise, for even address word lines, electrical contacts are etched to connect the N+ doped local source lines in the row of vertical NOR string pairs to global source line 513-2 (not shown in FIG. 5a). In the embodiment employing virtual $V_{ss}$ through parasitic capacitor C (i.e., capacitors 560 in FIG. 5a) the step of etching through charge trapping layer 734 at the bottom of trench 795 may be skipped.

Thereafter, polysilicon thin film 730 is deposited to a thickness ranging between 5 and 10 nanometers. In FIG. 7c, polysilicon thin film 730 is shown on the opposite sidewalls of trench 795, labeled respectively 730R and 730L. Polysilicon thin film 730 is undoped or preferably doped P− with boron, at a doping concentration typically in the range of $1\times10^{16}$ per cm$^3$ to $1\times10^{17}$ per cm$^3$, which allows a TFT to be formed therein to have an enhancement native threshold voltage. Trench 795 is sufficiently wide to accommodate charge-trapping layers 734 and polysilicon thin film 730 on its opposing sidewalls. Following the deposition of polysilicon 730, the sacrificial layers in the stack described above are etched away and the cavities thus formed are filled with the conformally deposited conductor layers 723p (FIG. 7c).

As shown in FIG. 7b, trench 795 extends along the Y-direction. After formation of isolated word line stacks 723p-L and 723p-R, in one example semiconductor structure 700 may have 16,000 or more side-by-side word line stacks, each serving as control gates for 8,000 or more active columns to be formed along the length of each stack, or 16,000 TFTs (8,000 TFTs on each side of the stack). With 64 word lines in each stack, 16 billion TFTs may eventually be formed in each of such multi-gate vertical NOR string array. If each TFT stores two data bits, such a multi-gate vertical NOR string array would store 32 gigabits of data. Approximately 32 such multi-gate vertical NOR string arrays (plus spare arrays) may be formed on a single semiconductor substrate, thereby providing a 1-terabit integrated circuit chip.

FIG. 7d is a cross section view in the X-Y plane of the top surface of the structure of FIG. 7c in one embodiment. Nestled between word lines 723p-L and 723p-R are the two sidewalls 730L and 730R of the vertical deposited P− doped polysilicon structure (i.e., an active column). The deep void 740 between sidewalls 730L and 730R may be filled with a fast-etching insulating dielectric material (e.g., silicon dioxide or liquid glass or carbon doped silicon oxide). The top surface may then be planarized using conventional CMP. A photolithographic step then exposes openings 776 and 777, which is followed by a high aspect-ratio selective etching to excavate the fast-etching dielectric material in exposed areas 776 and 777 all the way down to the bottom of trench 795. A hard mask may be required in this etching step to avoid excessive pattern degradation during etch. The excavated voids are then filled with an in-situ N+ doped polysilicon. The N+ dopants diffuse into the very thin lightly doped active polysilicon pillars 730L and 730R within the exposed voids to make them N+ doped. Alternatively, prior to filling the voids with the in-situ N+ doped polysilicon the lightly doped polysilicon inside the voids can be etched away through a brief isotropic plasma etch or selective wet etch. CMP or top surface etching then removes the N+ polysilicon from the top surface, leaving tall N+ polysilicon pylons in areas 754 (N+) and 755(N+). These N+ pylons form the shared vertical local source line and the shared vertical local bit line for the TFTs in the resulting vertical NOR strings.

FIG. 7d-1 shows materially enhancing electrical conductivity of the tall vertical source/drain pylons by only partially filling the exposed voids 776 of vertical pylons 754 and 755, for example, by first depositing ultra-thin layers of N+ doped polysilicon 754(N+) and 755(N+), each of thickness between 5 and 15 nanometers (which is insufficient to fill the voids), followed by depositing (e.g., using Atomic Layer Deposition (ALD)) a metallic conductive material (e.g., titanium nitride, tungsten nitride or tungsten) to fill remaining void 720(M) at the core of the source/drain pylons. See, also, FIG. 4a-1, which shows in the Y-Z plane metallic conductor 420(M) occupying the core of the pylons, in close contact with ultra-thin N+ poly 454 (N+). Because of the relatively significantly higher conductivity of the metallic material at the core, the N-type doping concentration of the ultra-thin N+ doped polysilicon can be reduced by one or two orders of magnitude, reducing undesirable thermal diffusion of the N-type dopant into the P-type dopant of the channel. The N+/metallic conductor structure can be applied to either one or both of the source and drain pylons. In another embodiment, the thin P− doped polysilicon that is in region 757—outside the channel region 756—can first be more heavily doped P+ (e.g., $10^{19}$ per cm$^3$ or higher), compared to the P− doping in channel region 756, which may be $2\times10^{18}$ per cm$^3$ or lower. Adding the P+ poly in the source pylon that contacts the P− poly in the channel can enhance erase efficiency when the local source line is raised to a high positive voltage during an erase operation.

Next, a dielectric isolation layer is deposited and patterned using photolithographic masking and etching steps. The etching step opens contacts for connecting the vertical local bit lines to the horizontal global bit lines (e.g., contacts 657-1 to strings at odd addresses and 657-2 to strings at even addresses, as shown in FIG. 6). A low resistivity metal layer (e.g., tungsten) is deposited. The deposited metal is then patterned using photolithographic and etching steps to form global bit-lines (e.g., global word line 614-1 or GBL1 for strings at odd addresses, and global bit line 614-2 (GBL2) for strings at even addresses, as shown in FIG. 6). Alternatively, the global bit lines may be formed using conventional copper damascene process. All global bit lines, as well as all metal layers 723p of the word line stacks (FIG. 7a) are connected by etched vias to word line and bit-line decoding and sensing circuits in the substrate, as is known to a person skilled in the art. Switch and sensing circuits, decoders and reference voltage sources can be provided to global bit lines and global word lines, either individually or shared by several ones of the bit lines and word lines.

In some embodiments, bit line access select transistors (511 in FIG. 5a) and their associated control gate word lines (e.g., word lines 585 in FIG. 5a) are formed as isolated vertical N+P−N+ transistors, as known to a person skilled in the art, to selectively connect odd and even global bit lines (e.g., bit lines 614-1 and 614-2 in FIG. 6a) to vertical NOR strings at alternate odd and even addresses (e.g., local bit lines 657-1 and 657-2, respectively, in FIG. 6a).

Read Operation Because the TFTs of a vertical NOR string are connected in parallel, in all embodiments of the current invention, all TFTs in an active column (including an active column having formed thereon a vertical NOR string pair) should preferably be in enhancement mode—i.e., each TFT should have a positive gate-to-source threshold voltage—so as to suppress leakage currents during a read operation between the shared local source line and the shared local bit line (e.g., local bit line 455 and local source line 454 shown in FIG. 4c). Enhancement mode TFTs are achieved by doping the channel regions (e.g., P-channel region 756 of FIG. 7c) with boron in a concentration typically between $1\times10^{16}$ and $1\times10^{17}$ per cm$^3$, targeting for a native TFT threshold voltage of around 1V. With such TFTs, all unselected word lines in the vertical NOR string pair of an active column may be held at 0V. Alternatively, the read operation may raise the voltage on the shared local N+ source line (e.g., local source line 455 of FIG. 4c) to around 1.5V, while raising the voltage on the shared local N+ drain line (e.g., local bit line 454) to around 2V and holding all unselected local word lines at 0V. Such a configuration is equivalent to setting the word line to −1.5V with respect to the source, thereby suppressing leakage current due to TFTs that are in slightly depleted threshold voltage, which occurs, for example, if the TFTs are slightly over-erased.

After erasing the TFTs of a vertical NOR string, a soft programming operation may be required to shift any TFT in the vertical NOR string that is over-erased (i.e., now having a depletion mode threshold voltage) back to an enhancement mode threshold voltage. In FIG. 5a, an optional connection 556 is shown by which P− channel is connected to back bias voltage 506 ($V_{bb}$,) (also shown as body connection 456 in FIG. 4c). A negative voltage may be used for $V_{bb}$ to modulate the threshold voltage of the TFTs in each active column to reduce subthreshold leakage currents between the shared N+ source and the shared N+ drain/local bit line. In some embodiments, a positive $V_{bb}$ voltage can be used during an erase operation to tunnel-erase TFTs whose control gates are held at 0V.

Figure 8A:
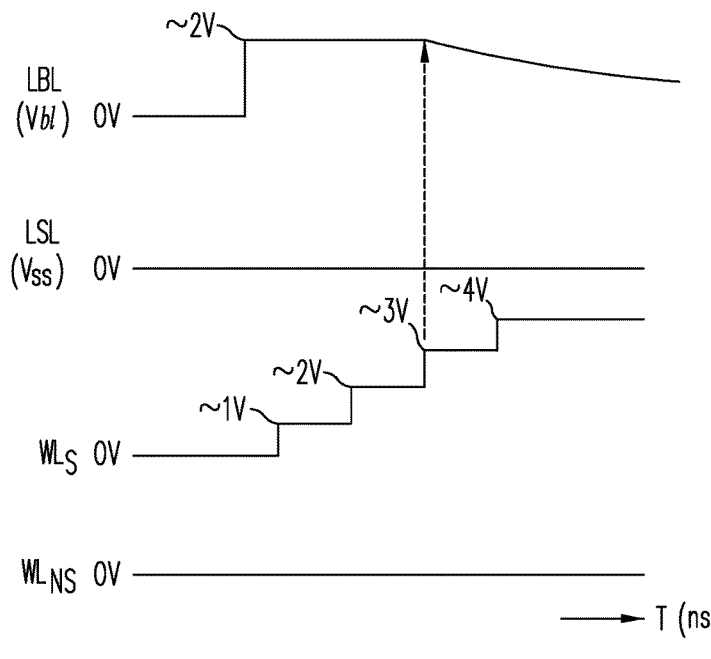
FIG. 8a is a schematic representation of a read operation for embodiments where the local source line (LSL) of a vertical NOR string is hard-wired.
Figure 8B:
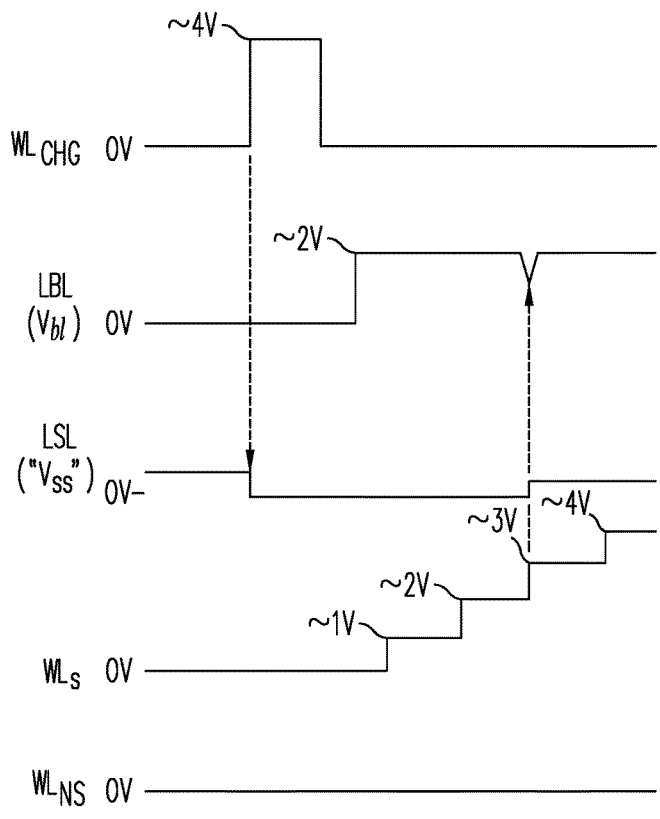
FIG. 8b is a schematic representation of a read operation for embodiments where the local source line is floating at pre-charge virtual voltage $V_{ss}$.

To read the data stored in a TFT of a vertical NOR string pair, all TFTs on both vertical NOR strings of the vertical NOR string pair are initially placed in the "off" state by holding all word lines in the multi-gate NOR string array at 0V. The addressed vertical NOR string can either share a sensing circuit among several vertical NOR strings along a common word line through use of decoding circuitry. Alternatively, each vertical NOR string may be directly connected through a global bit-line (e.g., GBL1 of FIG. 4c) to a dedicated sensing circuit. In the latter case, one or more vertical NOR strings sharing the same word line plane may be sensed in parallel. Each addressed vertical NOR string has its local source line set at $V_{ss}$~0V, either through its hard-wired global source line (e.g., GSL1 in FIG. 4c) as shown schematically in FIG. 8a, or as a virtual $V_{ss}$~0V through a pre-charge transistor (e.g., pre-charge transistor 470 in FIG. 4c or transistor 317 in FIG. 3c) which momentarily transfers $V_{bl}$~0V to parasitic capacitance C (e.g., capacitor 460 or capacitor 360) of floating local source line 455 or 355) during the pre-charge, as shown schematically in FIG. 8b.

Immediately after turning off pre-charge transistor 470, the local bit line (e.g., local bit line 454 of FIG. 4c) is set at $V_{bl}$~2V through the bit line access select transistor (e.g., bit line access select transistor 411 of FIG. 4c or access select transistor 511 in FIG. 5a). $V_{bl}$~2V is also the voltage at the sense amplifiers for the addressed vertical NOR strings. At this time, the addressed word line is raised in small incremental voltage steps from 0V to typically about 6V, while all the un-selected word lines at both the odd address TFTs and the even address TFTs of the vertical NOR string pair remain at 0V. In the embodiment of hard-wired $V_{ss}$ of FIG. 8a, the addressed TFT has been programmed in one example to a threshold voltage of 2.5V, therefore the voltage Vbl at local bit line LBL begins to discharge through the selected TFT towards the 0V of the local source line ($V_{ss}$) as soon as its WLs exceeds 2.5V, thus providing a voltage drop (shown by the dashed arrow in FIG. 8a) that is detected at the sense amplifier serving the selected global bit line. In the embodiment of the virtual $V_{ss}$ of FIG. 8b, pre-charge transistor word line $WL_{CHG}$ momentarily is turned on to pre-charge floating local source line LSL to 0V at the start of the read sequence. Then, selected word line WLs goes through its incremental voltage steps, and as soon as it exceeds the programmed 2.5V, the selected TFT momentarily dips the voltage on its local bit line from its Vbl~2V. This voltage dip (shown by the dashed arrow in FIG. 8b) is detected by the sense amplifier of the global bit line connected to the selected local bit line. There are other alternative schemes to correctly read the programmed threshold voltage of the selected TFT as known to a person skilled in the art. The embodiments relying on parasitic capacitance C to temporarily hold virtual voltage $V_{ss}$, the higher the vertical stack the bigger is capacitance C and therefore the longer is the hold time and the greater is the read signal presented to the selected sense amplifier. To further increase C it is possible to add in one embodiment one or more dummy conductors in the vertical string whose primary purpose is to increase capacitance C.

In the case of an MLC implementation (i.e., a "multi-level cell" implementation, in which each TFT stores more than one bit), the addressed TFT may have been programmed to one of several voltages (e.g., 1V (erased state), 2.5V, 4V or 5.5V). The addressed word line WLs is raised in incremental voltage steps until conduction in the TFT is detected at the sense amplifier. Alternatively, a single word line voltage can be applied (e.g., ~6 volts), and the rate of discharge of the local bit line LBL ($V_{bl}$) can be compared with the rates of discharge from several programmable reference voltages representative of the voltage states of the stored multi-bit. This approach can be extended for a continuum of states, effectively providing analog storage. The programmable reference voltages maybe stored in dedicated reference vertical NOR strings located within the multi-gate vertical NOR string array, so that the characteristics during read, program, and background leakage are closely tracked. In a vertical NOR string pair, only the TFTs on one of the two vertical NOR strings can be read in each read cycle; the TFTs on the other vertical NOR string are placed in the "off" state (i.e., all word lines at 0V). During a read cycle, as only one of the TFTs in a vertical NOR string is exposed to the read voltages, read disturb conditions are essentially absent.

In one example of an embodiment of this invention, 64 TFTs and one or more pre-charge TFTs may be provided on each vertical NOR string of a vertical NOR string pair. Each word line at its intersection with the local vertical N+ source line pillar forms a capacitor (see, e.g., capacitor 660 of FIG. 6a). A typical value for such a capacitor may be, for example, $1\times10^{-18}$ farads. Including all the capacitors in both vertical NOR strings of a vertical NOR string pair, the overall distributed capacitance C totals approximately $1\times10^{-16}$ farads, which is sufficient for a local source line to preserve a pre-charged source voltage ($V_{ss}$) during a read cycle, which is completed in typically less than a microsecond immediately following the pre-charge operation. The charging time through bit-line access select transistors 411 and pre-charge TFT 470 is in the order of a few nanoseconds, thus the charging time does not add noticeably to the read latency. Reading from a TFT in a vertical NOR string is fast, as the read operation involves conduction in only one of the TFTs in the vertical NOR string, unlike the read operation on a NAND string, in which many TFTs connected in series are required to be conducting.

There are two major factors contributing to the read latency of vertical NOR strings of the current invention: (a) the RC time delay associated with resistance $R_{bl}$ and capacitance $C_{bl}$ of a global bit line (e.g., GBL 614-1 in FIG. 6*a*), and (b) the response time of a sense amplifier to a voltage drop $V_{bl}$ on the local bit line (e.g., LBL-1) when the addressed TFT begins conducting. The RC time delay associated with a global bit line serving, for example, 16,000 vertical NOR strings is of the order of a few tens of nanoseconds. The read latency for reading a TFT of a prior art vertical NAND string (e.g., the NAND string of FIG. 1*b*) is determined by the current through 32 or more series-connected TFTs and select transistors discharging capacitance $C_{bl}$ of the global bit line. By contrast, in a vertical NOR string of the present invention, the read current discharging $C_{bl}$ is provided through just the one addressed transistor (e.g., transistor 416L of FIG. 4*a*) in series with bit line access select transistor 411, resulting in a much faster discharge of the local bit line voltage ($V_{bl}$). As a result, a much lower latency is achieved.

In FIG. 4*c*, when one TFT (e.g., TFT 416L in the vertical NOR string 451*b*) is read at a time, all other TFTs in either vertical NOR string 451*a* and 451*b* of vertical NOR string pair 491 are held in their "off" states, their word lines being held at 0V. Even though TFT 416R in vertical NOR string 452*a* of vertical NOR string pair 492 shares word line W31 with TFT 416L, TFT 416R may be read simultaneously with TFT 416L because vertical NOR string 452*a* is served by global bit line 414-2, while vertical NOR string 451*b* is served by global bit line 414-1. (FIGS. 6*a* and 6*b* illustrate how global bit lines 614-1 and 614-2 serve adjacent vertical NOR string pairs).

In one embodiment, a word line stack includes 32 or more word lines provided in 32 planes. In one multi-gate vertical NOR string array, each plane may include 8000 word lines controlling 16,000 TFTs, each of which may be read in parallel through 16,000 global bit lines, provided that each bit line is connected to a dedicated sense amplifier. Alternatively, if several global bit lines share a sense amplifier through a decode circuit, the 16000 TFTs are read over several successive read cycles. Reading in parallel a massive number of discharging TFTs can cause a voltage bounce in the ground supply ($V_{ss}$) of the chip, which may result in read errors. However, an embodiment that uses the pre-charged parasitic capacitor C in the local source line (i.e., providing a virtual source voltage ($V_{ss}$) for vertical NOR string) has a particular advantage in that such ground voltage bounce is eliminated. This is because the virtual source voltages in the vertical NOR strings are independent and are not connected to the ground supply of the chip.

Program (Write) and Program-Inhibit Operations.

Programming of an addressed TFT may be achieved by tunneling—either direct tunneling or Fowler-Nordheim tunneling,—of electrons from the channel region of the TFT (e.g., channel region 430L shown in FIG. 4*b*) to the charge-trapping layer (e.g., charge trapping layer 434) when a high programming voltage is applied between the selected word line (e.g., word line 423*p*-R) and the active channel region (e.g., active channel region 456 in FIG. 4*a*). As tunneling is highly efficient, requiring very little current to program a TFT, parallel programming of tens of thousands of TFTs may be achieved at low power dissipation. Programming by tunneling may require, for example, a 20V, 100-microsecond pulse. Preferably, the programming is implemented through a succession of shorter duration stepped voltage pulses, starting at around 14V and going as high as approximately 20V. Stepped voltage pulsing reduces electrical stress across the TFT and avoids overshooting the intended programmed threshold voltage.

After each programming high-voltage pulse the addressed transistor is read to check if it has reached its target threshold voltage. If the target threshold voltage has not been reached, the next programming pulse applied to the selected word line is incremented typically by a few hundred millivolts. This program-verify sequence is repeatedly applied to the one addressed word line (i.e., a control gate) with 0V applied to the local bit line (e.g., local bit line 454 of FIG. 4*a*) of the active column (e.g., column 430L of FIG. 4*b*). At these programming high word line voltages, TFT 416L's channel region is inverted and is held at 0V, so that electrons tunnel into the charge storage layer of TFT 416L. When the read sensing indicates that the addressed TFT has reached its target threshold voltage, the addressed TFT must be inhibited from further programming, while other TFTs sharing the same word line may continue programming to their higher target threshold voltages. For example, when programming TFT 416L in vertical NOR string 451*b*, programming of all other TFTs in vertical NOR strings 451*b* and 451*a* must be inhibited by keeping all their word lines at 0V.

To inhibit further programming or TFT 416L once it has reached its target threshold voltage, a half-select voltage (i.e., approximately 10V) is applied to local bit line 454. With 10V being placed in the channel region and 20V being placed on the control gate, only net 10V is applied across the charge trapping layer, therefore the Fowler-Nordheim tunneling current is insignificant and no meaningful further programming takes place on TFT 416L during the remaining sequence of stepped pulse voltages up to the maximum 20V. By raising the local bit line 454 to 10V while continuing to increment the programming voltage pulses on word line WL31, all TFTs on vertical NOR strings sharing the same selected word line are programmed correctly to their higher target threshold voltages. The sequence of "program-read-program inhibit" is indispensable for correctly programming tens of thousands TFTs in parallel to their various target threshold voltage states in multilevel cell storage. Absent such program inhibit of individual TFTs over-programming may cause overstepping or merging with the threshold voltage of the next higher target threshold voltage state. Although TFT 416R and TFT 416L share the same word line, they belong to different vertical NOR string pairs 452 and 451. It is possible to program both TFT 416L and TFT 416R in the same programming pulsed voltage sequence, as their respective bit line voltages are supplied through GBL1 and GBL2 and are independently controlled. For example, TFT 416L can continue to be programmed while TFT 416R can be inhibited from further programming at any time. These program and program-inhibit voltage conditions can be met because vertical NOR strings 451*a* and 451*b* of vertical NOR string pair 491 are controlled by separate word lines 423*p*-L and 423*p*-R respectively, and the voltage on each local bit line can be set independently from all other vertical NOR string pairs. During programming, any unselected word line within an addressed word line stack or within unaddressed word line stacks can be brought to 0V, half-select 10 volts, or floated. In the embodiment where global source line (e.g., GSL1 of FIG. 4*c*) is accessed through a source access select transistor (not shown in FIG. 4*c*), the access select transistor is off during programming, resulting in the voltage on local source line 455 following the voltage on local bit line 454 during program and program inhibit. The same is true for the embodiment where the voltage on the local source line is provided by its parasitic capacitance C represented by capacitor 460 in FIG. 4*c*. In the embodiment of FIG. 4c, where there is a global source line but not a source access select transistor, the voltage applied to the global source line 413-1 of the addressed string should preferably track the voltage of the addressed global bit line 414-1 during program and program-inhibit.

Each of the incrementally higher voltage programming pulses is followed by a read cycle to determine if TFTs 416L and 416R have reached their respective target threshold voltage. If so, the drain, source and body voltages are raised to 10V (alternatively, these voltages are floated to close to 10V) to inhibit further programming, while word line WL31 continues to program other addressed TFTs on the same plane that have not yet attained their target threshold voltages. This sequence terminates when all addressed TFTs have been read-verified to be correctly programmed. In the case of MLC, programming of one of the multiple threshold voltage states can be accelerated by setting each addressed global bit line to one of several predetermined voltages (e.g., 0V, 1.5V, 3.0V, or 4.5V, representing the four distinct states of the 2-bit data to be stored), and then applying the stepped programming pulses (up to around 20V) to word line WL31. In this manner, the addressed TFT receives a predetermined one of the effective tunneling voltages (i.e., 20, 18.5, 17, and 15.5 volts, respectively), resulting in one of predetermined threshold voltages being programmed into a TFT in a single programming sequence. Fine programming pulses may be subsequently provided at the individual TFT level.

Accelerated Whole-Plane Parallel Programming

Because of the parasitic capacitance C intrinsic to every local source line in a multi-gate vertical NOR string array, all local source lines in a multi-gate vertical NOR string array can have 0V (for program) or 10V (for inhibit) momentarily placed (e.g., through global bit line GBL1 and bit line access string select transistor 411 and pre-charge transistor 470) on all vertical NOR strings in advance of applying the high voltage pulsing sequence. This procedure may be carried out by addressing the word line planes plane-by-plane. For each addressed word line plane, the programming pulsing sequence may be applied to many or all word lines on the addressed word line plane, while holding all word lines on the other word line planes at 0V, so as to program in parallel a large number of TFTs on the addressed plane, followed by individual read-verify, and where necessary, resetting the local source line of a properly programmed TFT into program-inhibit voltage. This approach provides a significant advantage, as programming time is relatively long (i.e., around 100 microsecond), while pre-charging all local source line capacitors or read-verifying all TFTs sharing the addressed word line plane is more than 1,000 times faster. Therefore, it pays to parallel program as many TFTs as possible in each word line plane. This accelerated programming feature provides even greater advantage in MLC programming which is considerably slower than single bit programming.

Erase Operation

For some charge-trapping materials, the erase operation is performed by reverse-tunneling of the trapped charge, which can be rather slow, sometimes requiring tens of milliseconds of 20V or higher pulsing. Therefore, the erase operation may be implemented at the vertical NOR string array level ("block erase"), often performed in the background. A typical vertical NOR string array may have 64 word line planes, with each word line plane controlling, for example, 16,384×16,384 TFTs, for a total of approximately seventeen billion TFTs. A one-terabit chip may therefore include approximately 30 such vertical NOR string arrays, if two bits of data are stored on each TFT. In some embodiments, block erase may be carried out by applying around 20V to the P− channel shared by all TFTs in a vertical NOR string (e.g., body connection 456 in FIG. 4c and contact 556 in FIG. 5a), while holding all word lines in the block at 0V. The duration of the erase pulse should be such that most TFTs in the block are erased to a slight enhancement mode threshold voltage, i.e., between zero and one volt. Some TFTs will overshoot and be erased into depletion mode (i.e., a slightly negative threshold voltage). A soft programming may be required to return the over-erased TFTs back into a slight enhancement mode threshold voltage after the termination of the erase pulses, as part of the erase command. Vertical NOR strings that may include one of more depletion mode TFTs that cannot be programmed into enhancement mode may have to be retired, to be replaced by spare strings.

Alternatively, rather than providing the erase pulses to the body (i.e., the P− layer), the local source lines and the local bit lines (e.g., local source line 455 and local bit line 454 in FIG. 4c) on all vertical NOR string pairs in the vertical NOR string array are raised to around 20V, while holding all word lines on all word line planes at 0V for the duration of the erase pulse. This scheme requires that the global source line and the global bit line select decoders employ high voltage transistors that can withstand the 20V at their junctions. Alternatively, all TFTs sharing an addressed word line plane can be erased together by applying −20V pulses to all word lines on the addressed plane, while holding word lines on all other planes at 0V. All other voltages in the vertical NOR string pairs are held at 0V. This will erase only the X-Y slice of all TFTs touched by the one addressed plane of word lines.

Semi Non-Volatile NOR TFT Strings

Some charge-trapping materials (e.g., oxide-nitride-oxide or "ONO") suitable for use in the vertical NOR string have long data retention time, typically in the order of many years, but relatively low endurance (i.e., performance degrades after some number of write-erase cycles, typically of the order of ten thousand cycles or less). However, in some embodiments one may select charge-trapping materials that store charge for much reduced retention times, but with much increased endurances (e.g., retention times in order of minutes or hours, endurance in the order of tens of millions of write-erase cycles). For example, in the embodiment of FIG. 7c, the tunnel dielectric layer 732c, typically a 6-8 nanometer layer of $SiO_2$, can be reduced in thickness to around 2 nanometers, or be replaced by another dielectric material (e.g., SiN) of similar thickness. The much thinner dielectric layer makes possible the use of modest voltages to introduce electrons by direct tunneling (as distinct from Fowler-Nordheim tunneling, which requires a higher voltage) into the charge-trapping layer, where they will be trapped from a few minutes to a few hours or days. Charge-trapping layer 732b can be silicon nitride, conductive nanodots dispersed in a thin dielectric film, or a combination of other charge-trapping films, including isolated thin floating gates. Blocking layer 732a can be silicon dioxide, aluminum oxide, hafnium oxide, silicon nitride, a high dielectric constant dielectric, or any combination thereof. Blocking layer 732a blocks electrons in charge-trapping layer 732b from escaping to the control gate word line. Trapped electrons will eventually leak out back into active region 730R, either as a result of the breakdown of the ultra-thin tunnel dielectric layer, or by reverse direct tunneling. However, such loss of trapped electrons is relatively slow. One may also use other combinations of charge storage materials, resulting in a high endurance but low retention "semi-volatile" storage TFT that requires periodic write or read refresh operations to replenish the lost charge. Because the vertical NOR strings of the present invention have a relatively fast read access (i.e. low latency), they may be used in some applications that currently require the use of dynamic random access memories (DRAMs). The vertical NOR strings of the present invention have significant advantages over DRAMs, having a much lower cost-per-bit, as DRAMs cannot be built in three dimensional stacks, and having a much lower power dissipation, as the refresh cycles need only be run approximately once every few minutes or every few hours, as compared to every few milliseconds required to refresh DRAMs. The three-dimensional semi-volatile storage TFTs of the present invention are achieved by selecting an appropriate material, such as those discussed above, for the charge-trapping material and by appropriately adapting the program/read/program-inhibit/erase conditions and incorporating the periodic data refreshes.

NROM/Mirror Bit NOR TFT Strings

In another embodiment of the current invention, the vertical NOR strings may be programmed using a channel hot-electron injection approach, similar to that which is used in two-dimensional NROM/Mirror Bit transistors, known to a person skilled in the art. Using the embodiment of FIG. 4a as an example, programming conditions for channel hot-electron injection may be: 8V on control gate 423p, 0V on local source line 455 and 5V on local drain line 454. Charge representing one bit is stored in the charge storage layer at one end of channel region 456 next to the junction with local bit line 454. By reversing polarity of local source line 455 and local bit line 454, charge representing a second bit is programmed and stored in the charge storage layer at the opposite end of channel region 456 next to the junction with local source line 455. Reading both bits requires reading in reverse order of the programming, as is well known to those skilled in the art. Channel hot-electron programming is much less efficient than programming by direct tunneling or Fowler-Nordheim tunneling and therefore it does not lend itself to the massively parallel programming possible with tunneling. However, each TFT has twice the bit density, making it attractive for applications such as archival memory. Erase for the NROM TFT embodiment can be achieved by employing the conventional NROM erase mechanism of band to band tunneling-induced hot-hole injection to neutralize the charge of the trapped electrons: apply −5V on the word line, 0V to local source line 455 and 5V to local bit line 454. Alternatively, the NROM TFT can be erased by applying a high positive substrate voltage $V_{bb}$ to body region 456 with the word line at 0V. Because of the high programming current attendant to channel hot electron injection programming, all embodiments of vertical NROM TFT strings must employ hard-wired local source line and local bit line, such as in the embodiments of FIGS. 3a and 6c.

The above detailed description is provided to illustrate specific embodiments of the present invention and is not intended to be limiting. Numerous variations and modification within the scope of the present invention are possible. The present invention is set forth in the accompanying claims.

The invention claimed is:

1. A memory structure, comprising:
a semiconductor substrate having a substantially planar surface and including circuitry formed therein for memory circuit operations;
first and second heavily doped regions each formed above the semiconductor substrate and each extending along a first direction orthogonal to the planar surface of semiconductor substrate;
first and second lightly doped regions spaced apart from each other and each being adjacent both the first and second heavily doped regions;
first, second and third word line conductors that are electrically isolated from each other, wherein (i) each word line conductor extends lengthwise along a second direction substantially parallel to the planar surface, (ii) the first and the second word line conductors are (a) a predetermined distance apart along a third direction substantially orthogonal to both the first and second directions, and (b) provided on a first plane substantially parallel to the planar surface, and (iii) the third word line conductor is provided on a second plane that is substantially parallel to the first plane and separated a second predetermined distance from first plane; and
charge-trapping material provided between each word line conductor and each lightly doped region, forming first, second and third variable-threshold thin-film storage transistors, wherein (i) the first heavily doped region, the second heavily doped region, and the charge-trapping material provide each variable-threshold thin-film storage transistor a drain terminal, a source terminal and a charge-trapping region, respectively; (ii) the first lightly doped region and the first word line conductor provide a channel region and a gate terminal, respectively, for the first variable-threshold thin-film storage transistor; (iii) the second lightly doped region and the second word line conductor provide a channel region and a gate terminal, respectively, for the second variable-threshold thin-film storage transistor; (ii) the first lightly doped region and the third word line conductor provide a channel region and a gate terminal, respectively, for the third variable-threshold thin-film storage transistor.

2. The memory structure of claim 1, further comprising first and second interconnection conductors running lengthwise along the third direction, wherein (i) the first interconnection conductor is connected to the drain terminal of each of the variable-threshold thin-film transistor, and (ii) the second interconnection conductor is connected to the source terminal of each of the variable-threshold thin-film storage transistor.

3. The memory structure of claim 2, wherein (i) the first and second heavily doped regions, the first and second lightly doped regions and the charge-trapping material form a representative one of a plurality active columns that are arranged in a two-dimensional array extending along the second and third dimensions, (ii) the first interconnection conductor is one of a plurality of mutually electrically isolated bit line segments, each bit line segment connecting the drain terminal of a variable-threshold thin-film storage transistor formed in each of a plurality of the active columns along one row of the two-dimensional array.

4. The memory structure of claim 3, further comprising a plurality of regional bit line segments each selectably connecting a selected group of the bit line segments.

5. The memory structure of claim 3, further comprising a plurality of segment-select transistors each selectably connecting a corresponding bit line segment to the circuitry in the semiconductor substrate.

6. The memory structure of claim 5, wherein the circuitry in the semiconductor substrate comprises at least a plurality of sense amplifiers distributed throughout the planar surface of the semiconductor substrate, the sense amplifiers being each connected by a different group of one or more segment-select transistors to corresponding bit line segments.

7. The memory structure of claim 5, wherein the segment-select transistors are formed in the semiconductor substrate.

8. The memory structure of claim 3, wherein (i) the first word line conductor provides gate terminals for variable-threshold thin-film transistors in the active columns on its opposite sides, and wherein the drain terminals provided by adjacent active columns on opposite side of the first word line conductor are connected to different bit line segments.

9. The memory structure of claim 3, wherein the second interconnection conductor is one of a plurality of mutually electrically isolated source line segments, each source line segment connecting the source terminal of a variable-threshold thin-film storage transistor formed in each of a plurality of the active columns along one row of the two-dimensional array.

10. The memory structure of claim 9, further comprising a global source line and a plurality of segment-select transistors, each segment-select transistor connecting a predetermined number of source line segments to the global source line.

11. The memory structure of claim 10, further comprising in each active column a pre-charge transistor for electrically connecting the source terminal of a variable-threshold thin-film storage transistor formed in the active column to the drain terminal of the variable-threshold thin-film storage transistor.

12. The memory structure of claim 11, wherein the source terminals connected by each source line segment provide a capacitance that serves as a virtual voltage source during a read, programming, program-inhibit or erase operation on one or more variable-threshold thin-film storage transistors in the active columns associated with the source line segment.

13. The memory structure of claim 3, further comprising a body bias voltage source in the semiconductor substrate, wherein the lightly doped region of each active column is connected to the body bias voltage source by a conductor above or below the active column.

14. The memory structure of claim 9, further comprising a plurality of charging columns each being associated with one of the source line segments, each charging column having first and second heavily doped regions structurally substantially the same as the first and second heavily doped regions of one of the active columns, wherein each charging column further comprises a plurality of pass transistors each selectably connecting the first and second heavily doped regions of the charging column, wherein at least one of the first and second heavily doped regions of the charging column is connected to the circuitry in the semiconductor substrate.

15. The memory structure of claim 14, wherein each charging column is formed between two neighboring source line segments.

16. The memory structure of claim 14, wherein one or more of the word line conductors activate one or more of the pass transistors in one or more of the charging columns.

17. The memory structure of claim 16, further comprising a global source line that connects one or more of the word line conductors that activate one or more of the pass transistors in the one or more charging columns.

18. The memory structure of claim 16, wherein each charging column is connected to a voltage source in the semiconductor substrate by a segment-select transistor in the semiconductor substrate.

19. The memory structure of claim 18, wherein the voltage source supplies an erase voltage for a source terminal during an erase operation.

20. The memory structure of claim 3, wherein the active columns are isolated from each other by an isolation dielectric material or by an air gap.

21. The memory structure of claim 1, wherein the first and third word line conductors are insulated from each other by an isolation dielectric material or air gap.

22. The memory structure of claim 3, wherein the variable-threshold thin-film transistors associated with each active column are organized in parallel into one or more NOR thin-film transistor strings.

23. The memory structure of claim 1, wherein the first and the third word line conductors form steps of a stair-case structure and wherein the first and the third word line conductors are connected at the stair-case structure by vias to third and fourth interconnection conductors, respectively, the third and the fourth interconnection conductors each extend along the third direction.

24. The memory structure of claim 23, wherein second word line conductor is connected to the fourth interconnection conductor.

25. A memory structure comprising first and second modular memory structures provided one on top of the other, wherein each modular memory structure comprises the memory structure of claim 3.

26. The memory structure of claim 25, wherein the first and second modular memory structures are isolated from each other by a dielectric layer.

27. The memory structure of claim 26, wherein active columns in the first and second modular memory structures are aligned along the first direction and wherein in local source lines of corresponding active columns are connected by vias through the dielectric layer.

28. The memory structure of claim 3, further comprising metallic pylons embedded in either one or both of the first and the second heavily doped regions of one or per QS more active columns.

29. The memory structure of claim 28, wherein the metallic pylons each comprises one or more of titanium nitride, tungsten nitride or tungsten.

30. The memory structure of claim 29, wherein the metallic pylon is formed using an atomic layer deposition technique.

31. The memory structure of claim 1, wherein the first and the second lightly doped regions each comprises a first section and a second section, and wherein the first section provides the channel region of a variable-threshold thin-film storage transistors and wherein the second section has a dopant concentration multiple times that of the first section.

* * * * *

UNITED STATES PATENT AND TRADEMARK OFFICE
CERTIFICATE OF CORRECTION

Page 1 of 1

PATENT NO.         : 10,475,812 B2
APPLICATION NO.    : 16/447406
DATED              : November 12, 2019
INVENTOR(S)        : Eli Harari It is certified that error appears in the above-identified patent and that said Letters Patent is hereby corrected as shown below:

On the Title Page

(72) Inventor should read:
Eli Harari, Saratoga, CA (US)
Tianhong Yan, Saratoga, CA (US)

Signed and Sealed this
Third Day of November, 2020

Andrei Iancu
*Director of the United States Patent and Trademark Office*